(12) United States Patent
Murakami et al.

(10) Patent No.: US 11,573,137 B2
(45) Date of Patent: Feb. 7, 2023

(54) SURFACE STRESS SENSOR, HOLLOW STRUCTURAL ELEMENT, AND METHOD FOR MANUFACTURING SAME

(71) Applicant: ASAHI KASEI KABUSHIKI KAISHA, Tokyo (JP)

(72) Inventors: Takanori Murakami, Tokyo (JP); Hidenori Mochizuki, Tokyo (JP); Daiki Hirashima, Tokyo (JP); Seiichi Kato, Tokyo (JP); Kazuma Komatsu, Tokyo (JP)

(73) Assignee: Asahi Kasei Kabushiki Kaisha, Tokyo (JP)

( * ) Notice: Subject to any disclaimer, the term of this patent is extended or adjusted under 35 U.S.C. 154(b) by 80 days.

(21) Appl. No.: 16/647,878

(22) PCT Filed: Sep. 20, 2018

(86) PCT No.: PCT/JP2018/034938
§ 371 (c)(1),
(2) Date: Mar. 17, 2020

(87) PCT Pub. No.: WO2019/059326
PCT Pub. Date: Mar. 28, 2019

(65) Prior Publication Data
US 2020/0249104 A1 Aug. 6, 2020

(30) Foreign Application Priority Data

Sep. 20, 2017 (JP) .............................. JP2017-180132
Dec. 22, 2017 (JP) .............................. JP2017-246442
(Continued)

(51) Int. Cl.
*G01L 1/18* (2006.01)
*G01M 5/00* (2006.01)

(52) U.S. Cl.
CPC .............. *G01L 1/18* (2013.01); *G01M 5/0058* (2013.01)

(58) Field of Classification Search
CPC ..... G01N 5/02; G01M 5/0058; B81B 7/0048; G01L 1/18
See application file for complete search history.

(56) References Cited

U.S. PATENT DOCUMENTS 4,434,203 A * 2/1984 Briefer .................. G01L 9/0044
181/173
4,805,456 A * 2/1989 Howe ..................... G01P 15/18
73/DIG. 1
(Continued)

FOREIGN PATENT DOCUMENTS

| CN | 103604538 A | 2/2014 |
| CN | 104949788 A | 9/2015 |

(Continued)

OTHER PUBLICATIONS

Supplementary European search Report dated Jul. 20, 2020, issued in corresponding European Patent Application No. 18859370.1.
(Continued)

*Primary Examiner* — Tran M. Tran
(74) *Attorney, Agent, or Firm* — Morgan, Lewis & Bockius LLP

(57) ABSTRACT

Provided are a surface stress sensor that enables deterioration in measurement precision to be suppressed and a method for manufacturing the same. A surface stress sensor includes: a membrane configured to be bent by applied surface stress; a frame member configured to surround the membrane with gaps interposed therebetween when viewed from the thickness direction of the membrane; at least a pair of coupling portions configured to couple the membrane and the frame member; a flexible resistor configured to be disposed on at least one of the coupling portions and have a
(Continued)

US 11,573,137 B2

Page 2 resistance value that changes according to bending induced in the coupling portion; and a support base member configured to be connected to the frame member and overlap the frame member when viewed from the thickness direction of the membrane, in which a cavity portion is disposed between the membrane and the support base member.

21 Claims, 38 Drawing Sheets

(30) Foreign Application Priority Data

Mar. 14, 2018 (JP) .............................. JP2018-047234
Sep. 20, 2018 (JP) .............................. JP2018-176538

(56) References Cited

U.S. PATENT DOCUMENTS

| | | | | |
|---|---|---|---|---|
| 5,095,762 | A * | 3/1992 | Holm-Kennedy | ........................... G01P 15/0802 73/866.5 |
| 5,352,635 | A * | 10/1994 | Tu | ....................... G01P 15/0802 438/960 |
| 5,526,700 | A * | 6/1996 | Akeel | ....................... G01L 1/18 73/862.042 |
| 6,270,685 | B1 | 8/2001 | Ishio et al. | |
| 6,450,031 | B1 | 9/2002 | Sakai et al. | |
| 6,782,755 | B2 * | 8/2004 | Tai | ....................... G01L 9/0054 73/754 |
| 7,107,847 | B2 * | 9/2006 | Yoshida | ................... G01P 15/18 73/514.33 |
| 7,306,955 | B2 * | 12/2007 | Yang | ................... H01L 21/2007 438/743 |
| 7,344,678 | B2 * | 3/2008 | Majumdar | ....... G01N 33/54373 422/68.1 |
| 7,458,281 | B2 * | 12/2008 | Ohsato | ..................... G01L 5/162 73/862.041 |
| 8,080,869 | B2 * | 12/2011 | Okudo | ..................... G01P 1/023 257/E23.193 |
| 8,250,934 | B2 * | 8/2012 | Sakurai | ................... G01P 15/18 73/862.041 |
| 8,291,745 | B2 | 10/2012 | Karabacak et al. | |
| 8,344,487 | B2 * | 1/2013 | Zhang | ................. H01L 23/4951 438/126 |
| 8,418,558 | B2 * | 4/2013 | Kazama | ................... G01P 15/18 73/514.33 |
| 8,737,663 | B2 * | 5/2014 | Jilani | ..................... H04R 17/02 381/174 |
| 9,038,437 | B2 * | 5/2015 | Offermans | ......... G01N 33/0009 73/31.06 |
| 9,176,018 | B2 * | 11/2015 | Qi | ....................... G01L 9/0054 |
| 9,212,959 | B2 | 12/2015 | Yoshikawa et al. | |
| 9,261,423 | B2 * | 2/2016 | Benfield | ................... G01L 1/18 |
| 9,327,961 | B2 * | 5/2016 | Lemarquand | ............ H04R 23/00 |
| 9,506,822 | B2 * | 11/2016 | Yoshikawa | ............... G01L 1/18 |
| 9,513,182 | B2 | 12/2016 | Kakoiyama | |
| 9,668,063 | B2 | 5/2017 | Uchida | |
| 9,708,175 | B2 * | 7/2017 | Qi | ......................... G01L 9/0045 |
| 9,927,311 | B2 | 3/2018 | Kang et al. | |
| 9,936,298 | B2 * | 4/2018 | Buck | ......................... H04R 7/14 |
| 10,564,082 | B2 * | 2/2020 | Shiba | ....................... G01N 5/02 |
| 10,634,695 | B2 * | 4/2020 | Yamaguchi | ............... G01L 1/18 |
| 10,866,203 | B2 * | 12/2020 | Kobayashi | ............... G01L 1/2293 |
| 10,962,427 | B2 * | 3/2021 | Youssefi | ................... G01L 1/18 |
| 11,029,227 | B2 * | 6/2021 | Chiou | ................... G01L 9/0045 |
| 11,051,106 | B2 * | 6/2021 | Chen | ..................... H01F 7/0289 |
| 11,119,117 | B2 * | 9/2021 | Ikeda | ..................... G01P 15/135 |
| 2003/0025199 | A1 * | 2/2003 | Wu | ....................... H01L 23/4334 257/E23.101 |
| 2007/0023851 | A1 | 2/2007 | Hartzell et al. | |
| 2008/0056945 | A1 * | 3/2008 | Hattori | ................. B01J 19/0093 422/68.1 |
| 2009/0241671 | A1 * | 10/2009 | Nomura | ................. G01P 15/123 73/514.36 |
| 2009/0314410 | A1 | 12/2009 | Kim et al. | |
| 2011/0074037 | A1 * | 3/2011 | Takeshima | ............... H01L 24/83 257/773 |
| 2012/0235039 | A1 | 9/2012 | Maeda et al. | |
| 2013/0133433 | A1 * | 5/2013 | Yoshikawa | .......... G01N 29/022 73/774 |
| 2013/0235120 | A1 * | 9/2013 | Hirabayashi | ........... B41J 2/1606 347/45 |
| 2014/0352447 | A1 | 12/2014 | Yoshikawa et al. | |
| 2015/0128713 | A1 | 5/2015 | Kakoiyama | |
| 2015/0268114 | A1 | 9/2015 | Takeuchi | |
| 2016/0037266 | A1 | 2/2016 | Uchida | |
| 2016/0123820 | A1 | 5/2016 | Kang et al. | |
| 2017/0199217 | A1 | 7/2017 | Naruse et al. | |
| 2017/0284879 | A1 | 10/2017 | Takeuchi et al. | |

FOREIGN PATENT DOCUMENTS

| | | |
|---|---|---|
| CN | 105612588 A | 5/2016 |
| CN | 104236766 B | 9/2016 |
| EP | 2579010 A1 | 4/2013 |
| JP | S63-196080 A | 8/1988 |
| JP | H10-022509 A | 1/1998 |
| JP | 2001-044450 A | 2/2001 |
| JP | 2002-350260 A | 12/2002 |
| JP | 3489309 B2 | 1/2004 |
| JP | 2010-0002407 A | 1/2010 |
| JP | 5454628 B2 | 3/2014 |
| JP | 2014-179685 A | 9/2014 |
| JP | 5649138 B2 | 1/2015 |
| JP | 2015-045657 A | 3/2015 |
| JP | 2015-123547 A | 7/2015 |
| JP | 5743026 B2 | 7/2015 |
| JP | 5891465 B2 | 3/2016 |
| JP | 2017-181147 A | 10/2017 |
| JP | 6237978 B2 | 11/2017 |
| JP | 6642044 B2 | 2/2020 |
| JP | 6862964 B2 | 4/2021 |
| WO | 2011/039797 A1 | 4/2011 |
| WO | 2011/148774 A1 | 12/2011 |
| WO | 2013/157581 A1 | 10/2013 |
| WO | 2015/198185 A1 | 12/2015 |

OTHER PUBLICATIONS

Communication pursuant to Article 94(3) EPC dated Jul. 31, 2020, issued in corresponding European Patent Application No. 18859370. 1.
International Preliminary Report on Patentability dated Mar. 24, 2020, issued in corresponding International Patent Application No. PCT/JP2018/034938.
International Search Report (with partial translation) and Written Opinion issued in corresponding International Patent Application No. PCT/JP2018/034938, dated Oct. 16, 2018.
Yoshikawa et al., "Two Dimensional Array of Piezoresistive Nanomechanical Membrane-Type Surface Stress Sensor (MSS) with Improved Sensitivity", Sensors (2012), 12, pp. 15873-15887.
Extended European Search Report dated Feb. 15, 2022, issued in corresponding European Patent Application No. 21195507.5.

* cited by examiner

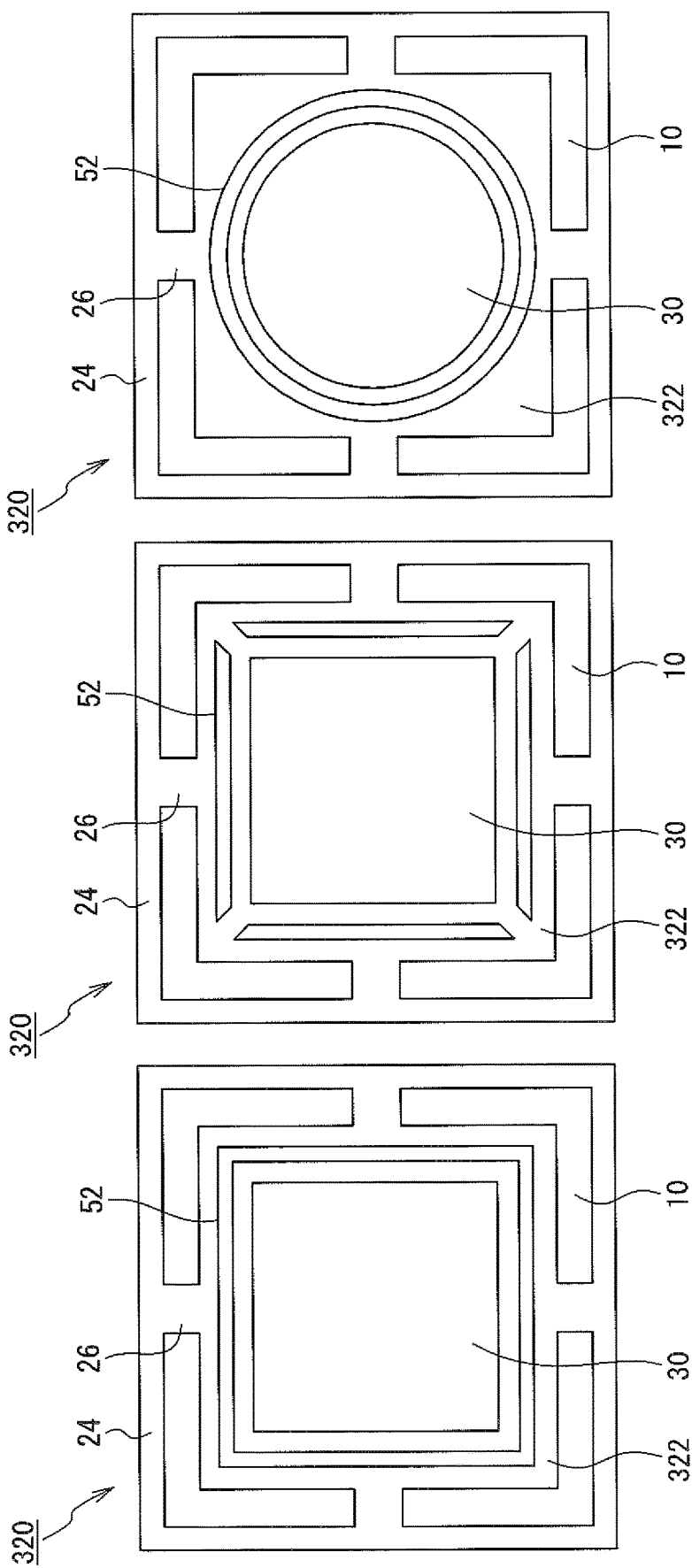

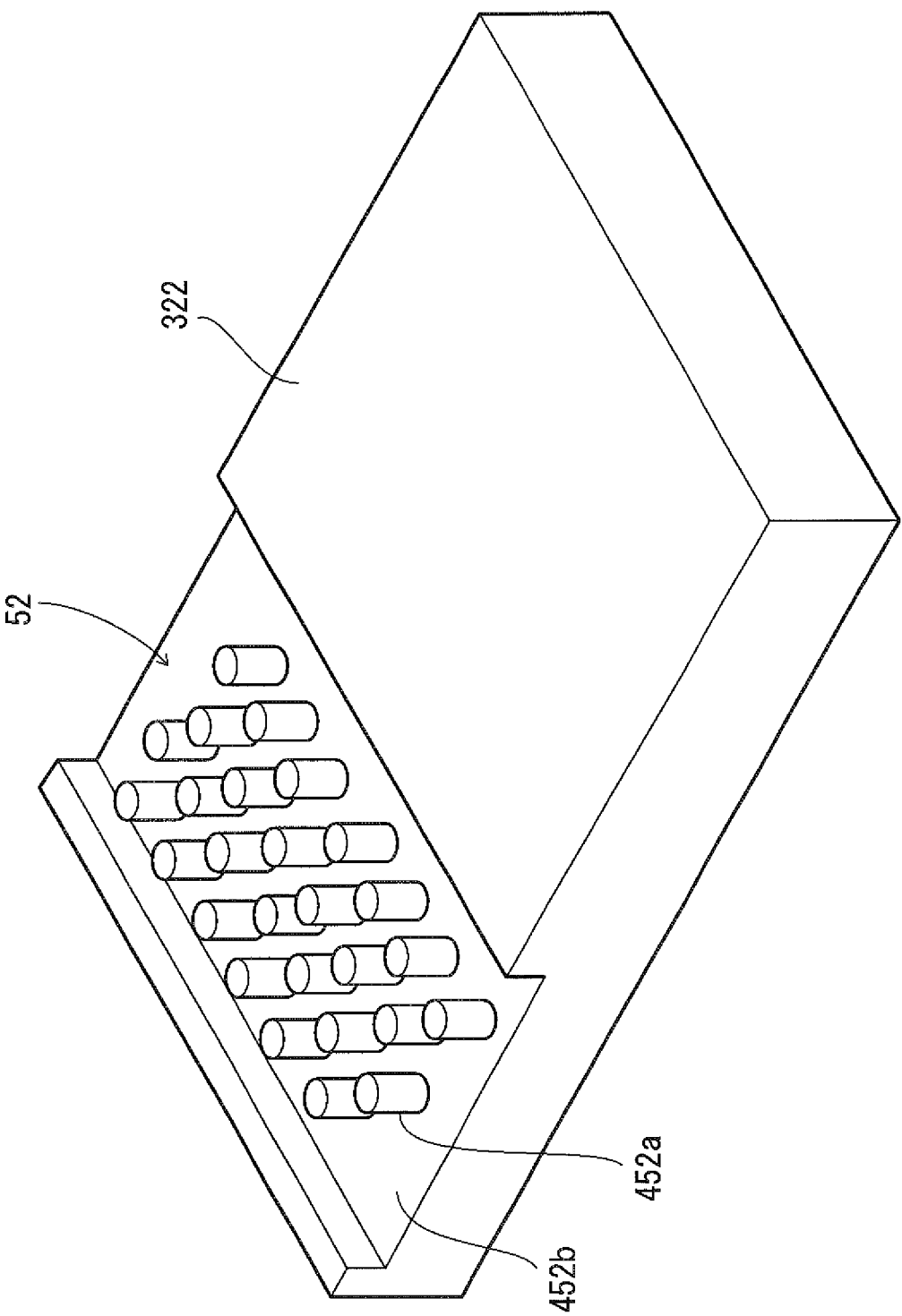

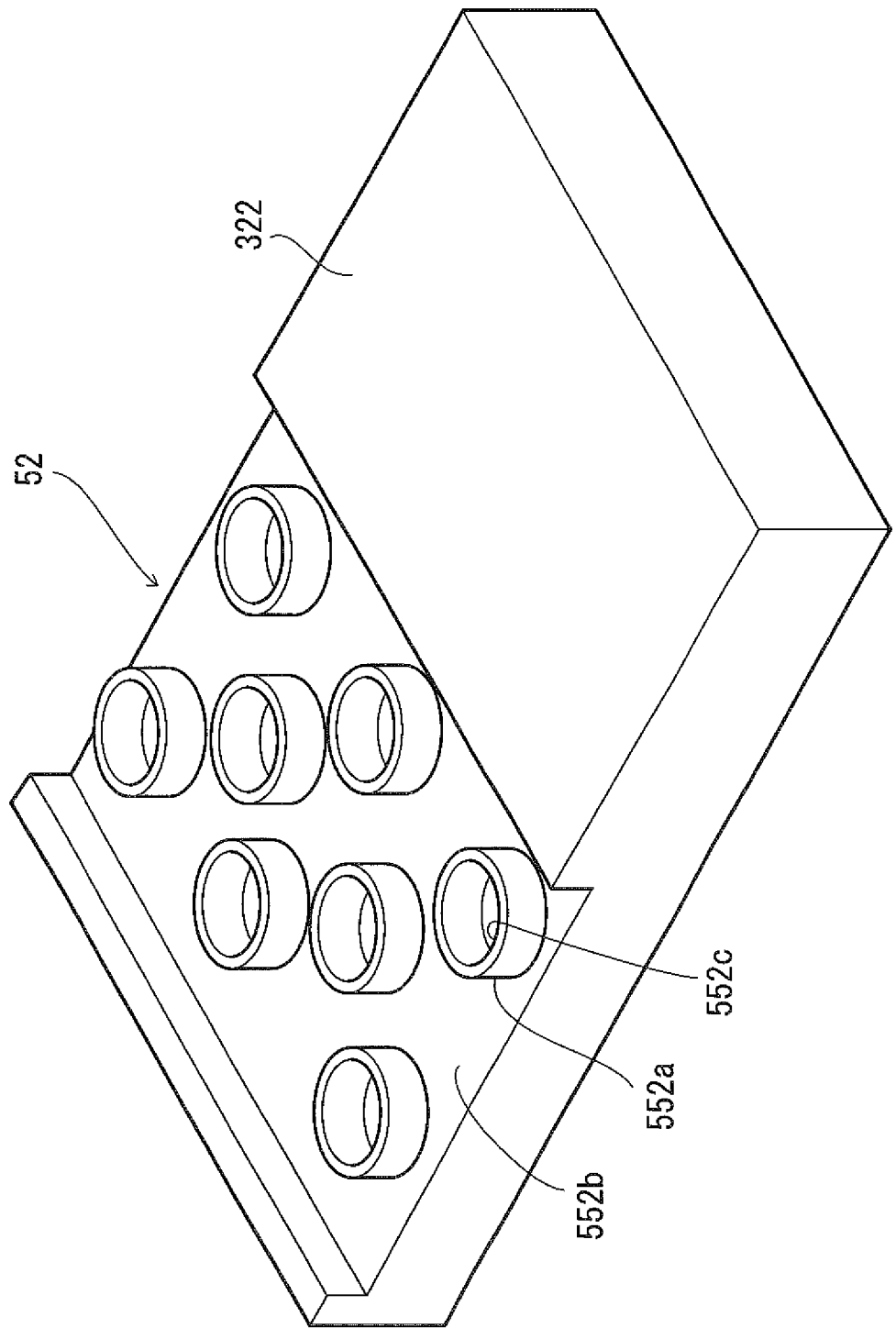

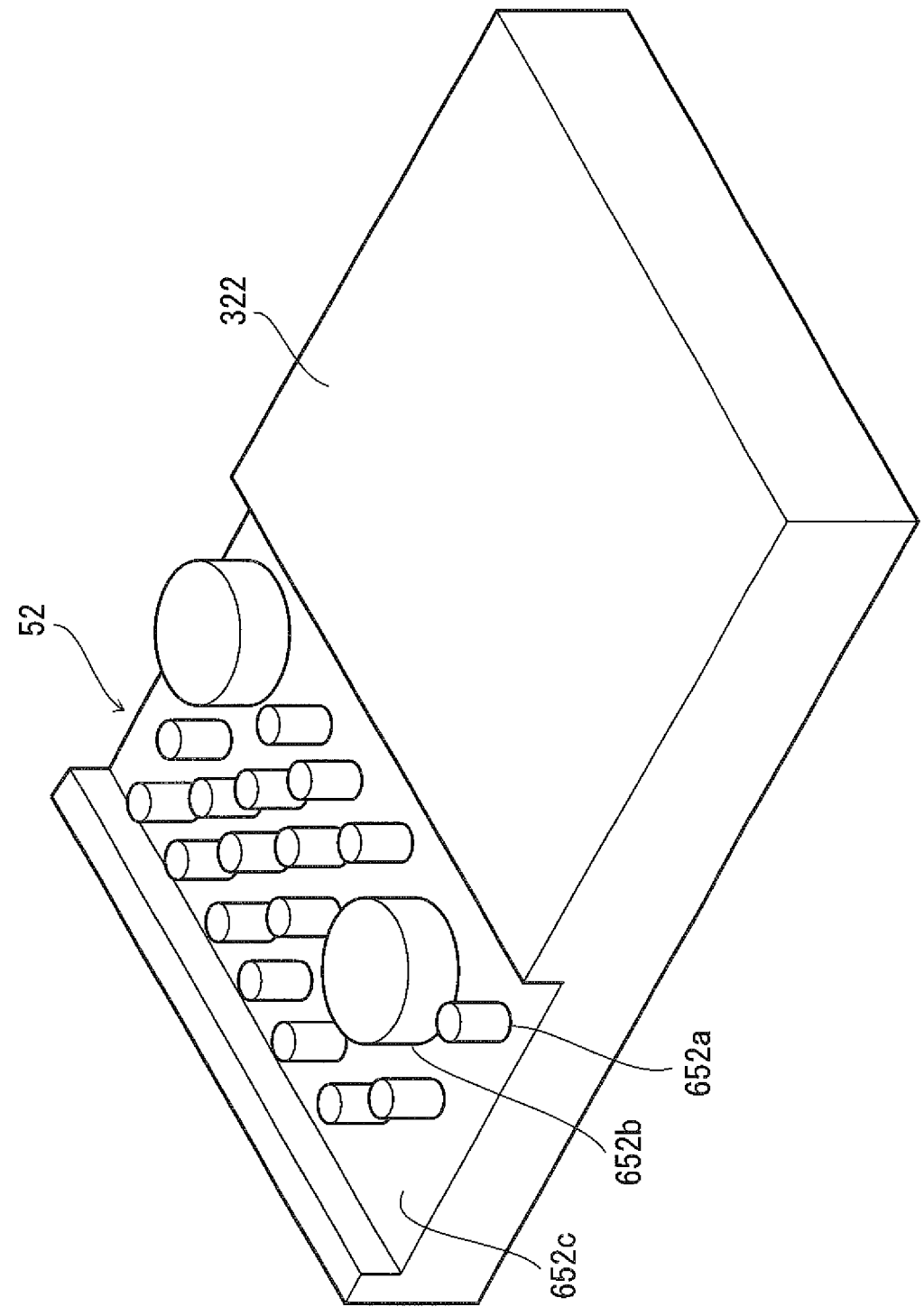

SURFACE STRESS SENSOR, HOLLOW STRUCTURAL ELEMENT, AND METHOD FOR MANUFACTURING SAME

TECHNICAL FIELD

The present invention relates to a surface stress sensor, in particular a membrane-type surface stress sensor (MSS) and a hollow structural element that have high sensitivity compared with a piezoresistive cantilever-type sensor, and a method for manufacturing the surface stress sensor and a method for manufacturing the hollow structural element.

BACKGROUND ART

Examples of technology used for a sensor for collecting information equivalent to the five senses of a human, in particular, a sensor of taste or smell, which human senses by receiving a chemical substance, include a piezoresistive cantilever-type sensor disclosed in PTL 1.

The piezoresistive cantilever-type sensor disclosed in PTL 1 is a membrane-type surface stress sensor and has a configuration in which surface stress applied to a planar member is detected as uniaxial stress in four piezoresistive coupling portions arranged at the periphery of the planar member. In the technology described in PTL 1, since, when the membrane-type surface stress sensor is installed as various types of sensors, the planar member is fixed to a substrate, such as a package, via spacers, the sensor has a structure in which the planar member is supported in mid-air in order to receive applied surface stress.

CITATION LIST

Patent Literature

PTL 1: JP 2015-45657 A

SUMMARY OF INVENTION

Technical Problem

However, in a structure in which a planar member is supported in mid-air as in the technology described in PTL 1, when a substrate fixing a surface stress sensor is deformed by, for example, a change in environmental temperature, the deformation of the substrate is applied to the planar member as stress.

Since stress applied to the planar member due to the deformation of the substrate is greater stress than surface stress applied to the planar member when a chemical substance is received, the stress gives an offset to voltage output or current output by piezoresistors.

Therefore, in the technology described in PTL 1, a problem in that an offset changes depending on changes in temperature, therefore measurement precision as a surface stress sensor deteriorates occurs.

The present invention has been made in view of the conventional unsolved problem as described above and an object of the present invention is to provide a surface stress sensor and a hollow structural element that is capable of suppressing deterioration in measurement precision and a method for manufacturing the surface stress sensor and the hollow structural element.

Solution to Problem

In order to achieve the above-described object, a surface stress sensor according to one aspect of the present invention is characterized by including a membrane, a frame member, at least a pair of coupling portions, a flexible resistor, and a support base member, in which a cavity portion is disposed between the membrane and coupling portions and the support base member. The membrane is bent by applied surface stress. The frame member is separated from the membrane and surrounds the membrane when viewed from the thickness direction of the membrane. The coupling portions are arranged at positions sandwiching the membrane when viewed from the thickness direction and configured to couple the membrane and the frame member. The flexible resistor is disposed on at least one of the coupling portions and has a resistance value changing according to bending induced in the coupling portion. The support base member is connected to the frame member and overlaps the membrane and the coupling portions when viewed from the thickness direction.

In addition, a hollow structural element according to another aspect of the present invention includes a membrane, a frame member, at least a pair of coupling portions, peripheral membrane portions, and a support base member, in which a cavity portion is disposed between the membrane, coupling portions, and peripheral membrane portions and the support base member. The membrane is bent by applied surface stress. The frame member is separated from the membrane and surrounds the membrane when viewed from the thickness direction of the membrane. The coupling portions are arranged at positions sandwiching the membrane when viewed from the thickness direction of the membrane and configured to couple the membrane and the frame member. The peripheral membrane portions are coupled to the frame member and, when viewed from the thickness direction of the membrane, surrounded by the membrane, the frame member, and the coupling portions. The support base member is connected to the frame member and, when viewed from the thickness direction of the membrane, overlaps the membrane, the coupling portions, and the peripheral membrane portions. A penetrating portion penetrating to the cavity portion is formed in at least either one of the peripheral membrane portions or the support base member. In addition, when viewed from the thickness direction of the membrane, slits are formed between the membrane and coupling portions and the peripheral membrane portions. Further, width of each of the slits is narrower than a minimum distance between inner wall faces of the penetrating portion facing each other with the center of the penetrating portion interposed between the inner wall faces.

In addition, a method for manufacturing a surface stress sensor according to still another aspect of the present invention is characterized by including a stacked body forming step, a first ion implantation step, a second ion implantation step, a heat treatment step, a wiring layer forming step, and a removal step. The stacked body forming step is forming, by forming a recessed portion on one face of a support base member and further sticking a detection base member to the support base member in such a way that the detection base member covers the recessed portion, a stacked body in which a cavity portion is disposed between the support base member and the detection base member. The first ion implantation step is implanting first ions into a selected partial region on an outer side than a preset region including the center of the detection base member within a face of the detection base member on an opposite side to a face of the detection base member facing the support base member. The second ion implantation step is implanting second ions into a selected region of the detection base member on an outer side than a region of the detection base member into which the first ions are implanted. The heat treatment step is forming, by performing heat treatment on the stacked body into which the first ions and the second ions are implanted, a flexible resistor region in a region into which the first ions are implanted and also forming a low resistance region in a region into which the second ions are implanted. The wiring layer forming step is forming a wiring layer electrically connected to the flexible resistor. The removal step is forming, by removing regions, the regions being regions surrounding a preset region including the center of the detection base member and being other than the low resistance region and the flexible resistor region, a membrane configured to be bent by applied surface stress and a frame member configured to surround the membrane with gaps interposed between the frame member and the membrane when viewed from the thickness direction of the membrane. In addition to the above, the removal step is forming at least a pair of coupling portions arranged at positions sandwiching the membrane when viewed from the thickness direction and configured to couple the membrane and the frame member, and forming a flexible resistor configured to have a resistance value changing according to bending induced in the coupling portions.

In the above description, the "preset region including the center of the detection base member" means a region that serves as the membrane later. In addition, "the low resistance region and the flexible resistor region" mean regions that serve as a coupling portion later.

In addition, a method for manufacturing a surface stress sensor according to still another aspect of the present invention includes a stacked body forming step, a first ion implantation step, a second ion implantation step, a heat treatment step, a region setting step, an etching step, and a wiring layer forming step. The stacked body forming step is forming, by forming a recessed portion on one face of a support base member and further sticking a detection base member to the support base member in such a way that the detection base member covers the recessed portion, a stacked body in which a cavity portion is disposed between the support base member and the detection base member. The first ion implantation step is implanting first ions into a selected partial region on an outer side than a preset region including the center of the detection base member within a face of the detection base member on an opposite side to a face of the detection base member facing the support base member. The second ion implantation step is implanting second ions into a selected region of the detection base member on an outer side than a region of the detection base member into which the first ions are implanted. The heat treatment step is forming, by performing heat treatment on the stacked body into which the first ions and the second ions are implanted, a flexible resistor region in a region into which the first ions are implanted and a low resistance region in a region into which the second ions are implanted. The region setting step is setting, on a face of the detection base member on an opposite side to a face of the detection base member facing the support base member, a membrane forming region, a frame member forming region, coupling portion forming regions, and peripheral membrane portion forming regions. The membrane forming region is a region in which a membrane configured to be bent by applied surface stress is formed. The frame member forming region is a region in which a frame member configured to be separated from the membrane and surround the membrane when viewed from a stacking direction, the stacking direction being a direction in which the support base member and the detection base member are stacked, is formed. The coupling portion forming regions are regions in which at least a pair of coupling portions arranged at positions sandwiching the membrane when viewed from the stacking direction and configured to couple the membrane and the frame member are formed. The peripheral membrane portion forming regions are regions surrounded by the membrane forming region, the frame member forming region, and the coupling portion forming regions when viewed from the stacking direction. The etching step is forming, on a face of one of the peripheral membrane portion forming regions on an opposite side to a face of the peripheral membrane portion forming region facing the cavity portion, a penetrating portion penetrating to the cavity portion by means of etching. In addition to the above, the etching step is forming, between the membrane forming region and coupling portion forming regions and the peripheral membrane portion forming regions, slits penetrating to the cavity portion by means of etching with a lower etching rate than in the etching of the penetrating portion. In the etching step, the membrane is formed in the membrane forming region, the frame member is formed in the frame member forming region, and the coupling portions are formed in the coupling portion forming regions. In addition to the above, in the etching step, peripheral membrane portions configured to be coupled to the frame member and, when viewed from the stacking direction, surrounded by the membrane, the frame member, and the coupling portions are formed in the peripheral membrane portion forming regions. The wiring layer forming step is forming a wiring layer electrically connected to a flexible resistor configured to have a resistance value changing according to bending induced in the coupling portions.

In addition, a method for manufacturing a surface stress sensor according to still another aspect of the present invention is characterized by including a stacked body forming step, a first ion implantation step, a second ion implantation step, a heat treatment step, and a hole forming step. In addition to the above, the method for manufacturing the surface stress sensor according to the still another aspect of the present invention is characterized by including a cavity portion forming step, a hole sealing step, a wiring layer forming step, and a removal step. The stacked body forming step is forming, by stacking a sacrificial layer on a support base member and further stacking a detection base member on the sacrificial layer, a stacked body. The first ion implantation step is implanting first ions into a selected partial region on an outer side than a preset region including the center of the detection base member within a face of the detection base member on an opposite side to a face of the detection base member facing the support base member. The second ion implantation step is implanting second ions into a selected region of the detection base member on an outer side than a region of the detection base member into which the first ions are implanted. The heat treatment step is forming, by performing heat treatment on the stacked body into which the first ions and the second ions are implanted, a flexible resistor region in a region into which the first ions are implanted and a low resistance region in a region into which the second ions are implanted. The hole forming step is forming a hole penetrating to the sacrificial layer in a region of the detection base member adjacent to a region of the detection base member in which the flexible resistor region and the low resistance region are formed. The cavity portion forming step is forming, by removing the sacrificial layer arranged between the flexible resistor region of the detection base member and the support base member, and the preset region including the center of the detection base member and the support base member by means of etching via the hole, a cavity portion between the support base member and the detection base member. The hole sealing step is sealing, by forming an oxide film on a face of the detection base member on an opposite side to a face of the detection base member facing the support base member, the hole. The wiring layer forming step is forming a wiring layer electrically connected to the flexible resistor. The removal step is forming, by removing regions, the regions being regions surrounding a preset region including the center of the detection base member and being other than the low resistance region and the flexible resistor region, a membrane configured to be bent by applied surface stress and a frame member configured to surround the membrane with gaps interposed between the frame member and the membrane when viewed from a thickness direction of the membrane. In addition to the above, the removal step is forming at least a pair of coupling portions arranged at positions sandwiching the membrane when viewed from the thickness direction and configured to couple the membrane and the frame member, and forming a flexible resistor configured to have a resistance value changing according to bending induced in the coupling portions.

In addition, a method for manufacturing a surface stress sensor according to still another aspect of the present invention includes a stacked body forming step, a first ion implantation step, a second ion implantation step, a heat treatment step, a region setting step, a hole forming step, a cavity portion forming step, a hole sealing step, an etching step, and a wiring layer forming step. The stacked body forming step is forming, by stacking a sacrificial layer on one face of a support base member and further stacking a detection base member on the sacrificial layer, a stacked body. The first ion implantation step is implanting first ions into a selected partial region on an outer side than a preset region including the center of the detection base member within a face of the detection base member on an opposite side to a face of the detection base member facing the support base member. The second ion implantation step is implanting second ions into a selected region of the detection base member on an outer side than a region of the detection base member into which the first ions are implanted. The heat treatment step is forming, by performing heat treatment on the stacked body into which the first ions and the second ions are implanted, a flexible resistor region in a region into which the first ions are implanted and a low resistance region in a region into which the second ions are implanted. The region setting step is setting, on a face of the detection base member on an opposite side to a face of the detection base member facing the support base member, a membrane forming region, a frame member forming region, coupling portion forming regions, and peripheral membrane portion forming regions. The membrane forming region is a region in which a membrane configured to be bent by applied surface stress is formed. The frame member forming region is a region in which a frame member configured to be separated from the membrane and surround the membrane when viewed from a stacking direction, the stacking direction being a direction in which the support base member and the detection base member are stacked, is formed. The coupling portion forming regions are regions in which at least a pair of coupling portions arranged at positions sandwiching the membrane when viewed from the stacking direction and configured to couple the membrane and the frame member are formed. The peripheral membrane portion forming regions are regions surrounded by the membrane forming region, the frame member forming region, and the coupling portion forming regions when viewed from the stacking direction. The hole forming step is forming a hole penetrating to the sacrificial layer at least in one region among the membrane forming region, the coupling portion forming regions, and the peripheral membrane portion forming regions. The cavity portion forming step is forming, by removing the sacrificial layer arranged between the membrane forming region, coupling portion forming regions, and peripheral membrane portion forming regions and the support base member by means of etching via the hole, disposing a cavity portion between the support base member and the detection base member. The hole sealing step is sealing, by forming an oxide film on a face of the detection base member on an opposite side to a face of the detection base member facing the support base member, the hole. The etching step is forming, on a face of one of the peripheral membrane portion forming regions on an opposite side to a face of the peripheral membrane portion forming region facing the cavity portion, a penetrating portion penetrating to the cavity portion by means of etching. In addition to the above, the etching step is forming, between the membrane forming region and coupling portion forming regions and the peripheral membrane portion forming regions, slits penetrating to the cavity portion by means of etching with a lower etching rate than in the etching of the penetrating portion. In the etching step, the membrane is formed in the membrane forming region, the frame member is formed in the frame member forming region, and the coupling portions are formed in the coupling portion forming regions. In addition to the above, in the etching step, peripheral membrane portions configured to be coupled to the frame member and, when viewed from the stacking direction, surrounded by the membrane, the frame member, and the coupling portions are formed in the peripheral membrane portion forming regions. The wiring layer forming step is forming a wiring layer electrically connected to a flexible resistor configured to have a resistance value changing according to bending induced in the coupling portions.

In addition, a method for manufacturing a hollow structural element according to still another aspect of the present invention includes a stacked body forming step, a region setting step, and an etching step. The stacked body forming step is forming, by forming a recessed portion on one face of a support base member and further sticking a membrane base member to the support base member in such a way that the membrane base member covers the recessed portion, a stacked body in which a cavity portion is disposed between the support base member and the membrane base member. The region setting step is setting a membrane forming region, a frame member forming region, coupling portion forming regions, and peripheral membrane portion forming regions on a face of the membrane base member on an opposite side to a face of the membrane base member facing the support base member. The membrane forming region is a region in which a membrane configured to be bent by applied surface stress is formed. The frame member forming region is a region in which a frame member configured to be separated from the membrane and surround the membrane when viewed from a stacking direction, the stacking direction being a direction in which the support base member and the membrane base member are stacked, is formed. The coupling portion forming regions are regions in which at least a pair of coupling portions arranged at positions sandwiching the membrane when viewed from the stacking direction and configured to couple the membrane and the frame member are formed. The peripheral membrane portion forming regions are regions surrounded by the membrane forming region, the frame member forming region, and the coupling portion forming regions when viewed from the stacking direction. The etching step is forming, on a face of one of the peripheral membrane portion forming regions on an opposite side to a face of the peripheral membrane portion forming region facing the cavity portion, a penetrating portion penetrating to the cavity portion by means of etching and also forming, between the membrane forming region and coupling portion forming regions and the peripheral membrane portion forming regions, slits penetrating to the cavity portion by means of etching with a lower etching rate than in the etching of the penetrating portion. In the etching step, the membrane is formed in the membrane forming region, the frame member is formed in the frame member forming region, and the coupling portions are formed in the coupling portion forming regions. In addition to the above, in the etching step, peripheral membrane portions configured to be coupled to the frame member and, when viewed from the stacking direction, surrounded by the membrane, the frame member, and the coupling portions are formed in the peripheral membrane portion forming regions.

In addition, a method for manufacturing a hollow structural element according to still another aspect of the present invention includes a stacked body forming step, a region setting step, a hole forming step, a cavity portion forming step, a hole sealing step, an etching step, and a wiring layer forming step. The stacked body forming step is forming, by stacking a sacrificial layer on one face of a support base member and further stacking a detection base member on the sacrificial layer, a stacked body.

The region setting step is setting, on a face of the detection base member on an opposite side to a face of the detection base member facing the support base member, a membrane forming region, a frame member forming region, coupling portion forming regions, and peripheral membrane portion forming regions. The membrane forming region is a region in which a membrane configured to be bent by applied surface stress is formed. The frame member forming region is a region in which a frame member configured to be separated from the membrane and surround the membrane when viewed from a stacking direction, the stacking direction being a direction in which the support base member and the detection base member are stacked, is formed. The coupling portion forming regions are regions in which at least a pair of coupling portions arranged at positions sandwiching the membrane when viewed from the stacking direction and configured to couple the membrane and the frame member are formed. The peripheral membrane portion forming regions are regions surrounded by the membrane forming region, the frame member forming region, and the coupling portion forming regions when viewed from the stacking direction. The hole forming step is forming a hole penetrating to the sacrificial layer at least in one region among the membrane forming region, the coupling portion forming regions, and the peripheral membrane portion forming regions. The cavity portion forming step is forming, by removing the sacrificial layer arranged between the membrane forming region and the support base member, coupling portion forming regions and the support base member, and peripheral membrane portion forming region and the support base member by means of etching via the hole, a cavity portion between the support base member and the detection base member. The hole sealing step is sealing, by forming an oxide film on a face of the detection base member on an opposite side to a face of the detection base member facing the support base member, the hole. The etching step is forming, on a face of one of the peripheral membrane portion forming regions on an opposite side to a face of the peripheral membrane portion forming region facing the cavity portion, a penetrating portion penetrating to the cavity portion by means of etching. In addition to the above, the etching step is forming, between the membrane forming region and coupling portion forming regions and the peripheral membrane portion forming regions, slits penetrating to the cavity portion by means of etching with a lower etching rate than in the etching of the penetrating portion. In the etching step, the membrane is formed in the membrane forming region, the frame member is formed in the frame member forming region, and the coupling portions are formed in the coupling portion forming regions. In addition to the above, in the etching step, peripheral membrane portions configured to be coupled to the frame member and, when viewed from the stacking direction, surrounded by the membrane, the frame member, and the coupling portions are formed in the peripheral membrane portion forming regions.

Advantageous Effects of Invention

According to one aspect of the present invention, it becomes possible to provide a surface stress sensor and a hollow structural element that are capable of reducing stress applied to a membrane due to deformation of a substrate to which the surface stress sensor is fixed and a method for manufacturing the surface stress sensor and the hollow structural element.

BRIEF DESCRIPTION OF DRAWINGS

FIGS. 43A, 43B, and 43C are diagrams viewed from the arrow VII in FIG. 35 and diagrams illustrative of variations in a shape of a membrane and the arrangement of the recess/protrusion pattern;

FIG. 44 is an enlarged perspective view of a variation of the recess/protrusion pattern formed in a vicinity of an outer periphery of the membrane;

FIG. 45 is an enlarged perspective view of another variation of the recess/protrusion pattern formed in the vicinity of the outer periphery of the membrane;

FIG. 46 is an enlarged perspective view of still another variation of the recess/protrusion pattern formed in the vicinity of the outer periphery of the membrane;

DESCRIPTION OF EMBODIMENTS

Figure 1:
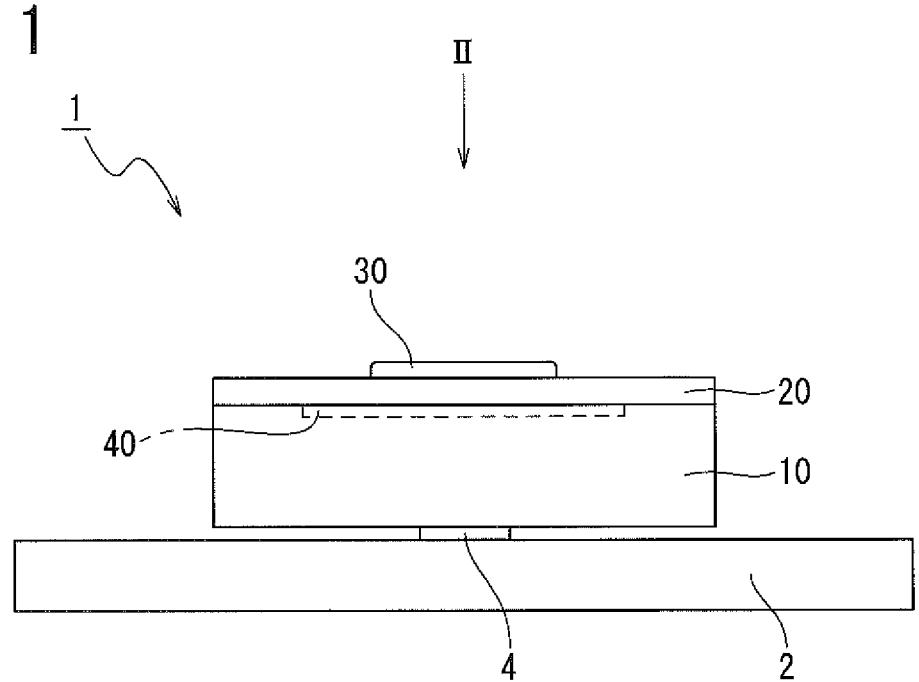
FIG. 1 is a side view illustrative of a configuration of a surface stress sensor according to a first embodiment of the present invention.
Figure 2:
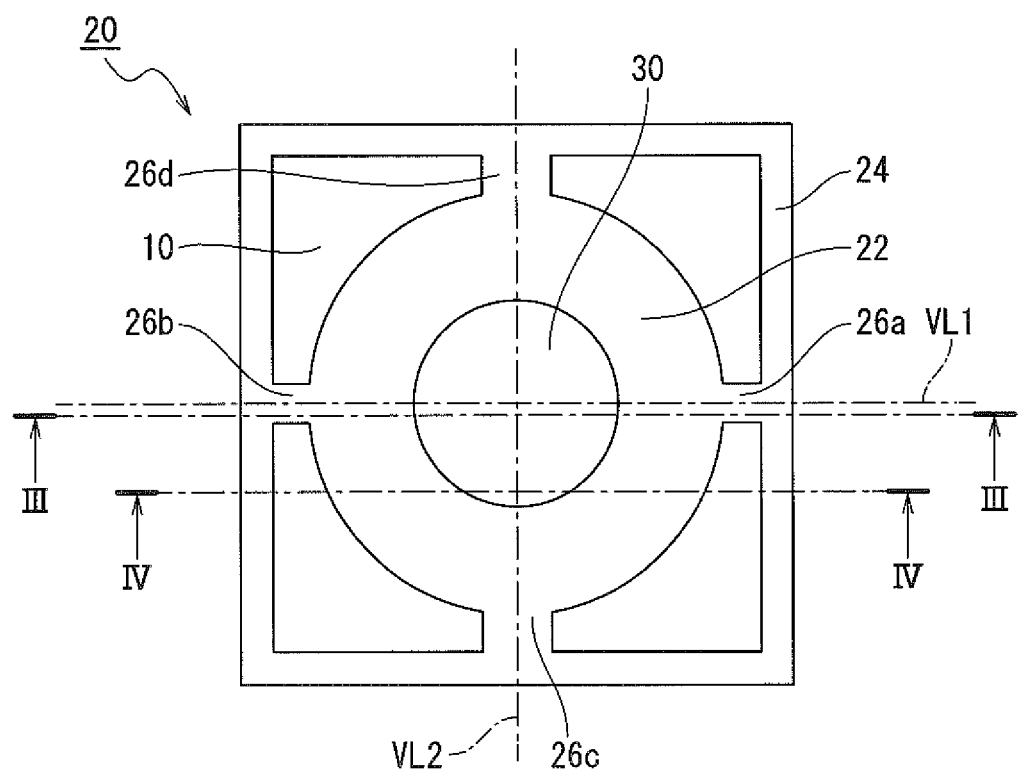
FIG. 2 is diagram viewed from the arrow II in FIG. 1.
Figure 3:
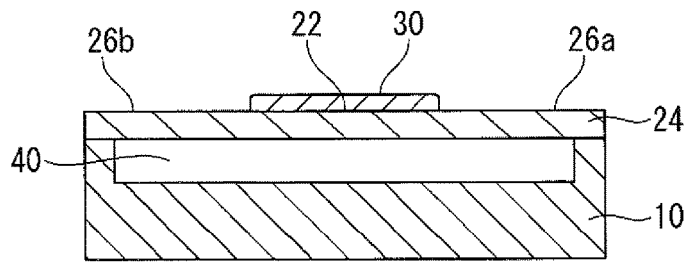
FIG. 3 is a cross-sectional view taken along the line III-III in FIG. 2.
Figure 4:
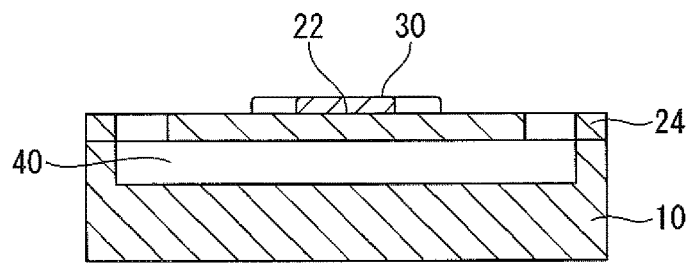
FIG. 4 is a cross-sectional view taken along the line IV-IV in FIG. 2.

With reference to the drawings, embodiments of the present invention will be described below. In the illustration of the drawings referred to in the following description, the same or similar reference signs are assigned to the same or similar portions. However, it should be noted that the drawings are schematic and a relation between thickness and planar dimensions, ratios of thicknesses, and the like are different from actual ones. Therefore, specific thickness and dimensions should be determined in consideration of the following description. It should also be noted that portions having differences in dimensional relationships and ratios among the drawings are included.

Further, the following embodiments indicate configurations to embody the technical idea of the present invention by way of example, and the technical idea of the present invention does not limit the materials, shapes, structures, arrangements, and the like of the constituent components to those described below. The technical idea of the present invention can be subjected to a variety of alterations within the technical scope prescribed by the claims described in CLAIMS. In addition, the directions of "right and left" and "up and down" in the following description are merely definitions for convenience of description, and do not limit the technical idea of the present invention. Thus, it is needless to say that, for example, when the plane of paper is rotated 90 degrees, the "right and left" and the "up and down" are interpreted in an interchanging manner, and, when the plane of paper is rotated 180 degrees, the "left" becomes the "right" and the "right" becomes the "left".

First Embodiment

Hereinafter, a first embodiment of the present invention will be described with reference to the drawings.
(Configuration)

Using FIGS. 1 to 5, a configuration of the first embodiment will be described.

A surface stress sensor 1 illustrated in FIGS. 1 to 5 is, for example, used in sensors that detect taste or smell and includes a package substrate 2, a connecting portion 4, a support base member 10, and a detection base member 20.

(Package Substrate)

The package substrate 2 is formed of, for example, a metal, a polymer, or a ceramic material and is formed with, for example, a thickness on the order of millimeters.
(Connecting Portion)

The connecting portion 4 is arranged on one face (in FIG. 1, the face on the upper side) of the package substrate 2 and is formed using, for example, an adhesive agent or solder.

In the first embodiment, a case where the shape of the connecting portion 4 is formed into a round shape will be described as an example.
(Support Base Member)

The support base member 10 is arranged on the one face of the package substrate 2 and is attached to the package substrate 2 with the connecting portion 4 interposed therebetween.

In the first embodiment, a case where the center of the support base member 10 coincides with a position at which the connecting portion 4 is arranged will be described as an example.

The area of the support base member 10 (in FIG. 1, the area of the support base member 10 when the support base member 10 is viewed from the vertical direction) is larger than the area of the connecting portion 4.

The thickness of the support base member 10 (in FIG. 1, length in the vertical direction of the support base member 10) is set at 80 μm or greater. Note that the thickness of the support base member 10 may be set in a range of 80 μm or more and 750 μm or less.

As a material of which the support base member 10 is formed, for example, a material containing any of silicon, sapphire, gallium arsenide, glass, and quartz can be used. In addition, the support base member 10 may have a BOX layer made of an oxide film or the like formed on the surface thereof.

In the first embodiment, a case where silicon is used as a material of which the support base member 10 is formed will be described as an example.

Because of this configuration, the linear expansion coefficient of the support base member 10 is set at $5.0 \times 10^{-6}/°$ C. or less in the first embodiment.

Linear expansion coefficients of materials that can be used as a material of which the support base member 10 is formed will be described below.

The linear expansion coefficient of silicon is $3.9 \times 10^{-6}/°$ C. or less in an environment with a temperature of a normal temperature or higher and 1000° C. or lower.

The linear expansion coefficient of sapphire is $9.0 \times 10^{-6}/°$ C. or less in an environment with a temperature of 0° C. or higher and 1000° C. or lower.

The linear expansion coefficient of gallium arsenide (GaAs) is $6.0 \times 10^{-6}/°$ C. or less in an environment with a temperature of 0 K or higher and 300 K or lower.

The linear expansion coefficient of glass (float glass) is $8.5 \times 10^{-6}/°$ C. or less to $9.0 \times 10^{-6}/°$ C. or less in an environment with a temperature of 0° C. or higher and 300° C. or lower.

The linear expansion coefficient of quartz is $0.59 \times 10^{-6}/°$ C. or less in an environment with a temperature of 0° C. or higher and 300° C. or lower. Note that the linear expansion coefficient of quartz has a peak at around 300° C.
(Detection Base Member)

The detection base member 20 is stacked on one face (in FIG. 1, the face on the upper side) of the support base member 10 and is formed by a membrane 22, a frame member 24, and coupling portions 26 integrated with one another.

In the first embodiment, a case where silicon is used as a material of which the detection base member 20 is formed will be described as an example.

In addition, as a material of which the detection base member 20 is formed, a material that causes a difference between a linear expansion coefficient of the support base member 10 and a linear expansion coefficient of the detection base member 20 to be $1.2 \times 10^5/°$ C. or less is used.

In the first embodiment, a case where the same material is used as a material of which the detection base member 20 is formed and a material of which the support base member 10 is formed will be described.

(Membrane)

The membrane 22 is formed into a plate shape.

In the first embodiment, a case where the membrane 22 is formed into a disc shape will be described as an example.

In addition, the membrane 22 is an n-type semiconductor layer.

On one face (in FIG. 1, the face on the upper side) of the membrane 22, a receptor 30 is formed by, for example, application.

The receptor 30 is formed using, for example, a polyethylenimine (PEI) solution (hereinafter, sometimes referred to as a "PEI solution"), and molecules of a gas adsorbing to the receptor 30 causes a strain to be induced in the receptor 30.

When molecules of a gas adsorb to the receptor 30 and a strain is induced in the receptor 30, surface stress is applied to the membrane 22 and the membrane 22 is bent. Therefore, when molecules of a gas adsorb to the receptor 30, the membrane 22 is bent by applied surface stress.

Note that the configuration of the receptor 30 is not limited to the configuration in which adsorption of molecules of a gas causes a strain to be induced and may be, for example, a configuration in which magnetism causes a strain to be induced. That is, the configuration of the receptor 30 may be appropriately altered depending on a target to be detected by the surface stress sensor 1.

(Frame Member)

The frame member 24 is formed into a well curb shape and surrounds the membrane 22 with gaps interposed therebetween when viewed from the thickness direction of the membrane 22.

A viewpoint when viewed from the thickness direction of the membrane 22 is a viewpoint when the surface stress sensor 1 is viewed from above (in FIG. 1, a viewpoint when viewed from the direction of the arrow II).

When viewed from the thickness direction of the membrane 22, the center of the frame member 24 coincides with the center of the membrane 22.

In addition, the frame member 24 is connected to the face (in FIG. 1, the face on the upper side) of the support base member 10 on the opposite side to the face thereof facing the package substrate 2, using one of various types of joining technology, such as adhesion.

In the first embodiment, a case where the shapes of the frame member 24 and the support base member 10 are formed into such shapes that the outer peripheral faces of the support base member 10 and the outer peripheral faces of the frame member 24 are flush with each other when viewed from the thickness direction of the membrane 22 will be described as an example.

That is, the frame member 24 and the support base member 10 are quadrilaterals of the same shape when viewed from the thickness direction of the membrane 22. The same quadrilateral shape is achieved by, for example, after connecting the frame member 24 and the support base member 10 to each other, performing dicing processing on the frame member 24 and the support base member 10. That is, when viewed from the thickness direction of the membrane 22, the center of the frame member 24 coincides with the center of the support base member 10.

Therefore, when viewed from the thickness direction of the membrane 22, the support base member 10 overlaps the membrane 22 and the frame member 24.

Further, when viewed from the thickness direction of the membrane 22, the connecting portion 4 is arranged at a position at which the connecting portion 4 overlaps at least a portion of the membrane 22.

In addition, when viewed from the thickness direction of the membrane 22, the area of the connecting portion 4 is smaller than the area of the membrane 22.

In addition, the package substrate 2 is connected to the face (in FIG. 1, the face on the lower side) of the support base member 10 on the opposite side to the face thereof facing the membrane 22.

(Coupling Portion)

The coupling portions 26 are formed into belt shapes when viewed from the thickness direction of the membrane 22.

In addition, the coupling portions 26 are, when viewed from the thickness direction of the membrane 22, arranged at positions at which the coupling portions 26 overlap virtual straight lines VL1 and VL2 passing the center of the membrane 22 and couple the membrane 22 and the frame member 24 to each other.

In the first embodiment, a case where the membrane 22 and the frame member 24 are coupled to each other with four coupling portions 26a to 26d constituting two pairs will be described as an example.

The four coupling portions 26a to 26d includes a pair of the coupling portion 26a and the coupling portion 26b that are arranged at positions at which the coupling portion 26a and the coupling portion 26b overlap the straight line VL1 and a pair of the coupling portion 26c and the coupling portion 26d that are arranged at positions at which the coupling portion 26c and the coupling portion 26d overlap the straight line VL2, which crosses the straight line VL1 at right angles.

That is, the pair of the coupling portion 26a and the coupling portion 26b and the pair of the coupling portion 26c and the coupling portions 26d are, when viewed from the thickness direction of the membrane 22, arranged at positions sandwiching the membrane 22 and couple the membrane 22 and the frame member 24 to each other.

In the first embodiment, a case where the width of the coupling portion 26a and the coupling portion 26b is narrower than the width of the coupling portion 26c and the coupling portion 26d will be described as an example.

Between the membrane 22 and four coupling portions 26a to 26d and the support base member 10, a cavity portion 40 is disposed.

Note that, when the surface stress sensor 1 is used in a solution, the cavity portion 40 may be filled with the solution.

The cavity portion 40 functions as a space that, when the membrane 22 is bent toward the side on which the support base member 10 is located during processing of the detection base member 20, prevents the membrane 22 from clinging to the support base member 10.

On the four coupling portions 26a to 26d, flexible resistors 50a to 50d are disposed, respectively.

(Flexible Resistor)

Each flexible resistor 50 has a resistance value that changes according to bending induced in a coupling portion 26.

In the first embodiment, a case where the flexible resistors 50 are formed of piezoresistors will be described as an example.

The piezoresistors are formed by, for example, implanting ions into the coupling portions 26 and have resistance values that change according to bending induced in the coupling portions 26 by the membrane 22 being bent.

In addition, the flexible resistors 50 are p-type semiconductor layers.

Figure 5:
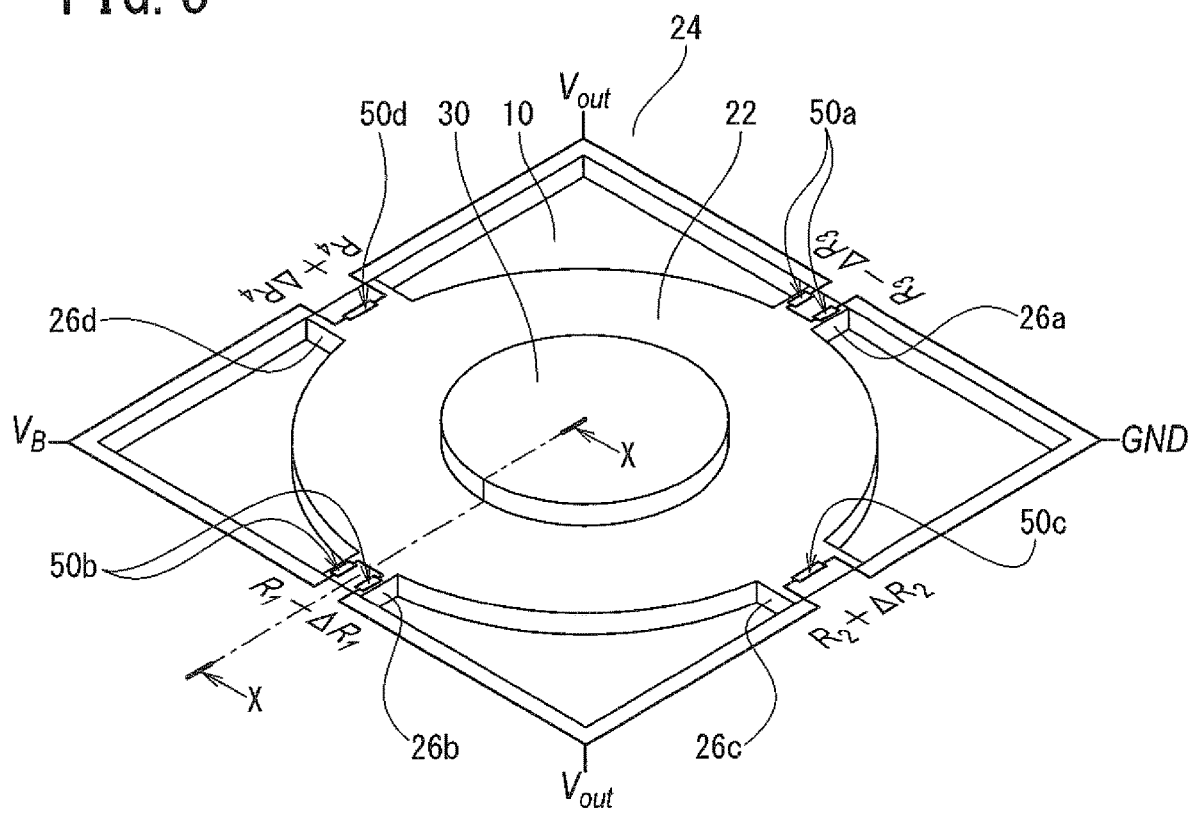
FIG. 5 is a perspective view of a detection base member of the surface stress sensor.

Among the four flexible resistors 50a to 50d, for example, flexible resistors 50 that are adjacent to each other (the coupling portion 26a and the coupling portion 26c and coupling portion 26d, the coupling portion 26b and the coupling portion 26c and coupling portion 26d) are connected to each other, as illustrated in FIG. 5. This configuration causes the four flexible resistors 50a to 50d to form a full Wheatstone bridge illustrated in FIG. 5.

(Piezoresistor)

Hereinafter, a detailed configuration of a piezoresistor will be described.

A resistance value (R) of a piezoresistor and relative resistance change ($\Delta R/R$) in the resistance value of the piezoresistor are given by the equations (1) to (3) below.

[Math. 1]
$$R = \rho \frac{l}{wl} \quad (1)$$

[Math. 2]
$$\Delta R = \frac{\partial R}{\partial \rho}\Delta\rho + \frac{\partial R}{\partial l}\Delta l + \frac{\partial R}{\partial w}\Delta w + \frac{\partial R}{\partial t}\Delta t \quad (2)$$

[Math. 3]
$$\frac{\Delta R}{R} = \frac{\Delta \rho}{\rho} + \frac{\Delta l}{l} - \frac{\Delta w}{w} - \frac{\Delta t}{t} = (\pi_x \sigma_x + \pi_y \sigma_y + \pi_z \sigma_z) + \varepsilon_x - \varepsilon_y - \varepsilon_z \quad (3)$$

In the equations (1) to (3), $\rho$, l, w, and t denote resistivity, length, width, and thickness of a piezoresistor, respectively, $\sigma$ and $\varepsilon$ denote stress and strain induced in the piezoresistor, respectively, and $\pi$ denotes piezoresistive coefficients.

In addition, in the equations (1) to (3), x, y, and z correspond to the longitudinal direction, lateral direction, and normal direction of a cantilever, respectively.

Relationships between strain and stress can be derived from the generalized Hooke's law.

[Math. 4]
$$\varepsilon_x = \frac{1}{E}[\sigma_x - \nu(\sigma_y + \sigma_z)] \quad (4)$$

[Math. 5]
$$\varepsilon_y = \frac{1}{E}[\sigma_y - \nu(\sigma_x + \sigma_z)] \quad (5)$$

[Math. 6]
$$\varepsilon_z = \frac{1}{E}[\sigma_z - \nu(\sigma_x + \sigma_y)] \quad (6)$$

In the equations (4) to (6), E and $\nu$ denote a Young's modulus and Poisson's ratio of the cantilever, respectively.

Therefore, when it is assumed that the stress is plane stress (that is, $\sigma_z=0$), the relative resistance change can be expressed by the equation (7) below.

[Math. 7]
$$\frac{\Delta R}{R} = \sigma_x\left(\frac{1+2\nu}{E} + \pi_x\right) + \sigma_y\left(-\frac{1}{E} + \pi_y\right) \quad (7)$$

A piezoresistor formed as a p-type semiconductor layer by being formed using single-crystal Si (100) in order to gain a large signal and use a high piezo-coefficient that silicon has to the maximum extent possible will now be examined. The piezoresistive coefficients are determined by relationships that are expressed by the equations (8) and (9) below.

[Math. 8]
$$\pi_x = \frac{1}{2}(\pi_{11} + \pi_{12} + \pi_{44}) \quad (8)$$

[Math. 9]
$$\pi_y = \frac{1}{2}(\pi_{11} + \pi_{12} - \pi_{44}) \quad (9)$$

In the equations (8) and (9), $\pi_{11}$, $\pi_{12}$, and $\pi_{44}$ are fundamental piezoresistive coefficients of a crystal. When the silicon is p-type Si (100) the x-direction and the y-direction of which are aligned with the [110] direction and the [1-10] direction, respectively, $\pi_{11}$ is +6.6 in units of $10^{-11}$ Pa$^{-1}$. In addition to the above, $\pi_{12}$ and $\pi_{44}$ are −1.1 and +138.1, respectively, in units of $10^{-11}$ Pa$^{-1}$.

Therefore, the piezoresistive coefficients $\pi_x$ and $\pi_y$ are calculated to be $71.8\times10^{-11}$ Pa$^{-1}$ and $-66.3\times10^{-11}$ Pa$^{-1}$, respectively. In addition, E and $\nu$ are $1.70\times10^{-11}$ Pa and 0.28, respectively. Since $\pi_x \gg (1+2\nu)/E$, $\pi_y \gg -1/E$, and $\pi_x \cong \pi_y \cong \pi_{44}/2$, the equation (7) can be approximated as indicated in the equation (10) below.

[Math. 10]
$$\frac{\Delta R}{R} \approx \frac{1}{2}\pi_{44}(\sigma_x - \sigma_y) \quad (10)$$

Therefore, a signal from a piezoresistor (that is, $\Delta R/R$) is mainly determined by a difference between $\sigma_x$ and $\sigma_y$.

(Method for Manufacturing Surface Stress Sensor)

Using FIGS. 6 to 12 while referring to FIGS. 1 to 5, a method for manufacturing the surface stress sensor 1 will be described. Note that FIGS. 6 to 12 are cross-sectional views corresponding to the position of a cross-section taken along the line X-X in FIG. 5.

The method for manufacturing the surface stress sensor 1 includes a stacked body forming step, a first ion implantation step, a second ion implantation step, a heat treatment step, a wiring layer forming step, and a removal step.

(Stacked Body Forming Step)

Figure 6A:
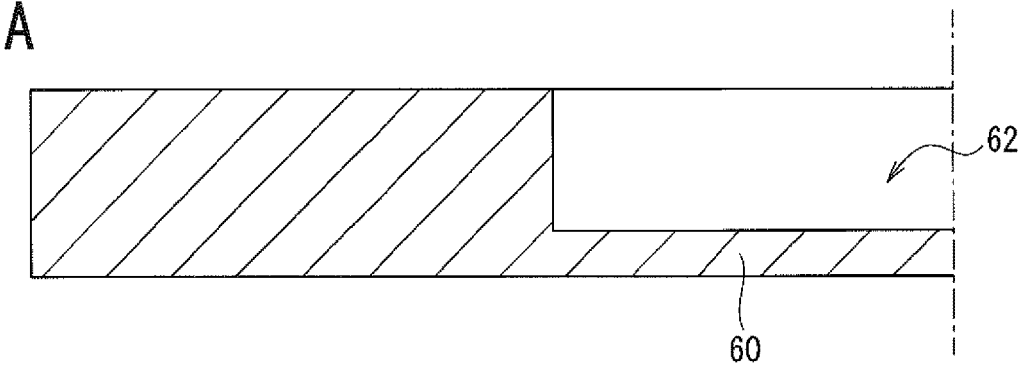
FIGS. 6A and 6B are diagrams illustrative of an example of a stacked body forming step of the surface stress sensor according to the first embodiment of the present invention.

In the stacked body forming step, first, a recessed portion 62 (trench) is formed on one face of a first silicon substrate 60 that serves as a material of the support base member 10, using lithography and an etching technology, as illustrated in FIG. 6A. The depth of the recessed portion 62 is set at, for example, 7 μm.

Figure 6B:
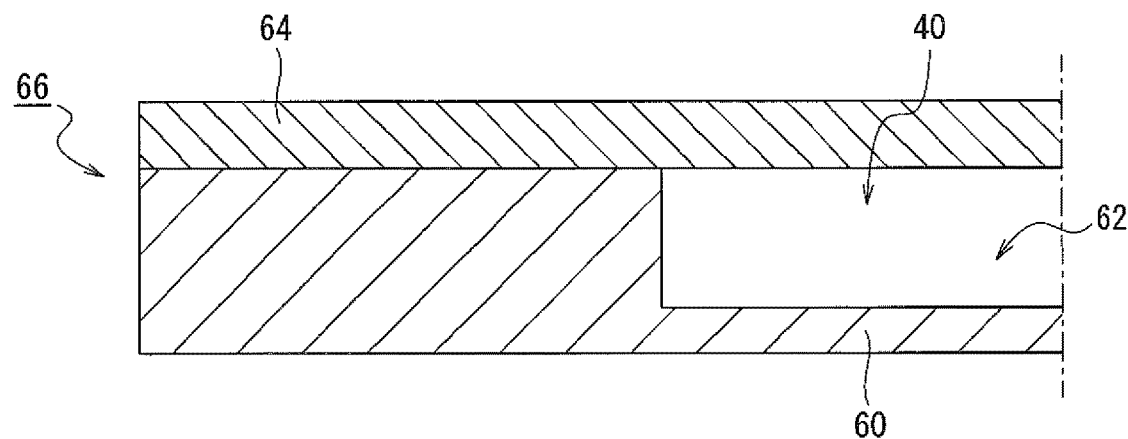

Next, by sticking a second silicon substrate 64 that serves as a material of the detection base member 20 to the first silicon substrate 60, on which the recessed portion 62 is formed, using one of various types of joining technology, such as adhesion, a stacked body 66 (cavity wafer) is formed, as illustrated in FIG. 6B.

By performing the stacked body forming step as described above, the cavity portion 40 the top, bottom, left, and right sides of which are enclosed by silicon (the first silicon substrate 60 and the second silicon substrate 64) is formed at a predetermined position in the stacked body 66.

Consequently, in the stacked body forming step, by forming the recessed portion 62 on one face of the support base member 10 and further sticking the detection base member 20 to the support base member 10 in such a way that the detection base member 20 covers the recessed portion 62, the stacked body 66 in which the cavity portion 40 is disposed between the support base member 10 and the detection base member 20 is formed.

(First Ion Implantation Step)

Figure 7:
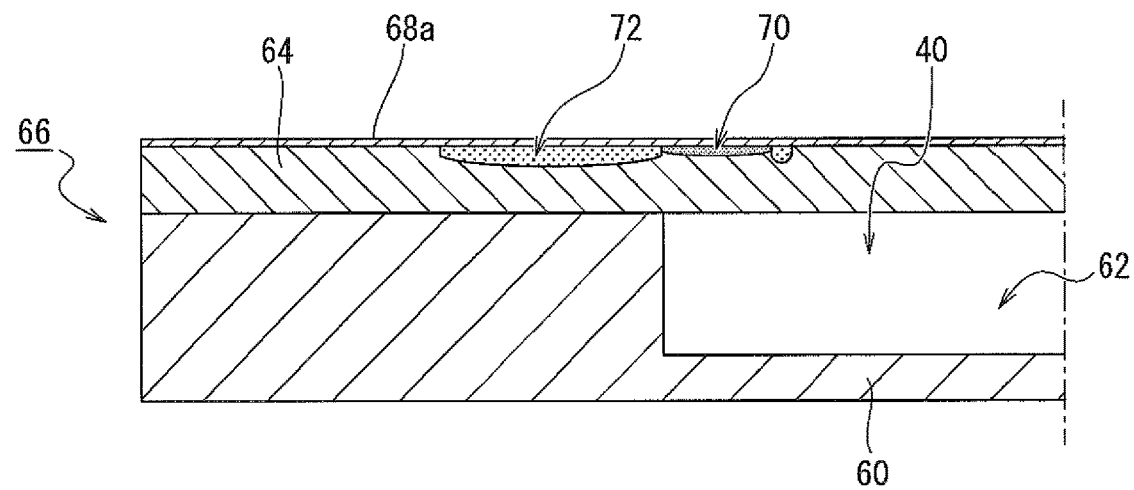
FIG. 7 is a diagram illustrative of an example of a first ion implantation step and a second ion implantation step of the surface stress sensor according to the first embodiment of the present invention.

In the first ion implantation step, first, the face on the upper side of the second silicon substrate 64 is oxidized and a first silicon oxide film 68a is thereby formed, and first ions are selectively implanted into flexible resistor regions 70, using a pattern of photoresist (not illustrated), as illustrated in FIG. 7.

Consequently, in the first ion implantation step, the first ions are implanted into selected partial regions (the flexible resistor regions 70) on the outer side than a preset region including the center of the detection base member 20 within the face of the detection base member 20 on the opposite side to the face thereof facing the support base member 10.

(Second Ion Implantation Step)

In the second ion implantation step, the photoresist used in the first ion implantation step is removed, a pattern of photoresist (not illustrated) different from the pattern of photoresist used in the first ion implantation step is further formed, and second ions are implanted into low resistance regions 72, as illustrated in FIG. 7.

Consequently, in the second ion implantation step, the second ions are implanted into selected regions of the detection base member 20 on the outer side than the regions (the flexible resistor regions 70) thereof into which the first ions were implanted.

(Heat Treatment Step)

In the heat treatment step, the photoresist used in the second ion implantation step is removed, and, further, heat treatment (annealing treatment) is performed on the stacked body 66, with the aim of activation of the first ions and the second ions. After the heat treatment has been performed on the stacked body 66, the first silicon oxide film 68a is removed.

Consequently, in the heat treatment step, by performing heat treatment on the stacked body 66 into which the first ions and the second ions were implanted, the flexible resistor regions 70 are formed in the regions into which the first ions were implanted and the low resistance regions 72 are also formed in the regions into which the second ions were implanted.

(Wiring Layer Forming Step)

Figure 8A:
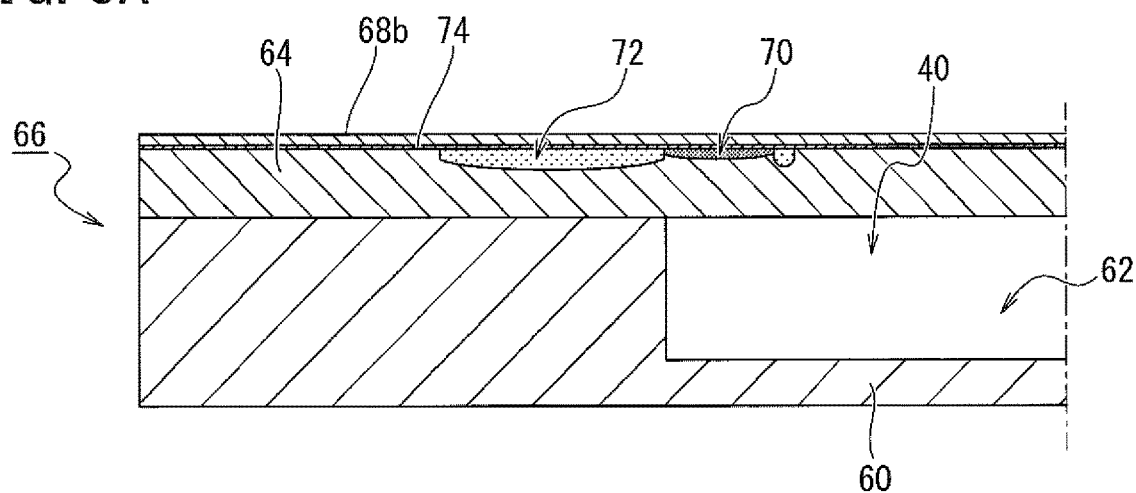
FIGS. 8A and 8B are diagrams illustrative of an example of a wiring layer forming step of the surface stress sensor according to the first embodiment of the present invention.
Figure 8B:
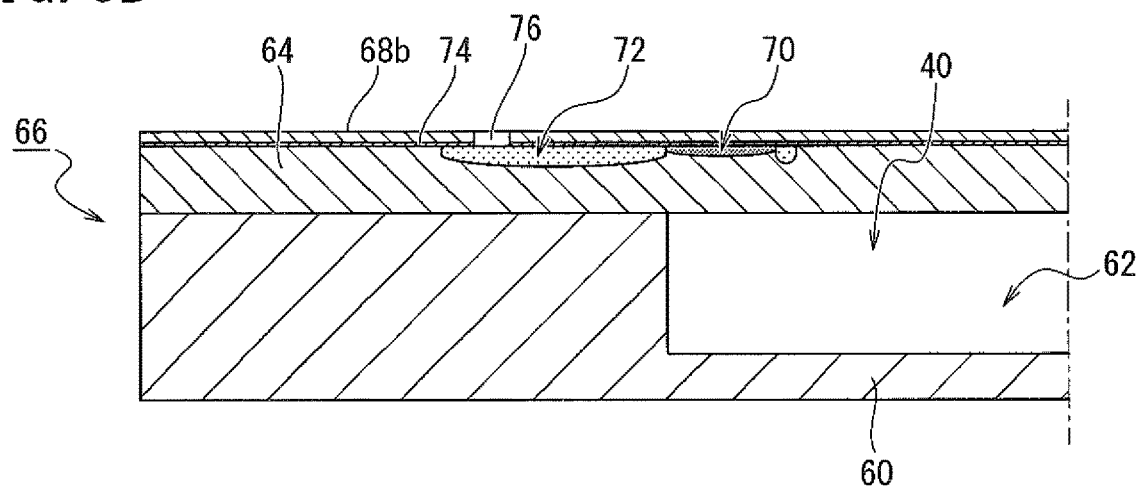

In the wiring layer forming step, a silicon nitride film 74 and a second silicon oxide film 68b are stacked in this order on the face on the upper side of the second silicon substrate 64, as illustrated in FIG. 8A. By means of regular lithography and oxide film etching, holes 76 are formed in the second silicon oxide film 68b, as illustrated in FIG. 8B.

Figure 9A:
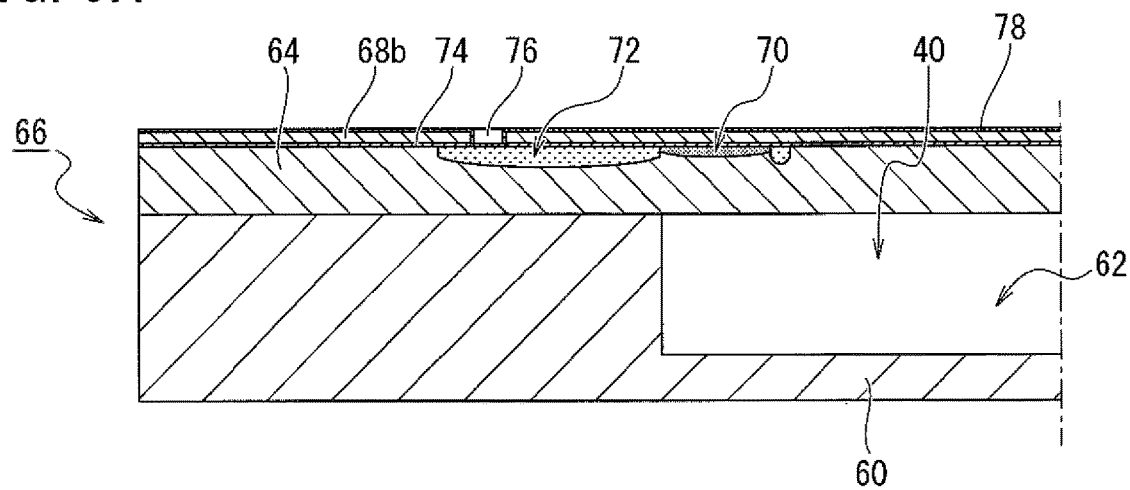
FIGS. 9A and 9B are other diagrams illustrative of the example of the wiring layer forming step of the surface stress sensor according to the first embodiment of the present invention.

Next, as illustrated in FIG. 9A, a laminated film 78 formed of Ti and TiN is formed on the second silicon oxide film 68b by means of sputtering and heat treatment is performed. The laminated film 78 is a so-called barrier metal that plays a role of preventing a metal film, such as Al, from anomalously diffusing into Si, and performing heat treatment causes interfaces between Si and Ti, which exist on the bottoms of the holes 76, to be silicided and it becomes possible to form connections with low resistance.

Figure 9B:
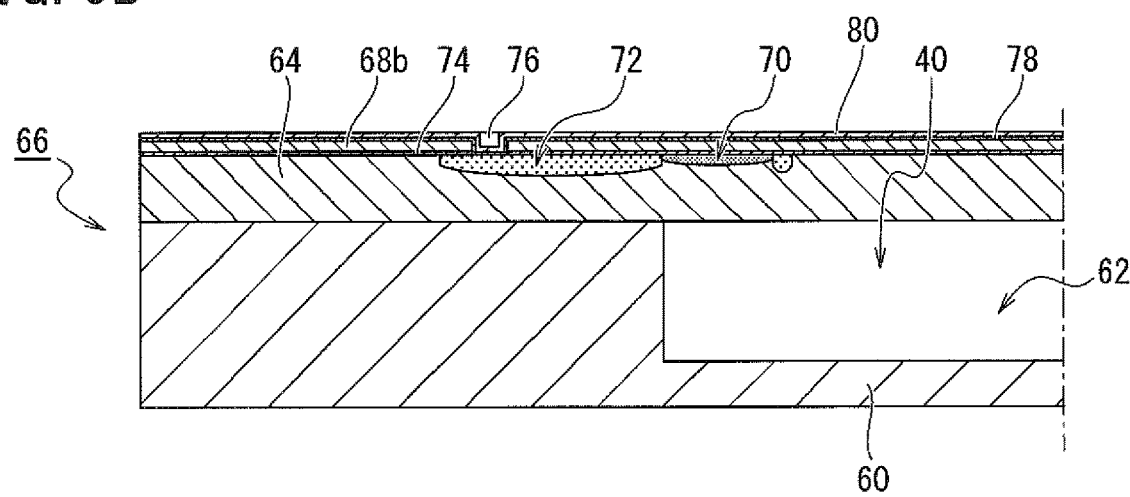

Further, as illustrated in FIG. 9B, a metal film 80, such as Al, is stacked on the laminated film 78 by means of sputtering.

Figure 10A:
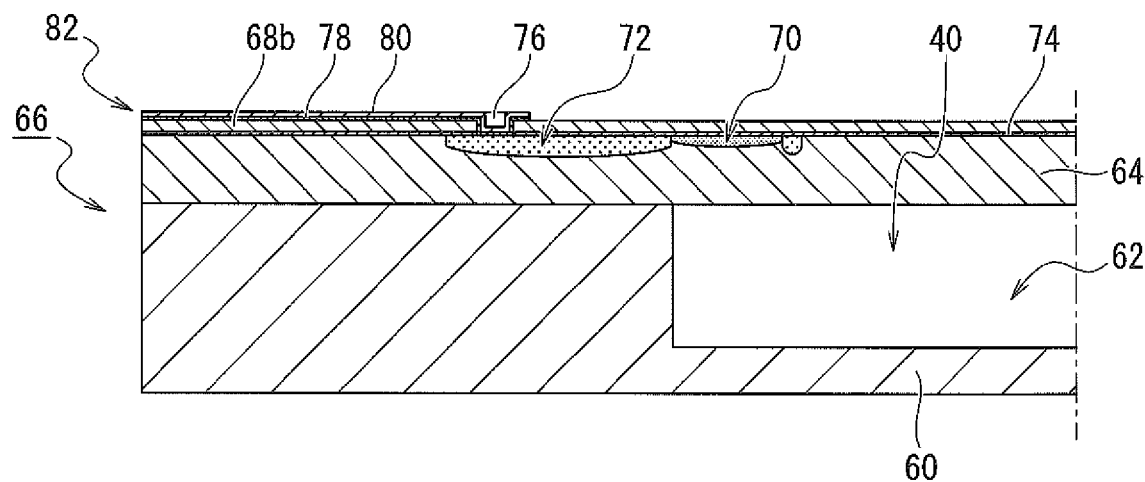
FIGS. 10A and 10B are still other diagrams illustrative of the example of the wiring layer forming step of the surface stress sensor according to the first embodiment of the present invention.
Figure 10B:
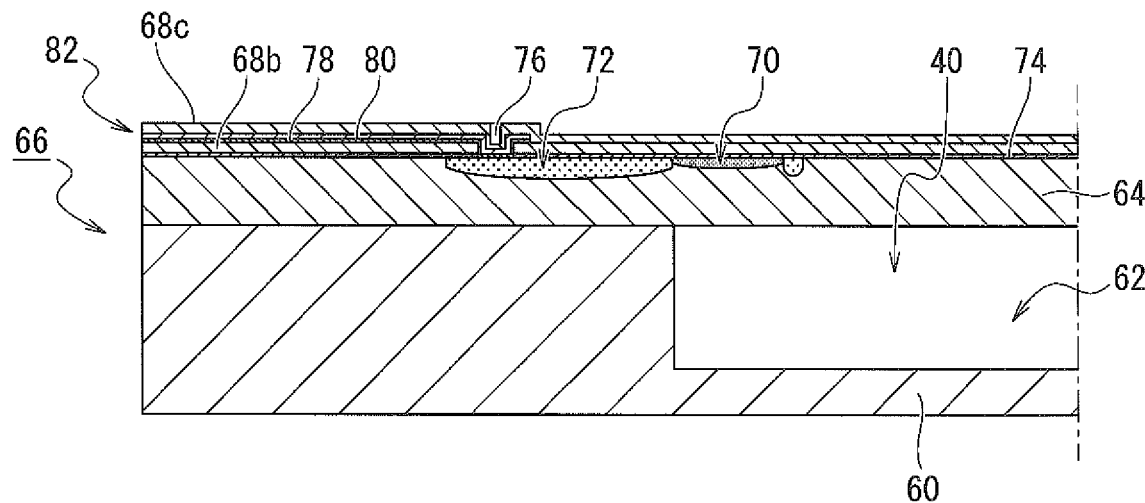

Next, by patterning the metal film 80 using lithography and an etching technology, a wiring layer 82 as illustrated in FIG. 10A is formed. Further, as illustrated in FIG. 10B, a third silicon oxide film 68c is stacked as an insulating layer.

Figure 11A:
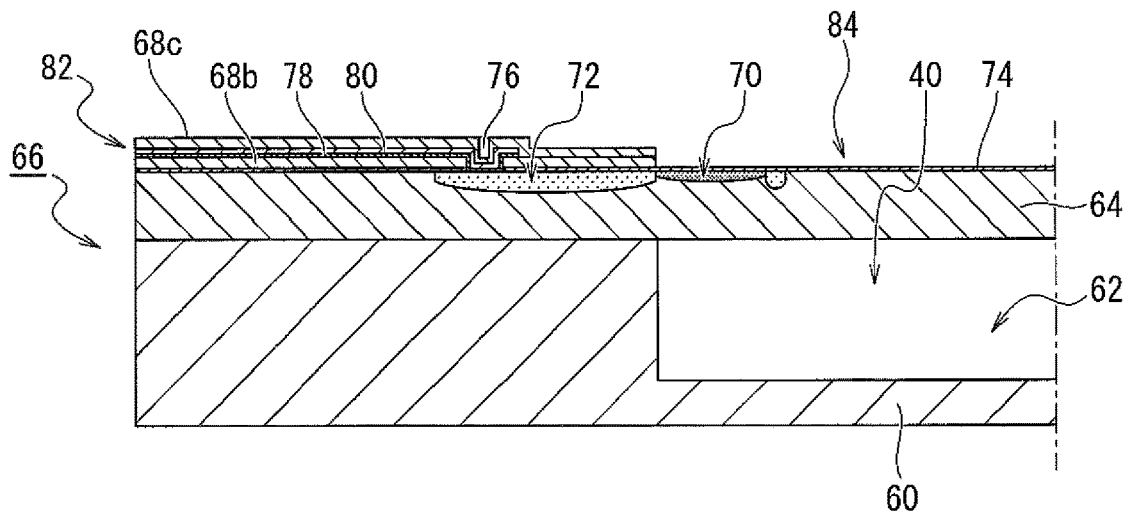
FIGS. 11A and 11B are still other diagrams illustrative of the example of the wiring layer forming step of the surface stress sensor according to the first embodiment of the present invention.
Figure 11B:
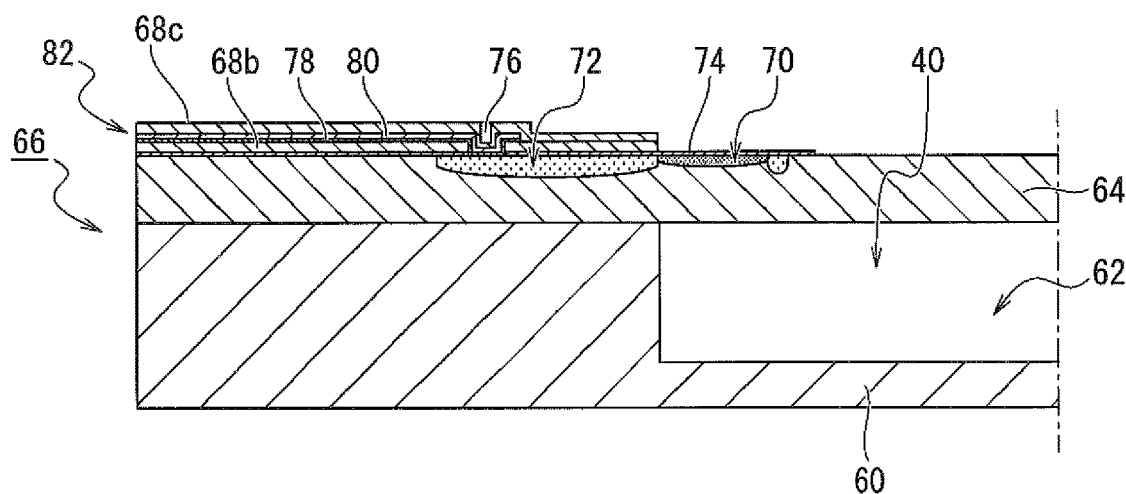

Subsequently, as illustrated in FIG. 11A, a pattern of photoresist (not illustrated) that covers a region excluding the flexible resistor regions 70 and a membrane setting region 84 that is a preset region including the center of the detection base member (a region to serve as the membrane later) is formed. Further, by means of an etching technology, the second silicon oxide film 68b formed in the flexible resistor regions 70 and the membrane setting region 84 is removed. A pattern of photoresist (not illustrated) that covers a region excluding the membrane setting region 84 is formed, and, as illustrated in FIG. 11B, the silicon nitride film 74 in the membrane setting region 84 is removed.

Figure 12:
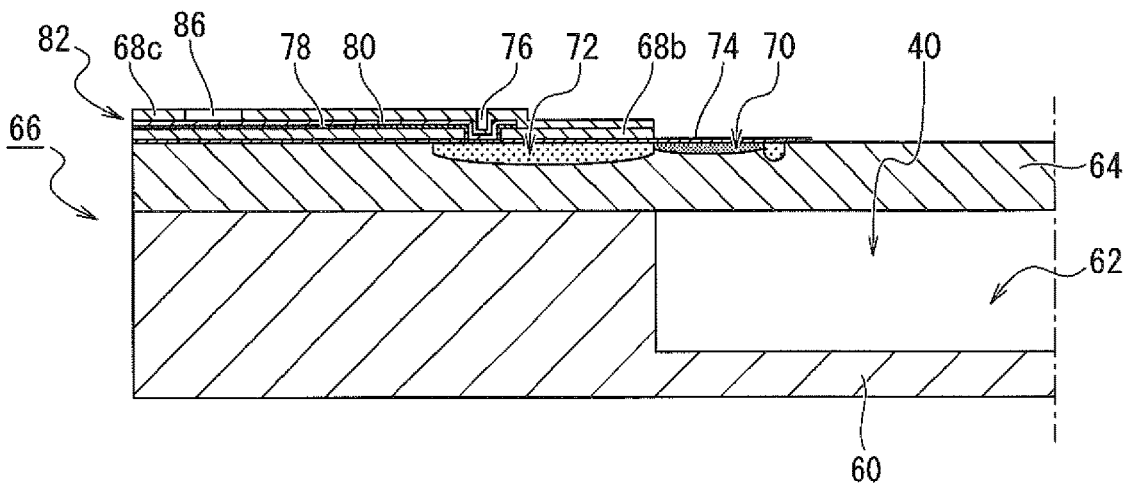
FIG. 12 is still another diagram illustrative of the example of the wiring layer forming step of the surface stress sensor according to the first embodiment of the present invention.

Next, as illustrated in FIG. 12, PADs 86 for acquiring outputs from the flexible resistors 50 are formed by means of regular lithography and an etching technology.

Consequently, in the wiring layer forming step, the wiring layers 82 that are electrically connected to the flexible resistors 50 are formed.

(Removal Step)

In the removal step, by cutting off portions of the membrane setting region 84 by means of etching, the four coupling portions 26a to 26d, constituting two pairs, are patterned.

Therefore, in the removal step, by removing regions that are regions surrounding the membrane setting region 84 and are other than the low resistance regions 72 and the flexible resistor regions 70 (regions to serve as the coupling portions 26 later), the membrane 22, the frame member 24, the coupling portions 26, and the flexible resistors 50 are formed.

(Operation and Actions)

Using FIGS. 13 to 14 while referring to FIGS. 1 to 12, operation and actions of the first embodiment will be described.

When the surface stress sensor 1 is used as, for example, a smell sensor, the receptor 30 is arranged in an atmosphere of a gas containing smell components and the smell components contained by the gas are caused to adsorb to the receptor 30.

When molecules of the gas adsorb to the receptor 30 and a strain is induced in the receptor 30, surface stress is applied to the membrane 22 and the membrane 22 is bent.

The frame member 24 is formed into a square well curb shape and surrounds the membrane 22, and each of the coupling portions 26 couples the membrane 22 and the frame member 24 at both ends thereof. For this reason, in each coupling portion 26, the end coupled to the membrane 22 is formed into a free end and the end coupled to the frame member 24 is formed into a fixed end.

Therefore, when the membrane 22 is bent, bending corresponding to a strain induced in the receptor 30 occurs in the coupling portions 26. The resistance values that the flexible resistors 50 have change according to the bending having occurred in the coupling portions 26, and change in voltage corresponding to the changes in the resistance values are output from the PADs 86 and used in data detection in a computer or the like.

At the time of use of the surface stress sensor 1, there is a possibility that, because of, for example, temperature change occurring in a usage environment of the surface stress sensor 1, the package substrate 2 deforms (contracts, extends, or warps).

Figure 13A:
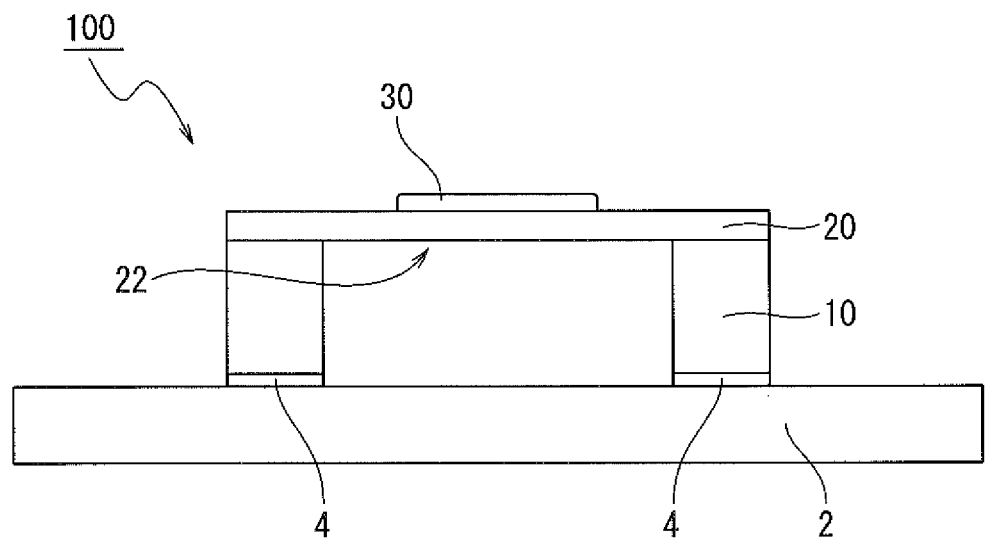
FIGS. 13A and 13B are diagrams illustrative of operation and actions of a surface stress sensor having a conventional configuration.
Figure 13B:
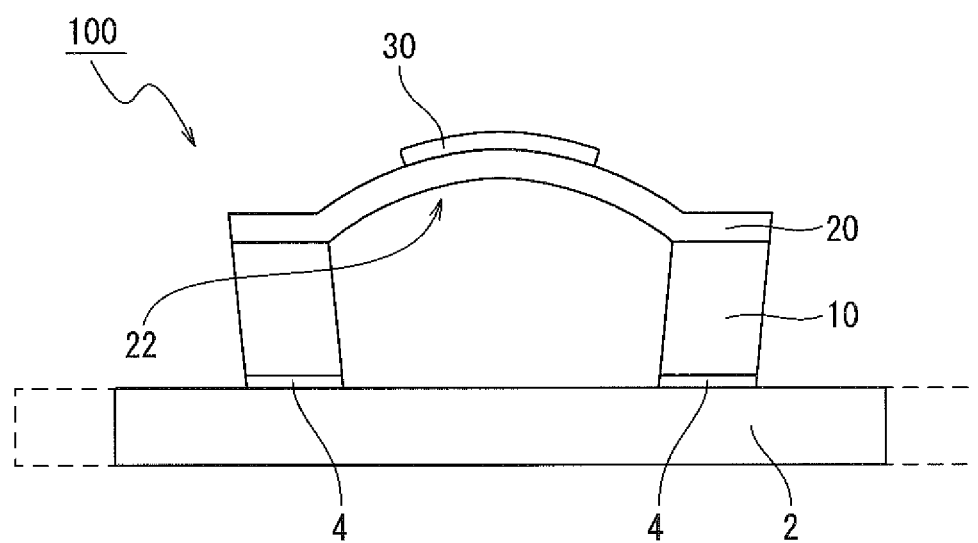

In a structure of a surface stress sensor 100 that has a conventional configuration, that is, a structure in which, for example, support base members 10 are cylindrically shaped and a membrane 22 is supported in mid-air, as illustrated in FIG. 13A, a problem to be described below may occur. That is, in the surface stress sensor 100 having the conventional configuration, when a package substrate 2 deforms (contracts), the support base members 10 also deform, associated with the deformation of the package substrate 2, as illustrated in FIG. 13B. Since the membrane 22 is supported in mid-air and only space exists between the membrane 22 and the package substrate 2, the support base members 10 are allowed to deform and the membrane 22 is substantially bent. That is, deformation of the package substrate 2 is applied to the membrane 22 as stress. The bending of the membrane 22 causes an offset to be given to voltage output or current output from the flexible resistors 50 and the offset changes due to temperature change, which causes precision of the surface stress sensor 100 to deteriorate.

Therefore, in the surface stress sensor 100 having the conventional configuration, change in stress received from the package substrate 2 having deformed causes the membrane 22 to substantially deform and characteristics of the surface stress sensor 100 to change. For this reason, characteristics of the surface stress sensor 100 at the time of installation will have changed from those at the time of a test, which makes it difficult to perform a test and calibration at the time of shipment of the surface stress sensor 100.

Figure 14A:
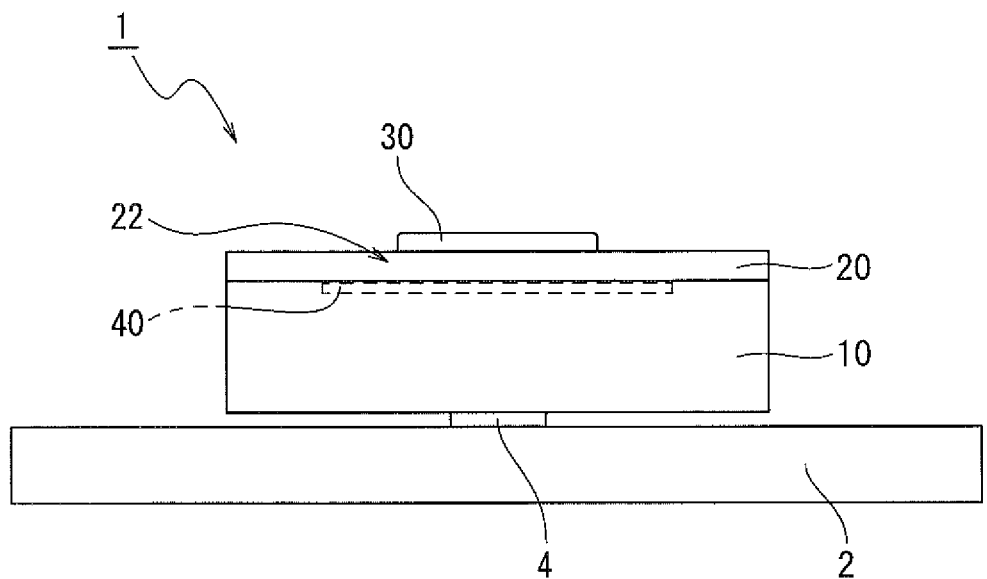
FIGS. 14A and 14B are diagrams illustrative of operation and actions of the surface stress sensor according to the first embodiment of the present invention.

By contrast, in the case of the surface stress sensor 1 of the first embodiment, the support base member 10 exists between the membrane 22 and the package substrate 2, as illustrated in FIG. 14A. In addition, the support base member 10, because of being formed into a rectangular column shape, has high rigidity compared with a structure in which the support base members 10 are formed into cylindrical shapes as in the surface stress sensor 100 having a conventional configuration.

Figure 14B:
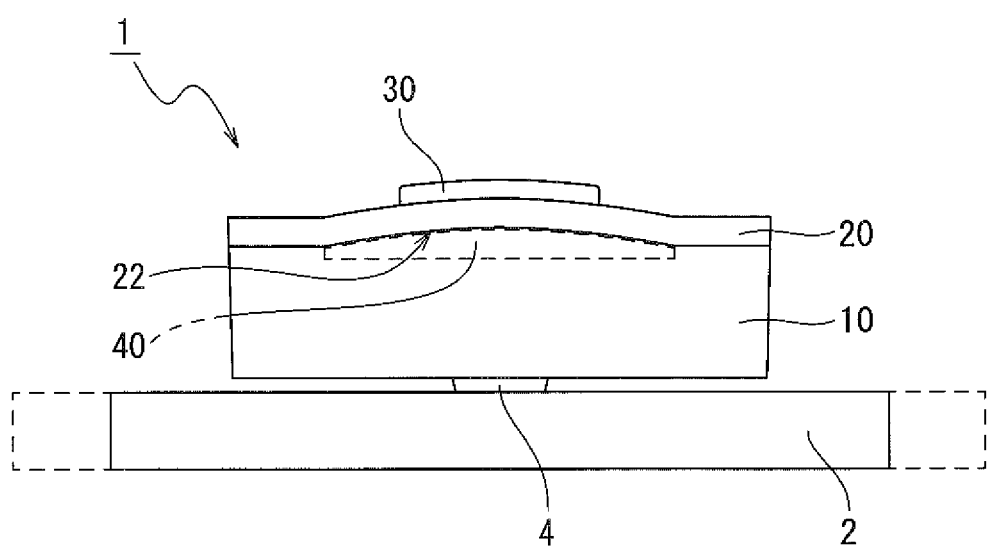

For this reason, in the case of the surface stress sensor 1 of the first embodiment, even when the package substrate 2 deforms (contracts) as illustrated in FIG. 14B, since the support base member 10 has high rigidity, deformation of the support base member 10 is suppressed and bending of the membrane 22 is thereby suppressed.

In addition, in the case of the surface stress sensor 1 of the first embodiment, since the support base member 10 has high rigidity, the surface stress sensor 1 becomes insensitive to stress change in the package substrate 2 caused by temperature change and the like, which enables stable sensing with high precision to be performed.

In addition, in the case of the surface stress sensor 1 of the first embodiment, the support base member 10 becomes insensitive to stress change in the package substrate 2 caused by temperature change and the like and is hardly influenced by the configuration (strength, material, thickness, and the like) of the package substrate 2. For this reason, it becomes possible to use the surface stress sensor 1 for package substrates 2 of a wide variety of configurations.

Further, in the case of the surface stress sensor 1 of the first embodiment, the center of the support base member 10 coincides with the position at which the connecting portion 4 is arranged. In addition to the above, the area of the support base member 10 is larger than the area of the connecting portion 4.

Since this configuration enables stress that is induced due to deformation of the package substrate 2 and transmitted to the support base member 10 via the connecting portion 4 to be reduced compared with stress induced in the whole package substrate 2, deformation of the support base member 10 is suppressed and bending of the membrane 22 is suppressed.

Therefore, in the case of the configuration of the first embodiment, it is possible to, by reducing stress that is applied to the membrane 22 due to deformation of the package substrate 2, suppress measurement precision of the surface stress sensor 1 from deteriorating.

In addition, regarding a technology for sensing information equivalent to the five senses of a human in collecting IoT-related information that is applicable to technology development and business, it becomes possible to apply the surface stress sensor 1 to sensors of taste and smell, which are not necessarily general sensing targets compared with sight, hearing, and touch among the five senses.

It should be noted that the foregoing first embodiment is one example of the present invention, the present invention is not limited to the foregoing first embodiment, and, even when the present invention may be carried out in modes other than the embodiment, depending on designs, various changes may be made to the present invention within a scope not departing from the technical idea of the present invention Advantageous Effects of First Embodiment The surface stress sensor 1 of the first embodiment enables advantageous effects that will be described below to be attained.

(1) The surface stress sensor 1 of the first embodiment includes the membrane 22 configured to be bent by applied surface stress, the frame member 24 configured to surround the membrane 22, the coupling portions 26 configured to couple the membrane 22 and the frame member 24, and the flexible resistors 50 configured to have resistance values that change according to bending induced in the coupling portions 26. Further, the surface stress sensor 1 of the first embodiment includes the support base member 10 configured to be connected to the frame member 24 and overlap the membrane 22 when viewed from the thickness direction of the membrane 22. In addition to the above, between the membrane 22 and the support base member 10, the cavity portion 40 is disposed.

For this reason, the surface stress sensor 1 of the first embodiment has a configuration in which the support base member 10 has high rigidity, and becomes insensitive to stress change in the package substrate 2 caused by temperature change and the like, which enables stable sensing with high precision to be performed.

As a result of this effect, it becomes possible to provide the surface stress sensor 1 that is capable of reducing stress applied to the membrane 22 due to deformation of the package substrate 2 and thereby suppressing deterioration in measurement precision.

In addition, it becomes possible to prevent the surface stress sensor 1 manufactured using a semiconductor process from changing characteristics thereof between before and after assembly thereof on a package or the like. Further, since it is possible to improve the rigidity of the surface stress sensor 1 itself, it becomes possible to prevent a problem occurring in the handling of the surface stress sensor 1, such as breakage at the time of handling, from occurring.

(2) The flexible resistors 50 are piezoresistors having resistance values that change according to bending induced in the coupling portions 26 by the membrane 22 being bent.

As a result of this configuration, it becomes possible to detect relative resistance changes in the resistance values of the piezoresistors, using stresses in the X-direction and Y-direction induced in the piezoresistors, and it thereby becomes possible to determine whether or not molecules to be detected have adsorbed to the receptor 30.

(3) The membrane 22 and the frame member 24 are coupled to each other with the four coupling portions 26a to 26d constituting two pairs, the flexible resistors 50 are disposed on the respective ones of the four coupling portions 26a to 26d, and the four flexible resistors 50 form a full Wheatstone bridge.

Since R1 and R3 are largely bent in the X-direction and R2 and R4 are largely bent in the Y-direction, each of a pair of R1 and R2 and a pair of R3 and R4 have relative resistance changes in the opposite direction. Voltage at an output terminal Vout, which is obtained by dividing applied voltage VB with R1 and R2, changes while producing a combined effect of R1 and R2, the resistance values of which increase or decrease in the opposite direction. This also applies to division of the applied voltage VB with R3 and R4. The full Wheatstone bridge is favorable in that, since both Vout voltages change in the opposite direction, both Vout voltages are, as a result, added to each other and changes of all the four piezoresistors positively contribute to increasing the sensitivity.

(4) The membrane 22 is an n-type semiconductor layer, and the flexible resistors 50 are p-type semiconductor layers.

As a result of this configuration, there is no possibility that currents flowing through the flexible resistors 50 flow through the membrane 22 and noise occurs in the output voltage.

In addition, use of p-type semiconductors for the flexible resistors 50 enables higher sensitivity to be achieved than use of n-type semiconductors.

(5) A material of which the detection base member 20 is formed and a material of which the support base member 10 is formed are the same material.

As a result of this configuration, it becomes possible to decrease a difference between the amount of deformation of the detection base member 20 and the amount of deformation of the support base member 10 corresponding to deformation of the package substrate 2 caused by temperature change and the like, and it thereby becomes possible to suppress bending of the membrane 22.

(6) The linear expansion coefficient of the support base member 10 is $5.0 \times 10^{-6}$/° C. or less.

As a result of this configuration, it becomes possible to improve rigidity of the support base member 10 and it thereby becomes possible to decrease the amount of deformation of the detection base member 20 with respect to deformation of the package substrate 2 caused by temperature change and the like.

(7) The thickness of the support base member 10 is 80 μm or greater.

As a result of this configuration, it becomes possible to improve rigidity of the support base member 10 and it thereby becomes possible to decrease the amount of deformation of the detection base member 20 with respect to deformation of the package substrate 2 caused by temperature change and the like.

(8) The outer peripheral faces of the support base member 10 and the outer peripheral faces of the frame member 24 are flush with each other when viewed from the thickness direction of the membrane 22.

As a result of this configuration, it becomes possible to perform separation into individual sensors, using a dicing apparatus that is used in regular semiconductor manufacturing.

(9) The support base member 10 is formed of a material containing any of silicon, sapphire, gallium arsenide, glass, and quartz.

As a result of this configuration, obtaining conductivity required for the surface stress sensor 1 is facilitated.

(10) The surface stress sensor 1 further includes the package substrate 2 configured to be connected to the face of the support base member 10 on the opposite side to the face thereof facing the membrane 22.

As a result of this configuration, installation of the surface stress sensor 1 to various types of sensors is facilitated.

(11) The support base member 10 and the package substrate 2 are connected to each other by the connecting portion 4 that is arranged at a position at which the connecting portion 4 overlaps at least a portion of the membrane 22 when viewed from the thickness direction of the membrane 22.

As a result of this configuration, it becomes possible to connect the support base member 10 and the package substrate 2 to each other without using a bracket or the like and it thereby becomes possible to suppress complication of the configuration.

(12) When viewed from the thickness direction of the membrane 22, the area of the connecting portion 4 is smaller than the area of the membrane 22.

This configuration enables stress that is induced due to deformation of the package substrate 2 and transmitted to the support base member 10 via the connecting portion 4 to be reduced to a smaller stress than stress induced in the whole package substrate 2.

As a result of this effect, it becomes possible to suppress deformation of the support base member 10 and thereby suppress bending of the membrane 22.

In addition, the method for manufacturing the surface stress sensor 1 of the first embodiment enables advantageous effects that will be described below to be attained.

(13) The method for manufacturing the surface stress sensor 1 includes the stacked body forming step, the first ion implantation step, the second ion implantation step, the heat treatment step, the wiring layer forming step, and the removal step. In the stacked body forming step, by forming the recessed portion 62 on one face of the support base member 10 and further sticking the detection base member 20 to the support base member 10 in such a way that the detection base member 20 covers the recessed portion 62, the stacked body 66 in which the cavity portion 40 is disposed between the support base member 10 and the detection base member 20 is formed. In the first ion implantation step, the first ions are implanted into selected partial regions on the outer side than a preset region including the center of the detection base member 20 within the face of the detection base member 20 on the opposite side to the face thereof facing the support base member 10. In the second ion implantation step, the second ions are implanted into selected regions of the detection base member 20 on the outer side than the regions thereof into which the first ions were implanted. In the heat treatment step, by performing heat treatment on the stacked body 66 into which the first ions and the second ions were implanted, the flexible resistor regions 70 are formed in the regions into which the first ions were implanted and the low resistance regions 72 are also formed in the regions into which the second ions were implanted. In the wiring layer forming step, the wiring layers 82 that are electrically connected to the flexible resistors 50 are formed. In the removal step, by removing regions that are regions surrounding the preset region including the center of the detection base member 20 and are other than the low resistance regions 72 and the flexible resistor regions 70, the membrane 22, the frame member 24, the coupling portions 26, and the flexible resistors 50 are formed.

For this reason, the surface stress sensor 1 of the first embodiment has a configuration in which the support base member 10 has high rigidity, and becomes insensitive to stress change in the package substrate 2 caused by temperature change and the like, which enables stable sensing with high precision to be performed.

As a result of this effect, it becomes possible to provide the method for manufacturing the surface stress sensor that is capable of reducing stress applied to the membrane 22 due to deformation of the package substrate 2 and thereby suppressing deterioration in measurement precision.

In addition, it becomes possible to prevent the surface stress sensor 1 manufactured using a semiconductor process from changing characteristics thereof between before and after assembly thereof on a package or the like. Further, since it is possible to improve the rigidity of the surface stress sensor 1 itself, it becomes possible to prevent a problem occurring in the handling of the surface stress sensor 1, such as breakage at the time of handling, from occurring.

Variations of First Embodiment (1) Although, in the first embodiment, by forming the recessed portion 62 on one face of the first silicon substrate 60, which serves as a material of the support base member 10, the cavity portion 40 is formed between the membrane 22 and the support base member 10, the present invention is not limited to the configuration. That is, by forming a recessed portion on the face of the second silicon substrate 64, which serves as a material of the detection base member 20, facing the support base member 10, the cavity portion 40 may be formed between the membrane 22 and the support base member 10.
(2) Although, in the first embodiment, the surface stress sensor 1 has a configuration in which, on the four coupling portions 26a to 26d constituting two pairs, the flexible resistors 50a to 50d are disposed, respectively, the present invention is not limited to the configuration. That is, the surface stress sensor 1 may have a configuration in which, on two coupling portions 26 constituting a pair, flexible resistors 50 are respectively disposed.
(3) Although, in the first embodiment, the surface stress sensor 1 has a configuration in which, on all the four coupling portions 26a to 26d, the flexible resistors 50 are disposed, respectively, the present invention is not limited to the configuration and the surface stress sensor 1 may have a configuration in which, on at least one coupling portion 26, a flexible resistor 50 is disposed.
(4) Although, in the first embodiment, the area of the connecting portion 4 is set at a value smaller than the area of the membrane 22 when viewed from the thickness direction of the membrane 22, the present invention is not limited to the configuration and the area of the connecting portion 4 may be set at a value equal to or greater than the area of the membrane 22.
(5) Although, in the first embodiment, the shape of the connecting portion 4 is set as a circle, the present invention is not limited to the configuration and the shape of the connecting portion 4 may be set as a square. In addition, a plurality of connecting portions 4 may be formed.
(6) Although, in the first embodiment, the same material is used as a material of which the detection base member 20 is formed and a material of which the support base member 10 is formed, the present invention is not limited to the configuration and different materials may be used as a material of which the detection base member 20 is formed and a material of which the support base member 10 is formed.

In this case, setting a difference between a linear expansion coefficient of the detection base member 20 and a linear expansion coefficient of the support base member 10 to be $1.2 \times 10^{-5}/°$ C. or less enables a difference between the amount of deformation of the detection base member 20 and the amount of deformation of the support base member 10 corresponding to deformation of the package substrate 2 to be decreased. This configuration enables bending of the membrane 22 to be suppressed.
(7) Although, in the first embodiment, the linear expansion coefficient of the support base member 10 is set at $5.0 \times 10^{-6}/°$ C. or less, the present invention is not limited to the configuration and the linear expansion coefficient of the support base member 10 may be set at $1.0 \times 10^{-5}/°$ C. or less.

Even in this case, it becomes possible to improve rigidity of the support base member 10 and it thereby becomes possible to decrease the amount of deformation of the detection base member 20 with respect to deformation of the package substrate 2 caused by temperature change and the like.

Second Embodiment

Hereinafter, a second embodiment of the present invention will be described with reference to the drawings.
(Configuration)

Figure 15:
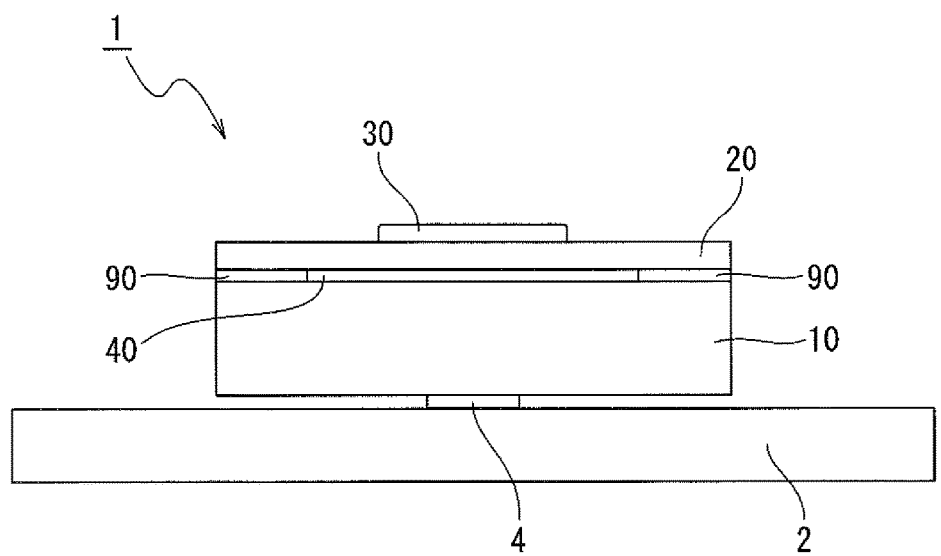
FIG. 15 is a side view illustrative of a configuration a surface stress sensor according to a second embodiment of the present invention.

Using FIG. 15 while referring to FIGS. 1 to 5, a configuration of the second embodiment will be described.

The configuration of the second embodiment is the same as that of the first embodiment described above except that, as illustrated in FIG. 15, a frame member 24 is connected to the face (in FIG. 15, the face on the upper side) of a support base member 10 on the opposite side to the face thereof facing a package substrate 2 with a connecting layer 90 interposed therebetween.

The connecting layer 90 is formed of silicon dioxide ($SiO_2$) or the like.

Since the configuration of the other constituent components is the same as that of the first embodiment described above, a description thereof will be omitted.
(Method for Manufacturing Surface Stress Sensor)

Using FIGS. 16 to 19 while referring to FIGS. 1 to 15, a method for manufacturing a surface stress sensor 1 will be described. Note that cross-sectional views in FIGS. 16 to 19 correspond to a cross-sectional view taken along the line X-X in FIG. 5.

The method for manufacturing the surface stress sensor 1 includes a stacked body forming step, a first ion implantation step, a second ion implantation step, a heat treatment step, a hole forming step, a cavity portion forming step, a hole sealing step, a wiring layer forming step, and a removal step.

(Stacked Body Forming Step)

Figure 16:
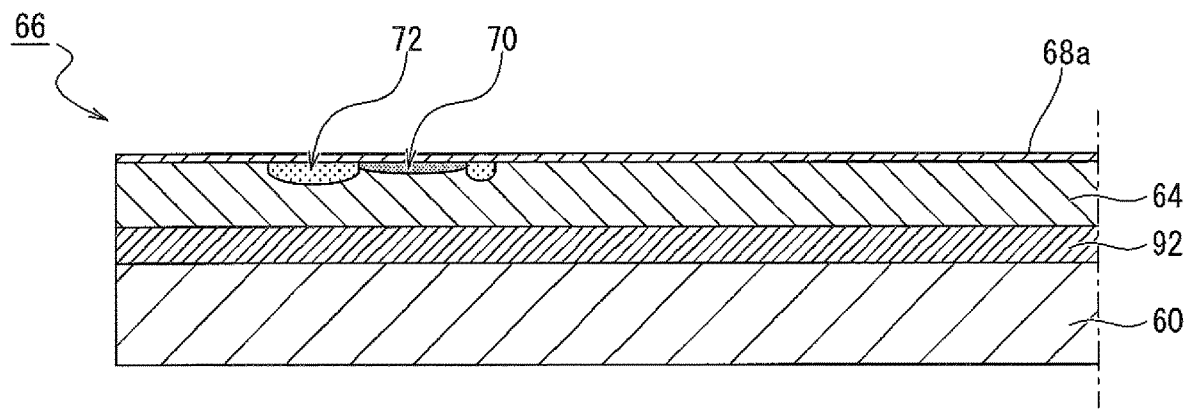
FIG. 16 is a diagram illustrative of an example of a stacked body forming step of the surface stress sensor according to the second embodiment of the present invention.

In the stacked body forming step, first, a sacrificial layer 92 that is formed of silicon oxide film is stacked on a first silicon substrate 60 that serves as a material of the support base member 10, as illustrated in FIG. 16. Further, on the sacrificial layer 92, a second silicon substrate 64 that serves as a material of a detection base member 20 is stacked. Note that, as the sacrificial layer 92, silicon nitride film or metal film made of a metal, such as aluminum, titanium, copper, and tungsten, may be used in addition to silicon oxide film.

Consequently, in the stacked body forming step, by stacking the sacrificial layer 92 on the support base member 10 and further stacking the detection base member 20 on the sacrificial layer 92, a stacked body 66 is formed.

(First Ion Implantation Step)

In the first ion implantation step, first, the face on the upper side of the second silicon substrate 64 is oxidized by oxidizing the second silicon substrate 64 and a first silicon oxide film 68a is thereby formed, as illustrated in FIG. 16.

Next, a pattern of photoresist (not illustrated) is formed to the second silicon substrate 64 on which the first silicon oxide film 68a is formed, and first ions are selectively implanted into flexible resistor regions 70.

Consequently, in the first ion implantation step, the first ions are implanted into selected partial regions (the flexible resistor regions 70) on the outer side than a preset region including the center of the detection base member 20 within the face of the detection base member 20 on the opposite side to the face thereof facing the support base member 10.

(Second Ion Implantation Step)

In the second ion implantation step, the photoresist used in the first ion implantation step is removed, a pattern of photoresist (not illustrated) different from the pattern of photoresist used in the first ion implantation step is further formed, and second ions are implanted into low resistance regions 72.

Consequently, in the second ion implantation step, the second ions are implanted into selected regions of the detection base member 20 on the outer side than the regions (the flexible resistor regions 70) thereof into which the first ions were implanted.

(Heat Treatment Step)

In the heat treatment step, the photoresist used in the second ion implantation step is removed, and, further, heat treatment (annealing treatment) is performed on the stacked body 66, with the aim of activation of the first ions and the second ions. After the heat treatment has been performed on the stacked body 66, the first silicon oxide film 68a is removed.

Consequently, in the heat treatment step, by performing heat treatment on the stacked body 66 into which the first ions and the second ions were implanted, the flexible resistor regions 70 are formed in the regions into which the first ions were implanted and the low resistance regions 72 are also formed in the regions into which the second ions were implanted.

(Hole Forming Step)

In the hole forming step, by means of a general photolithography technology, a pattern of holes (not illustrated) is formed on the face on the upper side of the second silicon substrate 64.

Figure 17:
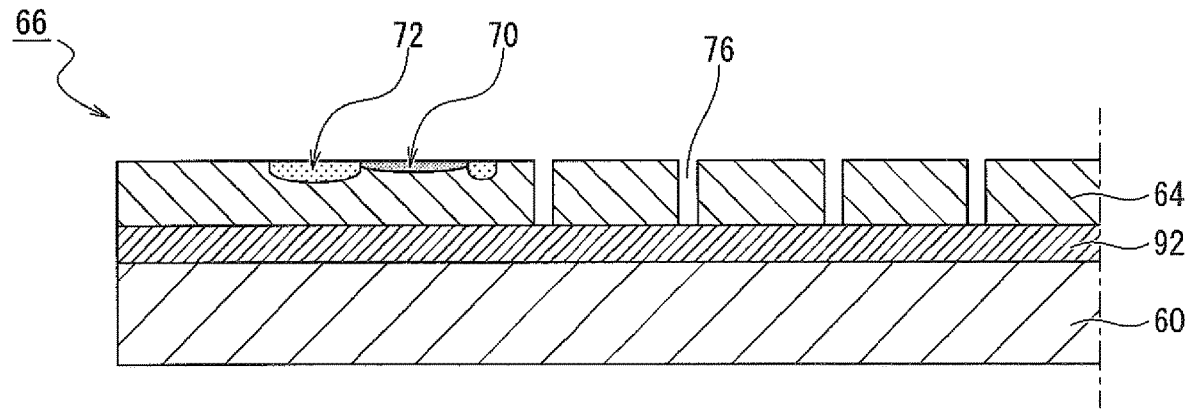
FIG. 17 is a diagram illustrative of an example of a hole forming step of the surface stress sensor according to the second embodiment of the present invention.

Next, dry etching is performed using the pattern of holes as a mask, and, as illustrated in FIG. 17, holes 76 are formed in the second silicon substrate 64. The diameter of each hole 76 is set at, for example, 0.28 μm, and the depth of each hole 76 is set at such a depth that the hole 76 reaches the sacrificial layer 92.

Consequently, in the hole forming step, the holes 76 that penetrate to the sacrificial layer 92 are formed in a region of the detection base member 20 adjacent to the regions thereof in which the flexible resistor regions 70 and the low resistance regions 72 were formed.

(Cavity Portion Forming Step)

Figure 18:
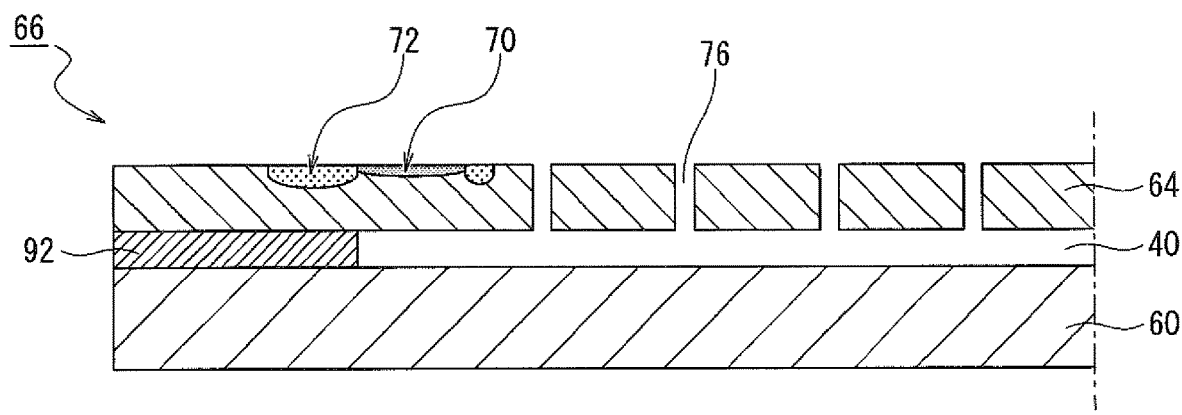
FIG. 18 is a diagram illustrative of an example of a cavity portion forming step of the surface stress sensor according to the second embodiment of the present invention.

In the cavity portion forming step, only the sacrificial layer 92 is selectively etched by causing HF vapor to permeate to the side on which the first silicon substrate 60 is located through the holes 76, and, as illustrated in FIG. 18, a cavity portion 40 is formed between the first silicon substrate 60 and the second silicon substrate 64.

The reason for not using wet etching with HF in the step is to avoid an occurrence of a trouble (also referred to as stiction) in which, at the time of drying after the formation of the cavity portion 40, the cavity portion 40 is crushed due to surface tension of pure water or the like.

Consequently, in the cavity portion forming step, a portion of the sacrificial layer 92 arranged between the flexible resistor regions 70 and the support base member 10 is removed by means of etching via the holes 76 and the cavity portion 40 is thereby disposed between the support base member 10 and the detection base member 20.

(Hole Sealing Step)

Figure 19:
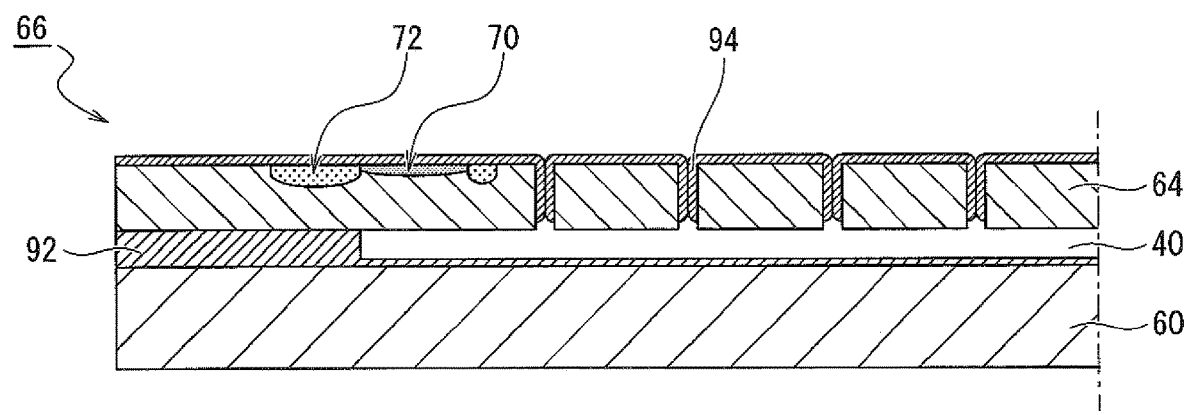
FIG. 19 is a diagram illustrative of an example of a hole sealing step of the surface stress sensor according to the second embodiment of the present invention.

In the hole sealing step, as illustrated in FIG. 19, the holes 76 are sealed with an oxide film 94.

Although, as a method for sealing the holes 76, for example, combining thermal oxidation treatment and CVD or the like is effective, it is possible to use only CVD when the diameter of each hole 76 is small.

Consequently, in the hole sealing step, the oxide film 94 is formed on the face of the detection base member 20 on the opposite side to the face thereof facing the support base member 10 and the holes 76 are thereby sealed.

(Wiring Layer Forming Step)

Since the wiring layer forming step is performed in the same procedure as that of the first embodiment described above, a description thereof will be omitted.

Consequently, in the wiring layer forming step, wiring layers 82 that are electrically connected to flexible resistors 50 are formed.

(Removal Step)

Since the removal step is performed in the same procedure as that of the first embodiment described above, a description thereof will be omitted.

Therefore, in the removal step, by removing regions that are regions surrounding the preset region including the center of the detection base member 20 and are other than the low resistance regions 72 and the flexible resistor regions 70, a membrane 22, the frame member 24, coupling portions 26, and the flexible resistors 50 are formed.

(Operation and Actions)

Since operation and actions of the second embodiment are the same as those of the first embodiment described above, descriptions thereof will be omitted.

It should be noted that the foregoing second embodiment is one example of the present invention, the present invention is not limited to the foregoing second embodiment, and, even when the present invention may be carried out in modes other than the embodiment, depending on designs, various changes may be made to the present invention within a scope not departing from the technical idea of the present invention Advantageous Effects of Second Embodiment The method for manufacturing the surface stress sensor of the second embodiment enables advantageous effects that will be described below to be attained.

(1) The method for manufacturing the surface stress sensor includes the stacked body forming step, the first ion implantation step, the second ion implantation step, the heat treatment step, the hole forming step, the cavity portion forming step, the hole sealing step, the wiring layer forming step, and the removal step. In the stacked body forming step, by stacking the sacrificial layer 92 on the support base member 10 and further stacking the detection base member 20 on the sacrificial layer 92, the stacked body 66 is formed. In the first ion implantation step, the first ions are implanted into selected partial regions on the outer side than a preset region including the center of the detection base member 20 within the face of the detection base member 20 on the opposite side to the face thereof facing the support base member 10. In the second ion implantation step, the second ions are implanted into selected regions of the detection base member 20 on the outer side than the regions thereof into which the first ions were implanted. In the heat treatment step, by performing heat treatment on the stacked body 66 into which the first ions and the second ions were implanted, the flexible resistor regions 70 are formed in the regions into which the first ions were implanted and the low resistance regions 72 are also formed in the regions into which the second ions were implanted. In the hole forming step, the holes 76 that penetrate to the sacrificial layer 92 are formed in a region of the detection base member 20 adjacent to the regions thereof in which the flexible resistor regions 70 and the low resistance regions 72 were formed. In the cavity portion forming step, a portion of the sacrificial layer 92 arranged between the flexible resistor regions 70 and the support base member 10 is removed by means of etching via the holes 76 and the cavity portion 40 is thereby disposed between the support base member 10 and the detection base member 20. In the hole sealing step, the oxide film 94 is formed on the face of the detection base member 20 on the opposite side to the face thereof facing the support base member 10 and the holes 76 are thereby sealed. In the wiring layer forming step, the wiring layers 82 that are electrically connected to the flexible resistors 50 are formed. In the removal step, by removing regions that are regions surrounding a preset membrane setting region 84 including the center of the detection base member 20 and are other than the low resistance regions 72 and the flexible resistor regions 70, the membrane 22, the frame member 24, the coupling portions 26, and the flexible resistors 50 are formed.

For this reason, the surface stress sensor 1 of the second embodiment has a configuration in which the support base member 10 has high rigidity, and becomes insensitive to stress change in the package substrate 2 caused by temperature change and the like, which enables stable sensing with high precision to be performed.

As a result of this effect, it becomes possible to provide the method for manufacturing the surface stress sensor that is capable of reducing stress applied to the membrane 22 due to deformation of the package substrate 2 and thereby suppressing deterioration in measurement precision.

In addition, it becomes possible to prevent the surface stress sensor 1 manufactured using a semiconductor process from changing characteristics thereof between before and after assembly thereof on a package or the like. Further, since it is possible to improve the rigidity of the surface stress sensor 1 itself, it becomes possible to prevent a problem occurring in the handling of the surface stress sensor 1, such as breakage at the time of handling, from occurring.

Third Embodiment

Hereinafter, a third embodiment of the present invention will be described with reference to the drawings.

In the surface stress sensor 1 according to the first embodiment, a buried oxide (BOX) layer is sometimes disposed on a surface of the support base member 10 with the aim of insulation and the like between the support base member 10 and the detection base member 20. The BOX layer is formed by, for example, thermally oxidizing a Si substrate. Since thermal oxidation of Si induces stress in Si crystal, the BOX layer sometimes becomes a cause of bending of the membrane of the surface stress sensor. Bending of the membrane caused by stress in the BOX layer becomes an offset in the surface stress sensor, and improvement in detection precision of the surface stress sensor is inhibited.

A surface stress sensor according to the third embodiment of the present invention is capable of, in a configuration in which a BOX layer is disposed on a surface of a support base member, suppressing reduction in measurement precision of the surface stress sensor caused by the BOX layer.

(Configuration)

Figure 20:
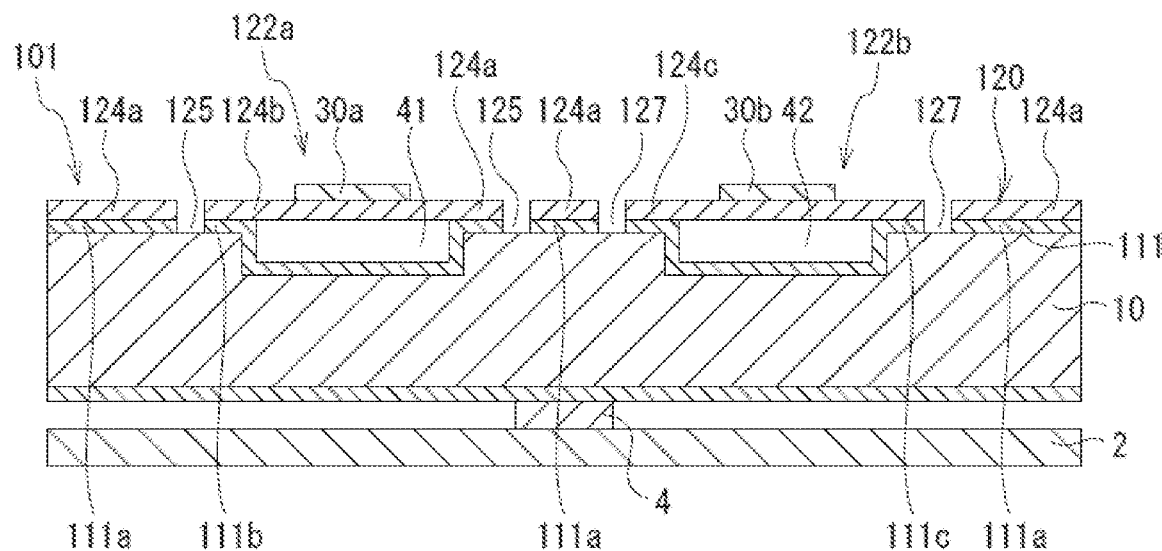
FIG. 20 is a cross-sectional view illustrative of a configuration a surface stress sensor according to a third embodiment of the present invention.
Figure 21:
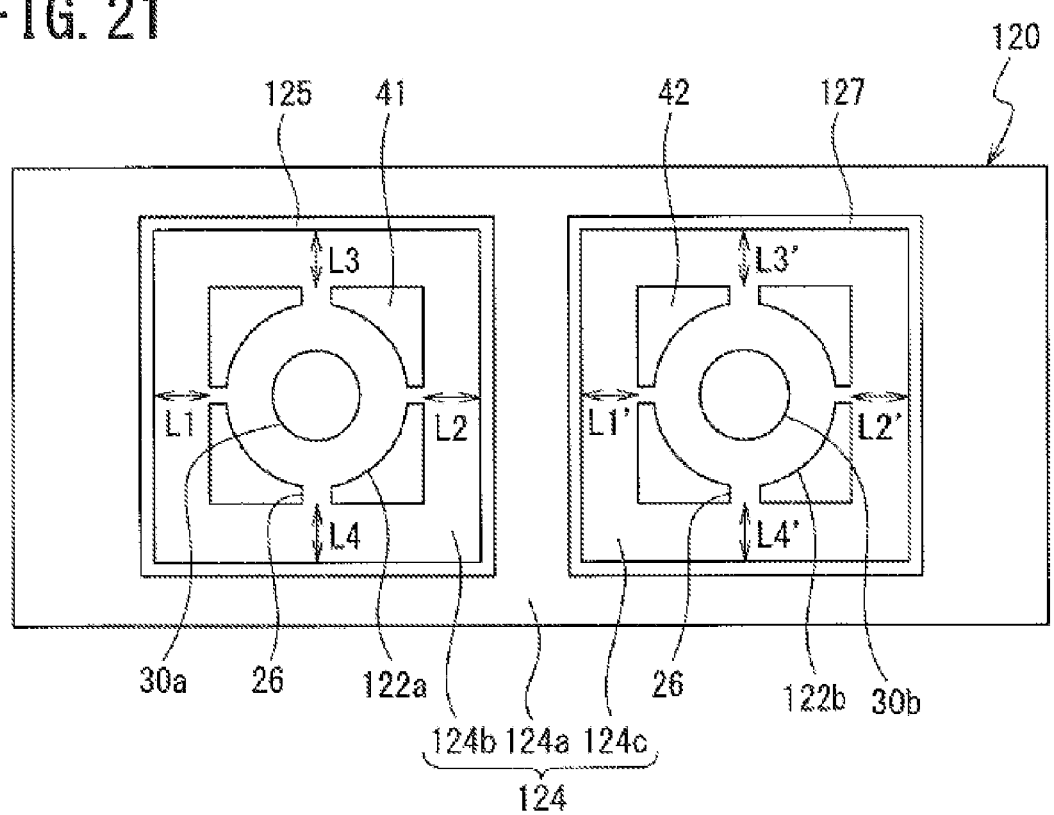
FIG. 21 is a plan view illustrative of the configuration the surface stress sensor according to the third embodiment of the present invention.

Using FIGS. 20 and 21 while referring to FIGS. 1 to 5, a configuration of the third embodiment will be described. FIG. 20 is a cross-sectional view illustrative of a cross-section of a surface stress sensor 101 according to the third embodiment. FIG. 21 is a plan view of the surface stress sensor 101 illustrated in FIG. 20. Note that, in FIGS. 20 and 21, illustration of a wiring layer that is formed on the upper face of the surface stress sensor 101 is omitted.

As illustrated in FIG. 20, the surface stress sensor 101 includes a connecting layer 111 that is a BOX layer on a surface of a support base member 10. In addition, the surface stress sensor 101 has a plurality of (for example, two) sensor portions disposed on one support base member 10. That is, in the surface stress sensor 101, a plurality of cavity portions 40 (41 and 42) are disposed on the support base member 10, and a membrane 122a on which a receptor 30a is disposed and a membrane 122b on the upper face of which a receptor 30b is disposed are disposed above the cavity portions 41 and 42, respectively. With this configuration, the surface stress sensor 101 is configured in such a way as to have the receptor 30a and the receptor 30b formed of different materials and be thereby able to detect different types of gases. In addition, the surface stress sensor 101 may have the receptor 30a and the receptor 30b formed of the same material. Since the membranes 122a and 122b, the receptors 30a and 30b, and the cavity portions 41 and 42 correspond to the membrane 22, the receptor 30, and the cavity portion 40 of the first embodiment, respectively, descriptions thereof will be omitted.

(Connecting Layer)

In the surface stress sensor 101, the connecting layer 111 is disposed on the face of the support base member 10 facing a detection base member 120, and portions of the connecting layer 111 are removed and groove portions 125 and 127 are thereby formed. On the surface of the face of the support base member 10 facing the detection base member 120, two trenches that serve as the cavity portions 40 (41 and 42) are formed. The connecting layer 111 (111a, 111b, and 111c) is formed on the face of the support base member 10 facing the detection base member 120 after the formation of the trenches in such a way as to cover the surface of the support base member 10 and the surfaces of the trenches. The connecting layers 111a, 111b, and 111c will be described later.

Note that the connecting layer 111 may be disposed on the surface of the face (in FIG. 20, the face on the lower side) of the support base member 10 facing a package substrate 2.

(Groove Portion)

As illustrated in FIG. 21, the groove portions 125 and 127 are disposed at positions at which the groove portions 125 and 127 surround the cavity portions 41 and 42, which are rectangular when viewed in plan, respectively, and are formed in such a way as to penetrate a frame member 124 of the detection base member 120 and the connecting layer 111. The groove portions 125 and 127 are formed by removing portions of the respective ones of the frame member 124 and the connecting layer 111. The groove portions 125 and 127 have annular shapes corresponding to the outer shapes of the cavity portions 41 and 42 when viewed in plan, respectively, and are formed into, for example, polygonal annular shapes the outer shapes of which are rectangular when viewed in plan. The groove portions 125 and 127 are disposed in regions that are located on the outer side than flexible resistors 50a to 50d and surround the cavity portions 41 and 42 when viewed in plan, respectively.

As illustrated in FIG. 20, the connecting layer 111 is separated by the groove portion 125 into the connecting layer 111b that is positioned on the inner side than the groove portion 125 when viewed in plan (a membrane 122a forming side region) and the connecting layer 111a that is positioned on the outer side than the groove portion 125. In addition, the connecting layer 111 is separated by the groove portion 127 into the connecting layer 111c that is positioned on the inner side than the groove portion 127 when viewed in plan (a membrane 122b forming side region) and the connecting layer 111a that is positioned on the outer side than the groove portion 127.

Similarly, the frame member 124 is separated by the groove portion 125 into a frame member 124b that is positioned on the inner side than the groove portion 125 when viewed in plan and a frame member 124a that is positioned on the outer side than the groove portion 125. In addition, the frame member 124 is separated by the groove portion 127 into a frame member 124c that is positioned on the inner side than the groove portion 127 when viewed in plan and the frame member 124a that is positioned on the outer side than the groove portion 127.

Hereinafter, when not discriminated from one another, the connecting layers 111a, 111b, and 111c are referred to as the connecting layer 111. In addition, when not discriminated from one another, the frame members 124a, 124b, and 124c are referred to as the frame member 124.

The frame member 124b, which is positioned on the inner side than the groove portion 125, is coupled to the membrane 122a by four (two pairs of) coupling portions 26. In addition, the frame member 124c, which is positioned on the inner side than the groove portion 127, is coupled to the membrane 122b by four (two pairs of) coupling portions 26.

That is, in the surface stress sensor 101, the connecting layer 111b and the frame member 124b, which are positioned on the inner side than the groove portion 125, are separated from the connecting layer 111a and the frame member 124a, which are positioned on the outer side than the groove portion 125, where the area is large and stress is likely to be induced, respectively. For this reason, even when stress is induced in the connecting layer 111a, it is possible to release the stress to the groove portion 125 and thereby reduce influence of stress induced in the connecting layer 111a on the membrane 122a.

The situation described above also applies to the vicinity of the groove portion 127. That is, in the surface stress sensor 101, the connecting layer 111c and the frame member 124c, which are positioned on the inner side than the groove portion 127, are separated from the connecting layer 111a and the frame member 124a, which are positioned on the outer side than the groove portion 127, where the area is large and stress is likely to be induced, respectively. For this reason, even when stress is induced in the connecting layer 111a, it is possible to release the stress to the groove portion 127 and thereby reduce influence of stress induced in the connecting layer 111a on the membrane 122b.

Further, it is preferable to dispose the groove portions 125 and 127 at positions closer to the membranes 122a and 122b, respectively. The configuration causes the areas of the connecting layers 111b and 111c to be smaller and enables stress that the membranes 122a and 122b receive from the connecting layers 111b and 111c to be made smaller. Therefore, disposing the groove portions 125 and 127 enables stress that the membranes 122a and 122b receive to be reduced and offsets of the surface stress sensor 101 to be reduced compared with a case where the groove portions 125 and 127 are not disposed.

Note that, from a viewpoint of joining property between the detection base member 120 and the support base member 10, it is preferable that the groove portion 125 and 127 be disposed in regions located several tens of μm (for example, 40 μm) or more on the outer side from the outer peripheral portions of the cavity portions 41 and 42, respectively.

As illustrated in FIG. 21, it is more preferable that the groove portion 125 be formed in such a way that distances L1 to L4 between the groove portion 125 and the outer periphery of the cavity portion 41 are equal to one another at any positions between the groove portion 125 and the outer periphery of the cavity portion 41. That is, it is more preferable that the groove portion 125 be formed in such a way that all the distances L1, L2, L3, and L4 illustrated in FIG. 21 are equal to one another. In addition, it is more preferable that the groove portion 127 be formed in such a way that distances L1' to L4' between the groove portion 127 and the outer periphery of the cavity portion 42 are equal to one another at any positions between the groove portion 127 and the outer periphery of the cavity portion 42. That is, it is more preferable that the groove portion 127 be formed in such a way that all the distances L1', L2', L3', and L4' illustrated in FIG. 21 are equal to one another.

The configuration enables stress applied from the periphery of the membrane 122a to be substantially uniform in any direction and also enables stress applied from the periphery of the membrane 122b to be substantially uniform in any direction. For this reason, it is possible to reduce offsets isotropically at respective sensor portions of the surface stress sensor 101.

In addition, it is more preferable that the groove portions 125 and 127 be formed in such a way that the distances L1 to L4 between the groove portion 125 and the outer periphery of the cavity portion 41 and the distances L1' to L4' between the groove portion 127 and the outer periphery of the cavity portion 42 are all equal to one another.

The configuration enables variation in offsets between the sensor portion including the membrane 122a and the sensor portion including the membrane 122b to be reduced.

(Variations)

A plurality of groove portions adjacent to each other may have a portion of the grooves formed in common therebetween. That is, in FIG. 21, a groove positioned on the right side of the groove portion 125 and a groove positioned on the left side of the groove portion 127 may be formed integrally with each other. Since the configuration causes the groove portion 125 and the groove portion 127 to be formed closely to each other, it is possible to arrange the membranes 122a and 122b in proximity to each other and thereby achieve miniaturization of the surface stress sensor 101.

In addition, the planar shapes of the cavity portions 41 and 42 may be not only rectangular but also circular or polygonal. In this case, it is preferable to set the shapes of the groove portions 125 and 127 as shapes corresponding to the planar shapes of the cavity portions 41 and 42, respectively. The configuration enables stress applied from the peripheries of the membranes 122a and 122b to be uniform and thereby enables offsets of the surface stress sensor 101 to be reduced isotropically.

In addition, a portion or all of the connecting layer 111a and the frame member 124a, which are positioned on the outer side than the groove portions 125 and 127, may be removed. It is preferable to have this configuration because the configuration prevents stress from being applied to the membranes 122a and 122b from the outer side than the groove portions 125 and 127.

Further, the connecting layer 111a and the connecting layers 111b and 111c do not have to be respectively separated completely as long as influence of stress from the connecting layer 111a on the connecting layers 111b and 111c is small. For example, on the bottom of the groove portion 125 (the surface of the support base member 10), a link portion (not illustrated) linking the connecting layer 111a and the connecting layer 111b to each other may be thinly formed.

(Method for Manufacturing Surface Stress Sensor)

Using FIGS. 22 and 23 while referring to FIGS. 1 to 12, 20, and 21, a method for manufacturing the surface stress sensor 101 will be described. Note that cross-sectional views in FIGS. 22 and 23 illustrate cross-sections in a vicinity of the cavity portion 41 (a left-side portion of the cavity portion 41) in FIG. 20.

The method for manufacturing the surface stress sensor 101 includes a stacked body forming step, a first ion implantation step, a second ion implantation step, a heat treatment step, a groove portion forming step, a wiring layer forming step, and a removal step.

(Stacked Body Forming Step)

Figure 22A:
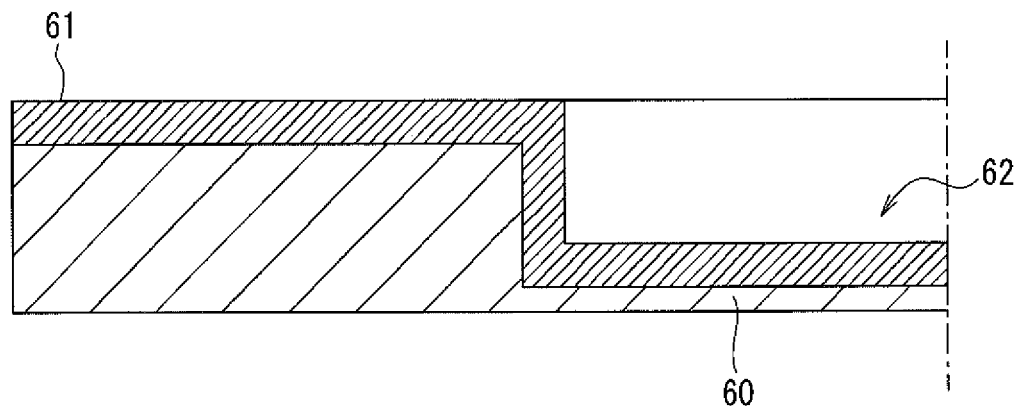
FIGS. 22A and 22B are diagrams illustrative of an example of a stacked body forming step of the surface stress sensor according to the third embodiment of the present invention.

In the stacked body forming step, first, a plurality of recessed portions 62 (trenches) are formed on one face of a first silicon substrate 60 that serves as a material of the support base member 10, using lithography and an etching technology, as illustrated in FIG. 22A. Note that, in FIG. 22A, only a recessed portion 62 that serve as the cavity portion 41 later is illustrated.

Next, thermal oxidation is performed on the first silicon substrate 60, on which the plurality of recessed portions 62 are formed, and a thermally oxidized film 61 is thereby formed on at least the face of the first silicon substrate 60 on which the recessed portions 62 are formed (a recessed portion 62-formed face).

Figure 22B:
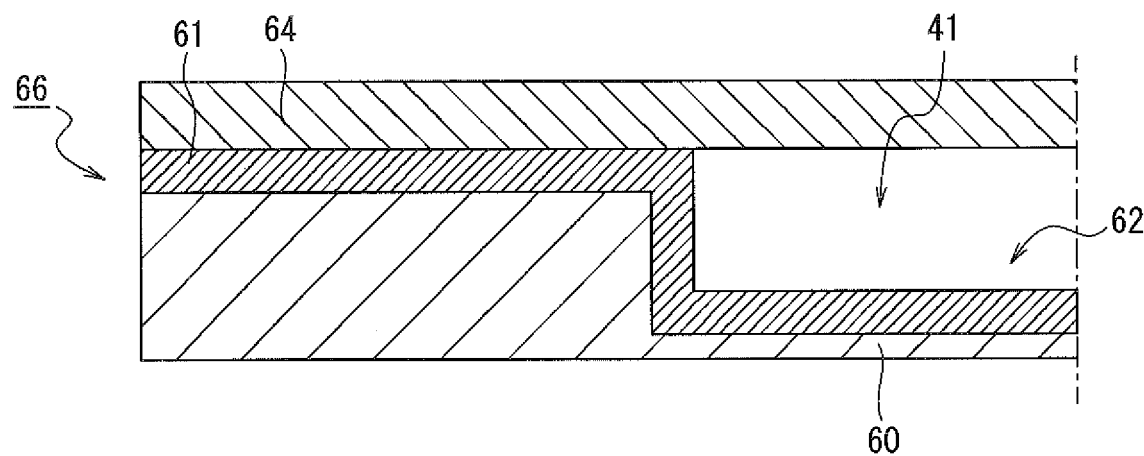

Next, as illustrated in FIG. 22B, a second silicon substrate 64 that serves as a material of the detection base member 120 is stuck to the first silicon substrate 60, on the recessed portion 62-formed surface of which the thermally oxidized film 61 is formed, using one of various types of joining technology, such as adhesion. On this occasion, the second silicon substrate 64 is stuck to the first silicon substrate 60 by arranging the second silicon substrate 64 in such a way that the second silicon substrate 64 covers the plurality of recessed portions 62. With this step, a stacked body 66 (cavity wafer) is formed.

As described above, by performing the stacked body forming step, the cavity portion 41 the top, bottom, left, and right sides of which are enclosed by the second silicon substrate 64 and the thermally oxidized film 61, which is formed on the first silicon substrate 60, is formed at a predetermined position in the stacked body 66. Note that the not-illustrated cavity portion 42 is formed at the same time.

Consequently, in the stacked body forming step, the plurality of recessed portions 62, which serve as the cavity portions 41 and 42, are formed on one face of the first silicon substrate 60, which serves as the support base member 10, and the thermally oxidized film 61 is formed on at least one face of the support base member 10 on which the recessed portions 62 are formed. Subsequently, the second silicon substrate 64, which serves as the detection base member 120, is stuck to the support base member 10 in such a way as to cover the plurality of recessed portions 62. With this step, the cavity portions 41 and 42 are disposed between the first silicon substrate 60 and the second silicon substrate 64, and the stacked body 66, in which the thermally oxidized film 61 is disposed between the support base member 10 and the detection base member 120 at the outer peripheries of the cavity portions 41 and 42, is formed.

Note that, by thermally oxidizing the whole body of the first silicon substrate 60, the thermally oxidized film 61 may be formed on all of the front face, the reverse face, and the side faces (the upper face, the lower face, and the left face in FIG. 22) of the first silicon substrate 60. In this case, by performing separation into individual pieces, using a dicing blade in the last step of the manufacturing process, the surface stress sensors 101 that have the connecting layers 111 formed on both faces (the upper face and the lower face in FIG. 20) of the support base members 10 can be obtained.

(First Ion Implantation Step)

Since the first ion implantation step is performed in the same procedure as that of the first embodiment described above, a description thereof will be omitted.

Consequently, in the first ion implantation step, first ions are implanted into selected partial regions (flexible resistor regions 70) on the outer side than preset regions including the center of the detection base member 120 within the face of the detection base member 120 on the opposite side to the face thereof facing the support base member 10.

(Second Ion Implantation Step)

Since the second ion implantation step is performed in the same procedure as that of the first embodiment described above, a description thereof will be omitted.

Figure 23A:
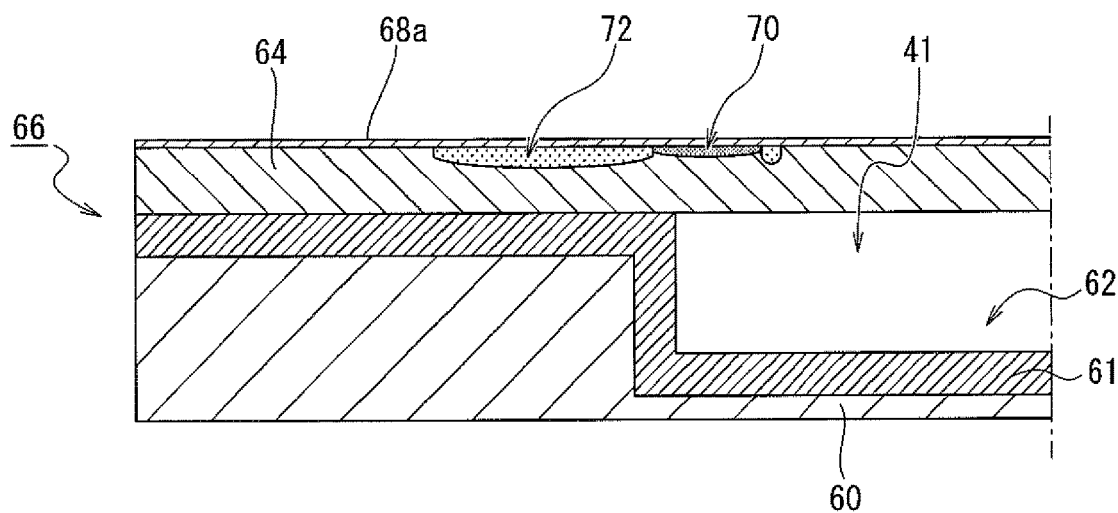
FIGS. 23A and 23B are diagrams illustrative of an example of a first ion implantation step and a second ion implantation step of the surface stress sensor according to the third embodiment of the present invention.

Consequently, in the second ion implantation step, second ions are implanted into selected regions of the detection base member 120 on the outer side than the regions (the flexible resistor regions 70) thereof into which the first ions were implanted (FIG. 23A).

(Heat Treatment Step)

Since the heat treatment step is performed in the same procedure as that of the first embodiment described above, a description thereof will be omitted.

Consequently, in the heat treatment step, by performing heat treatment on the stacked body 66 into which the first ions and the second ions were implanted, the flexible resistor regions 70 are formed in the regions into which the first ions were implanted and low resistance regions 72 are also formed in the regions into which the second ions were implanted (FIG. 23A).

(Groove Portion Forming Step)

Figure 23B:
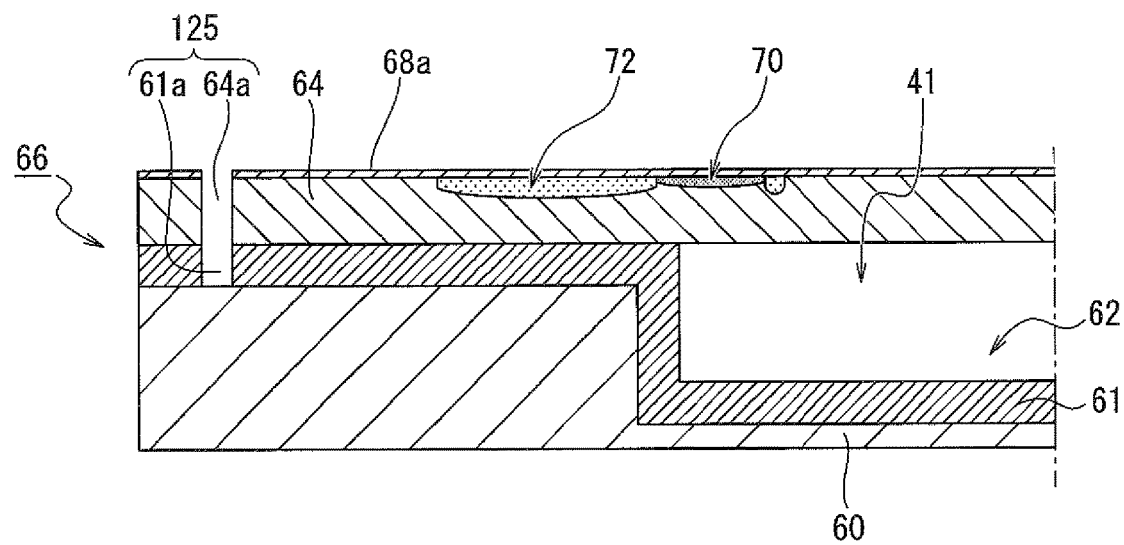

As illustrated in FIG. 23B, in the groove portion forming step, grooves 64a that penetrate the second silicon substrate 64 and have the thermally oxidized film 61 as the bottom faces thereof are formed in regions on the outer side than the regions in which the flexible resistor regions 70 and the low resistance regions 72 were formed on the stacked body 66 after heat treatment. The grooves 64a are formed by performing dry etching, using a pattern of photoresist (not illustrated) as a mask. The grooves 64a are, for example, formed at positions at which the grooves 64a respectively surround the cavity portions 41 and 42, the shapes of which are rectangular when viewed in plan, in shapes formed along the respective ones of the shapes of the cavity portions 41 and 42. Succeedingly, dry etching is performed using the pattern of the grooves 64a as a mask, and, as illustrated in FIG. 23B, grooves 61a that penetrate the thermally oxidized film 61 and have the first silicon substrate 60 as the bottom faces thereof are formed. The groove portion 125 is formed by the groove 64a and the groove 61a. The groove portion 127 is also formed in a similar manner.

Consequently, in the groove portion forming step, the groove portions 125 and 127 are formed by removing portions of the second silicon substrate 64, which serves as the detection base member 120, and the thermally oxidized film 61, which serves as the connecting layer 111, at positions on the detection base member 120 at which the groove portions 125 and 127 respectively surround the cavity portions 41 and 42 and that are located on the outer side than the regions in which the flexible resistor regions 70 and the low resistance regions 72 were formed (FIG. 23B).

(Wiring Layer Forming Step)

Since the wiring layer forming step is performed in the same procedure as that of the first embodiment described above, a description thereof will be omitted.

Consequently, in the wiring layer forming step, wiring layers 82 that are electrically connected to the flexible resistors 50 are formed.

(Removal Step)

Since the removal step is performed in the same procedure as that of the first embodiment described above, a description thereof will be omitted.

Therefore, in the removal step, by removing regions that are regions surrounding the preset regions including the center of the detection base member 120 and are other than the low resistance regions 72 and the flexible resistor regions 70, the membranes 122a and 122b, the frame member 124 (124a and 124b), the coupling portions 26, and the flexible resistors 50 are formed.

(Operation and Actions)

Operation and actions of the third embodiment includes, in addition to the operation and actions of the first and second embodiments described above, a feature that the groove portions 125 and 127 enable stress originating in the connecting layer 111a, which is positioned on the outer side than the groove portions 125 and 127, not to be transmitted to the membranes 122a and 122b.

It should be noted that the foregoing third embodiment is one example of the present invention, the present invention is not limited to the foregoing third embodiment, and, even when the present invention may be carried out in modes other than the embodiment, depending on designs, various changes may be made to the present invention within a scope not departing from the technical idea of the present invention Advantageous Effects of Third Embodiment The surface stress sensor 101 of the third embodiment enables advantageous effects that will be described below to be attained in addition to the advantageous effects that can be attained by the surface stress sensor 1 of the first embodiment.

(1) In the surface stress sensor 101, the connecting layer 111b and the frame member 124b, which are positioned on the inner side than the groove portion 125, are separated from the connecting layer 111a and the frame member 124a, which are positioned on the outer side than the groove portion 125, where the area is large and stress is likely to be induced, respectively.

As a result of this configuration, even when stress is induced in the connecting layer 111a, it is possible to release the stress to the groove portion 125 and thereby reduce influence of stress induced in the connecting layer 111a on the membrane 122a.

(2) It is preferable that the groove portions 125 and 127 be formed in such a way that distances between the groove portions 125 and 127 and the outer peripheries of the cavity portions 41 and 42 are equal to each other at any positions between the groove portion 125 and the cavity portion 41 and between the groove portion 127 and the cavity portion 42.

As a result of this configuration, it is possible to make stress applied from the periphery of the membrane 122a and stress applied from the periphery of the membrane 122b substantially uniform and thereby reduce offsets of the surface stress sensor 101 isotropically.

(3) A portion of the groove portions 125 and 127 may be formed in common (integrally) therebetween. The configuration enables the membranes 122a and 122b to be arranged in proximity to each other and miniaturization of the surface stress sensor 101 to be thereby achieved.

In addition, the method for manufacturing the surface stress sensor of the third embodiment enables advantageous effects that will be described below to be attained in addition to the advantageous effects that can be attained by the method for manufacturing the surface stress sensor 1 of the first embodiment.

(4) The method for manufacturing the surface stress sensor of the third embodiment includes the stacked body forming step, the first ion implantation step, the second ion implantation step, the heat treatment step, the groove portion forming step, the wiring layer forming step, and the removal step. In the stacked body forming step, by forming the recessed portions 62 on one face of the support base member 10 and, after forming the thermally oxidized film 61 at least on the face of the support base member 10 on which the recessed portions 62 are formed, sticking the detection base member 120 to the support base member 10 in such a way that the detection base member 120 covers the recessed portions 62, the stacked body 66 in which the cavity portions 40 are disposed between the support base member 10 and the detection base member 120 and the thermally oxidized film 61 is disposed between the support base member 10 and the detection base member 120 at the outer peripheries of the cavity portions 41 and 42 is formed. In the first ion implantation step, the first ions are implanted into selected partial regions on the outer side than preset regions including the center of the detection base member 120 within the face of the detection base member 120 on the opposite side to the face thereof facing the support base member 10. In the second ion implantation step, the second ions are implanted into selected regions of the detection base member 120 on the outer side than the regions thereof into which the first ions were implanted. In the heat treatment step, by performing heat treatment on the stacked body 66 into which the first ions and the second ions were implanted, the flexible resistor regions 70 are formed in the regions into which the first ions were implanted and the low resistance regions 72 are also formed in the regions into which the second ions were implanted. In the groove portion forming step, the groove portions 125 and 127 are formed by removing portions of the detection base member 120 and the thermally oxidized film 61 in regions of the detection base member 120 on the outer side than the regions in which the flexible resistor regions 70 and the low resistance regions 72, in which the flexible resistors 50*a* to 50*d* are to be formed, were formed. In the wiring layer forming step, the wiring layers that are electrically connected to the flexible resistors are formed. In the removal step, by removing regions that are regions surrounding the preset regions including the center of the detection base member 120 and are other than the low resistance regions 72 and the flexible resistor regions 70, the membranes 122*a* and 122*b*, the frame member 124 (124*a*, 124*b*, and 124*c*), the coupling portions 26, and the flexible resistors 50 are formed.

For this reason, in addition to the advantageous effects of the surface stress sensor 1 that can be attained by the method for manufacturing the surface stress sensor 1 of the first embodiment, it becomes possible to reduce influence of stress induced in the connecting layer 111 on the membranes 122*a* and 122*b* with simple steps and perform stable sensing with high precision.

Fourth Embodiment

Hereinafter, a fourth embodiment of the present invention will be described with reference to the drawings.
(Configuration)

A surface stress sensor 101 according to the fourth embodiment has a structure in which, as with the third embodiment, a plurality of sensor portions are disposed and groove portions are disposed at the outer peripheries of the sensor portions and, as with the surface stress sensor 1 of the second embodiment, includes a connecting layer 90 on a support base member 10.

Since the configuration of the other constituent components is the same as that of the second embodiment described above, a description thereof will be omitted.
(Method for Manufacturing Surface Stress Sensor)

Using FIGS. 24 to 26 while referring to FIGS. 1 to 19, a method for manufacturing the surface stress sensor 101 will be described. Note that cross-sectional views in FIGS. 24 to 26 correspond to the hole forming step, the cavity portion forming step, and the hole sealing step (FIGS. 17 to 19) in the second embodiment.

The method for manufacturing the surface stress sensor 101 includes a stacked body forming step, a first ion implantation step, a second ion implantation step, a heat treatment step, a hole forming step, a cavity portion forming step, a hole sealing step, a wiring layer forming step, and a removal step.
(Stacked Body Forming Step)

Since, in the stacked body forming step, formation of a stacked body 66 is performed in the same procedure as that of the second embodiment described above (FIG. 16), a description thereof will be omitted.

Consequently, in the stacked body forming step, by stacking a sacrificial layer 92 on the support base member 10 and further stacking a detection base member 120 on the sacrificial layer 92, the stacked body 66 is formed.
(First Ion Implantation Step)

Since, in the first ion implantation step, first ions are implanted in the same procedure as that of the second embodiment described above (FIG. 16), a description thereof will be omitted.

Consequently, in the first ion implantation step, the first ions are implanted into selected partial regions (flexible resistor regions 70) on the outer side than preset regions including the center of the detection base member 120 within the face of the detection base member 120 on the opposite side to the face thereof facing the support base member 10.
(Second Ion Implantation Step)

Since, in the second ion implantation step, second ions are implanted in the same procedure as that of the second embodiment described above (FIG. 16), a description thereof will be omitted.

Consequently, in the second ion implantation step, the second ions are implanted into selected regions of the detection base member 120 on the outer side than the regions (the flexible resistor regions 70) thereof into which the first ions were implanted.
(Heat Treatment Step)

Since, in the heat treatment step, heat treatment is performed in the same procedure as that of the second embodiment described above (FIG. 16), a description thereof will be omitted.

Consequently, in the heat treatment step, by performing heat treatment on the stacked body 66 into which the first ions and the second ions were implanted, the flexible resistor regions 70 are formed in the regions into which the first ions were implanted and low resistance regions 72 are also formed in the regions into which the second ions were implanted.
(Hole Forming Step)

In the hole forming step, by means of a general photolithography technology, a pattern of holes and grooves (not illustrated) is formed on the face on the upper side of a second silicon substrate 64. The pattern of holes is formed in regions of the second silicon substrate 64 corresponding to cavity portion forming regions thereof. The regions of the second silicon substrate 64 corresponding to the cavity portion forming regions thereof are regions of the detection base member 120 adjacent to the regions thereof in which the flexible resistor regions 70 and the low resistance regions 72 were formed. In addition, the pattern of grooves is formed in regions of the second silicon substrate 64 on the outer side than the cavity portion forming regions thereof. The regions of the second silicon substrate 64 on the outer side than the cavity portion forming regions thereof are regions of the detection base member 120 on the outer side than the regions thereof in which the flexible resistor regions 70 and the low resistance regions 72 were formed.

Figure 24:
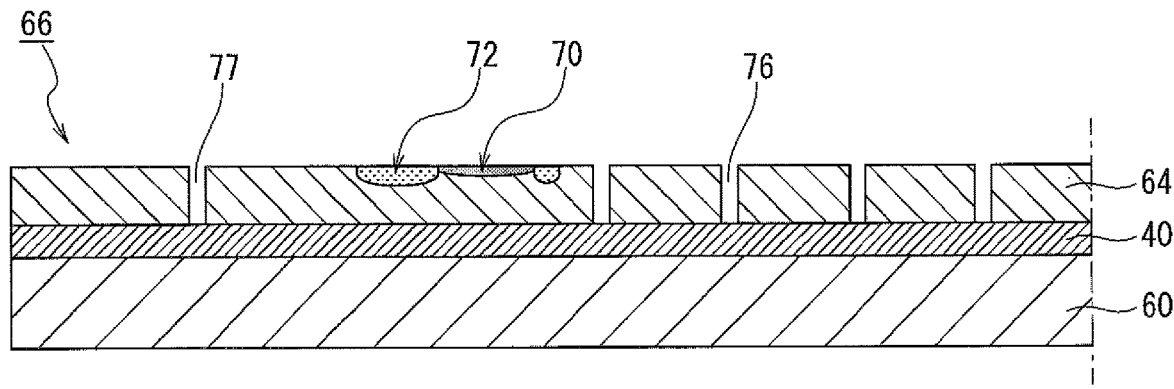
FIG. 24 is a diagram illustrative of another example of a hole forming step of a surface stress sensor according to a fourth embodiment of the present invention.

Next, dry etching is performed using the pattern of holes and grooves as a mask, and, as illustrated in FIG. 24, holes 76 and grooves 77 are formed in the second silicon substrate 64. The holes 76 are formed in the regions of the second silicon substrate 64 corresponding to the cavity portion forming regions thereof. The grooves 77 are formed in the regions of the second silicon substrate 64 on the outer side than the cavity portion forming regions thereof in such a manner as to surround the cavity portion forming regions. The diameter of each hole 76 and the width of each groove 77 are set at, for example, 0.28 μm, and the depth of each hole 76 and each groove 77 is set at such a depth that the hole 76 and the groove 77 reach the sacrificial layer 92.

Consequently, in the hole forming step, the holes 76 and the groove 76 that penetrate to the sacrificial layer 92 are formed in the regions of the detection base member 120 adjacent to the regions thereof in which the flexible resistor regions 70 and the low resistance regions 72 were formed and in the regions of the detection base member 120 on the outer side than the regions thereof in which the flexible resistor regions 70 and the low resistance regions 72 were formed.

(Cavity Portion Forming Step)

Figure 25:
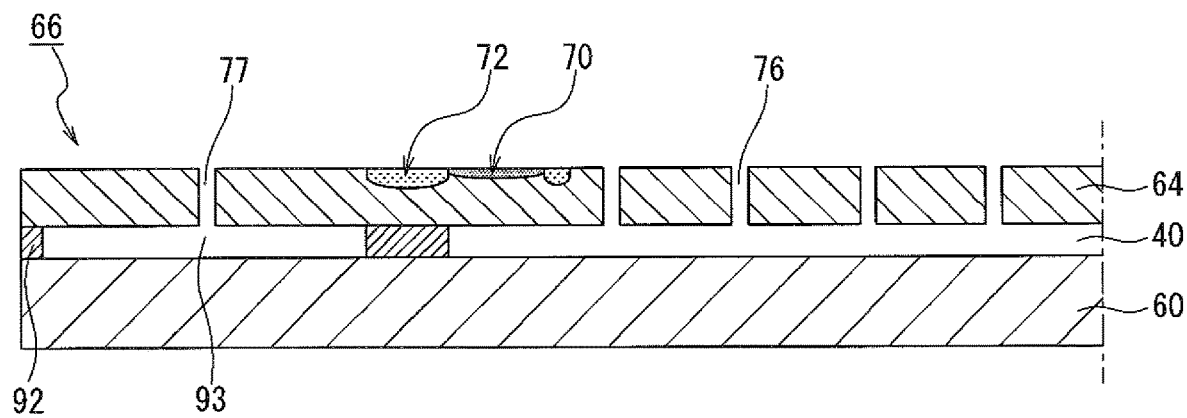
FIG. 25 is a diagram illustrative of another example of a cavity portion forming step of the surface stress sensor according to the fourth embodiment of the present invention.
Figure 26:
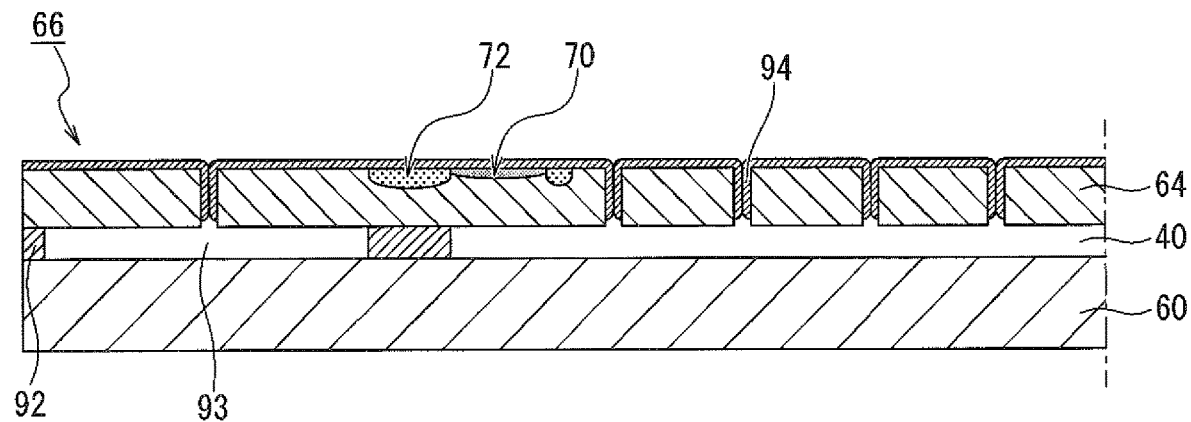
FIG. 26 is a diagram illustrative of another example of a hole sealing step of the surface stress sensor according to the fourth embodiment of the present invention.

In the cavity portion forming step, only the sacrificial layer 92 is selectively etched by causing HF vapor to permeate to the side on which a first silicon substrate 60 is located through the holes 76 and the grooves 77, and, as illustrated in FIG. 25, cavity portions 40 and grooves 93 are formed between the first silicon substrate 60 and the second silicon substrate 64.

Consequently, in the cavity portion forming step, portions of the sacrificial layer 92 arranged between the flexible resistor regions 70 and the support base member 10 are removed by performing etching via the holes 76 and the cavity portions 40 are thereby disposed between the support base member 10 and the detection base member 120. In addition, in the cavity portion forming step, a portion of the sacrificial layer 92 in the region on the outer side than the region in which the flexible resistor regions 70 and the low resistance regions 72 were formed is removed by performing etching via the groove 77 and a groove portion 125 is thereby formed by the groove 77 and the groove 93. Note that, using a groove formed at a not-illustrated position, a groove portion 127 illustrated in FIG. 20 is formed.

(Hole Sealing Step)

Since, in the hole sealing step, sealing of the holes 76 is performed in the same procedure as that of the second embodiment described above, a description thereof will be omitted. In the hole sealing step, as illustrated in FIG. 26, the holes 76 and the grooves 77 are sealed with an oxide film 94.

Consequently, in the hole sealing step, the oxide film 94 is formed on the face of the detection base member 120 on the opposite side to the face thereof facing the support base member 10 and the holes 76 and the grooves 77 are thereby sealed.

(Wiring Layer Forming Step)

Since the wiring layer forming step is performed in the same procedure as that of the first embodiment described above, a description thereof will be omitted.

Consequently, in the wiring layer forming step, wiring layers that are electrically connected to flexible resistors are formed.

(Removal Step)

Since the removal step is performed in the same procedure as that of the first embodiment described above, a description thereof will be omitted.

Therefore, in the removal step, by removing regions that are regions surrounding the preset regions including the center of the detection base member 120 and are other than the low resistance regions 72 and the flexible resistor regions 70, the membranes 122a and 122b, a frame member 124 (124a and 124b), coupling portions 26, and the flexible resistors are formed.

(Operation and Actions)

Since operation and actions of the fourth embodiment are the same as those of the third embodiment described above, descriptions thereof will be omitted.

It should be noted that the foregoing fourth embodiment is one example of the present invention, the present invention is not limited to the foregoing fourth embodiment, and, even when the present invention may be carried out in modes other than the embodiment, depending on designs, various changes may be made to the present invention within a scope not departing from the technical idea of the present invention For example, although, in the hole forming step, a configuration in which the holes 76 are formed in the second silicon substrate 64 and, at the same time, the grooves 77 are formed was described, the grooves 77 may be formed in a different step from the step in which the holes 76 are formed. In this case, the cavity portions 40 and the grooves 93 are formed in different steps. That is, the cavity portions 40 may be formed after the holes 76 have been formed, and, in another step, the grooves 93 may be formed after the grooves 77 have been formed.

Advantageous Effects of Fourth Embodiment

The method for manufacturing the surface stress sensor of the fourth embodiment enables advantageous effects that will be described below to be attained.

(1) The method for manufacturing the surface stress sensor includes the stacked body forming step, the first ion implantation step, the second ion implantation step, the heat treatment step, the hole forming step, the cavity portion forming step, the groove portion forming step, the hole sealing step, the wiring layer forming step, and the removal step. In the stacked body forming step, by stacking the sacrificial layer 92 on the support base member 10 and further stacking the detection base member 120 on the sacrificial layer 92, the stacked body 66 is formed. In the first ion implantation step, the first ions are implanted into selected partial regions on the outer side than preset regions including the center of the detection base member 120 within the face of the detection base member 120 on the opposite side to the face thereof facing the support base member 10. In the second ion implantation step, the second ions are implanted into selected regions of the detection base member 120 on the outer side than the regions thereof into which the first ions were implanted. In the heat treatment step, by performing heat treatment on the stacked body 66 into which the first ions and the second ions were implanted, the flexible resistor regions 70 are formed in the regions into which the first ions were implanted and the low resistance regions 72 are also formed in the regions into which the second ions were implanted. In the hole forming step, the holes 76 that penetrate to the sacrificial layer 92 are formed in a region of the detection base member 120 adjacent to the regions thereof in which the flexible resistor regions 70 and the low resistance regions 72 were formed. In addition, in the hole forming step, the grooves 77 that penetrate to the sacrificial layer 92 and surround the preset regions when viewed in plan are formed in regions on the outer side than the regions in which the flexible resistor regions 70 and the low resistance regions 72 were formed. In the cavity portion forming step, portions of the sacrificial layer 92 arranged between the flexible resistor regions 70 and the support base member 10 are removed by means of etching via the holes 76 and the cavity portions 40 are thereby disposed between the support base member 10 and the detection base member 120. In the groove portion forming step, portions of the sacrificial layer 92 that is exposed from the grooves 77 are removed by means of etching via the grooves 77 and groove portions that penetrate the detection base member 120 (the second silicon substrate 64) and the sacrificial layer 92 are thereby formed. In the hole sealing step, the oxide film 94 is formed on the face of the detection base member 120 on the opposite side to the face thereof facing the support base member 10 and the holes 76 and the grooves 77 are thereby sealed. In the wiring layer forming step, wiring layers 82 that are electrically connected to flexible resistors 50 are formed. In the removal step, by removing regions that are regions surrounding preset membrane setting regions 84 including the center of the detection base member 120 and are other than the low resistance regions 72 and the flexible resistor regions 70, the membranes 122a and 122b, the frame member 124 (124a and 124b), the coupling portions 26, and the flexible resistors 50 are formed.

For this reason, in addition to the advantageous effects of the surface stress sensor 1 that can be attained by the method for manufacturing the surface stress sensor 1 of the second embodiment, it becomes possible to reduce influence of stress induced in the connecting layer 111 on the membranes 122a and 122b with simple steps and perform stable sensing with high precision.

Example

Using an example to be described below while referring to the first embodiment and the second embodiment, a surface stress sensor 1 of the example and a surface stress sensor of a comparative example will be described.

Example

The surface stress sensor 1 of the example has a configuration similar to that described in the first embodiment, that is, a configuration in which a support base member is formed into a rectangular column shape and the support base member 10 exists between a membrane 22 and a package substrate 2 (see FIG. 14).

Comparative Example

The surface stress sensor of the comparative example has a configuration in which support base members are formed into cylindrical shapes and a membrane is supported in mid-air (see FIG. 13).

(Performance Evaluation)

For the surface stress sensor 1 of the example and the surface stress sensor of the comparative example, performance evaluation was respectively conducted by means of simulation by detecting a change in output in a situation in which the package substrates have extended due to an increase in temperature (an increase of 10° C.).

(Evaluation Result)

As a result of detecting changes in outputs in the situation in which the package substrates have extended, a degree of change in the output in the example was approximately one-third of that in the comparative example.

From this result, it was confirmed that the surface stress sensor 1 of the example is capable of reducing stress applied to the membrane due to deformation of the package substrate to approximately one-third compared with that in the surface stress sensor of the comparative example.

Fifth Embodiment

Hereinafter, a fifth embodiment of the present invention will be described with reference to the drawings.

An invention according to the fifth embodiment is, for example, a semiconductor device having a MEMS structure including a movable portion and relates to a surface stress sensor the movable portion of which is formed by releasing pressure from a cavity portion formed on a base member and a method for manufacturing the surface stress sensor.

In devices having a MEMS structure, which is a structure the practical application of which to various types of sensors has been advancing, there is a possibility that, at the time of etching processing, thickness of a membrane base member thins and the membrane base member ruptures. Note that the membrane base member is a base member that forms a layer arranged above a cavity forming a cavity portion and the layer arranged above a cavity is a layer in which a movable portion is formed.

On the other hand, a method in which, by forming a notch on a membrane base member in advance, a rupture of the membrane base member is prevented has been disclosed. However, when the method of forming a notch on a membrane base member in advance is applied to a method of forming a movable portion through patterning the membrane base member by means of a single etching step, preventing a rupture of the membrane base member is difficult.

In the fifth embodiment, a surface stress sensor that is capable of preventing a rupture of a membrane base member that may occur at the time of processing entailing pressure release and a method for manufacturing the surface stress sensor will be described.

(Configuration)

Using FIGS. 27 to 30 while referring to FIGS. 1 to 5, a configuration of the fifth embodiment will be described.

A surface stress sensor 201 illustrated in FIGS. 27 to 30 is, for example, an element used as a surface stress sensor that detects taste or smell for a gas or a liquid. In addition, the surface stress sensor 201, although, as with the surface stress sensor 1 of the first embodiment, including a package substrate 2, a connecting portion 4, and a support base member 10, differs from the surface stress sensor 1 of the first embodiment in including a membrane base member 220 in place of the detection base member 20.

Hereinafter, the membrane base member 220 will be described in detail. Note that descriptions of the package substrate 2, the connecting portion 4, and the support base member 10 will be omitted.

(Membrane Base Member)

The membrane base member 220 is stacked on one face (in FIG. 28, the face on the upper side) of the support base member 10 and is formed by a membrane 22, a frame member 24, coupling portions 26, and peripheral membrane portions 28 integrated with one another. In addition, on one face of the membrane 22, a receptor 30 is disposed. Since the membrane 22, the frame member 24, and the coupling portions 26 and the receptor 30 have similar configurations to those of the membrane 22, the frame member 24, and the coupling portions 26 and the receptor 30 in the detection base member 20 of the first embodiment, respectively, descriptions thereof will be omitted.

Note that the configuration that will be described in the fifth embodiment and includes the membrane base member 220 can also be applied to a configuration in which the receptor 30 is not disposed on the membrane 22. That is, the configuration that will be described in the fifth embodiment can also be applied to, in addition to a surface stress sensor, a hollow structural element that is a device of a MEMS structure including a membrane base member arranged above a cavity forming a cavity portion.

In the fifth embodiment, a case where silicon is used as a material of which the membrane base member 220 is formed will be described as an example.

In addition, as a material of which the membrane base member 220 is formed, a material that causes a difference between a linear expansion coefficient of the support base member 10 and a linear expansion coefficient of the membrane base member 220 to be $1.2 \times 10^{-5}/°$ C. or less is used.

In the fifth embodiment, a case where the same material is used as a material of which the membrane base member 220 is formed and a material of which the support base member 10 is formed will be described.

Hereinafter, the peripheral membrane portions 28 will be described in detail.

(Peripheral Membrane Portion)

The peripheral membrane portions 28 are coupled to the frame member 24 and, when viewed from the thickness direction of the membrane 22, surrounded by the membrane 22, the frame member 24, and the coupling portions 26.

Figure 27:
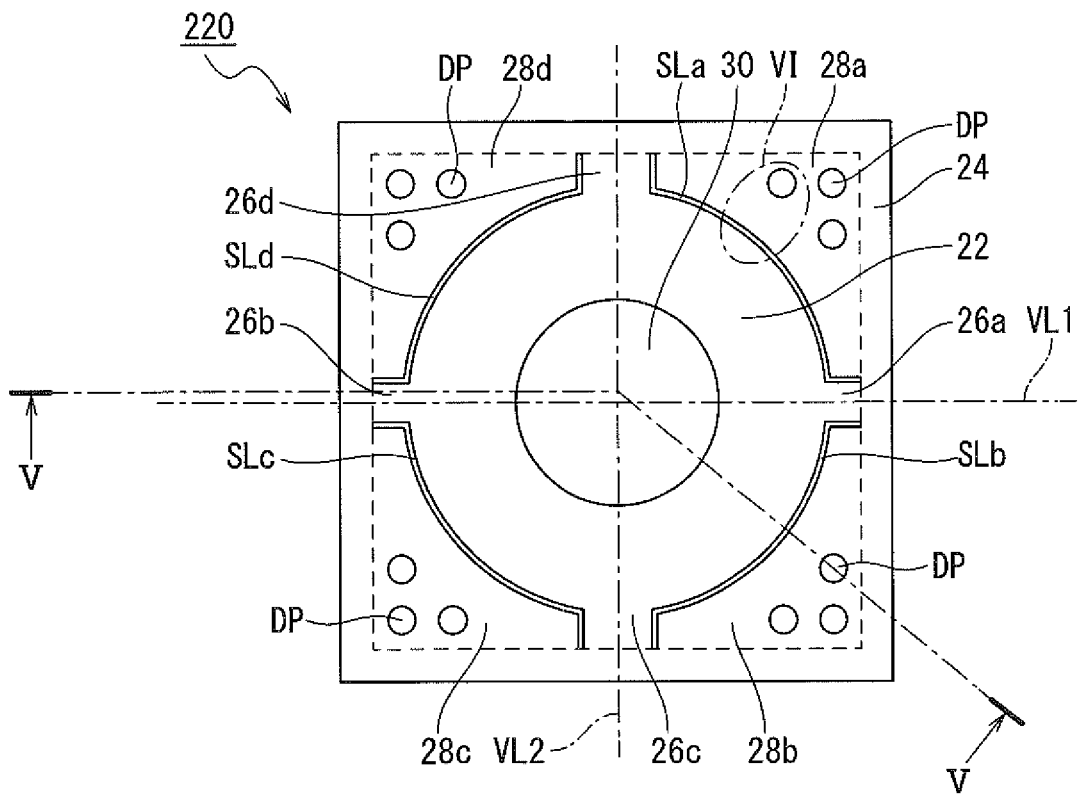
FIG. 27 is a plan view illustrative of a configuration a surface stress sensor according to a fifth embodiment of the present invention.
Figure 28:
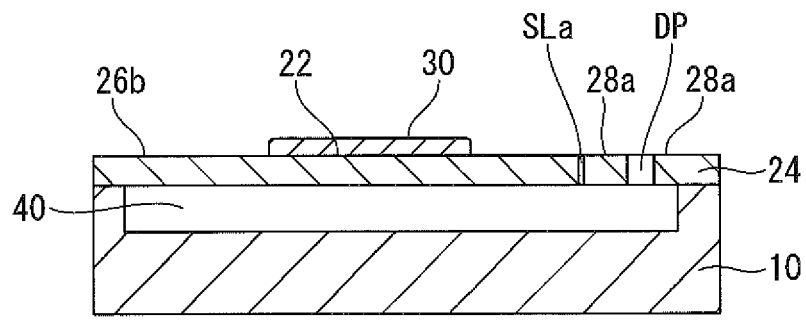
FIG. 28 is a cross-sectional view taken along the line V-V in FIG. 27.
Figure 30:
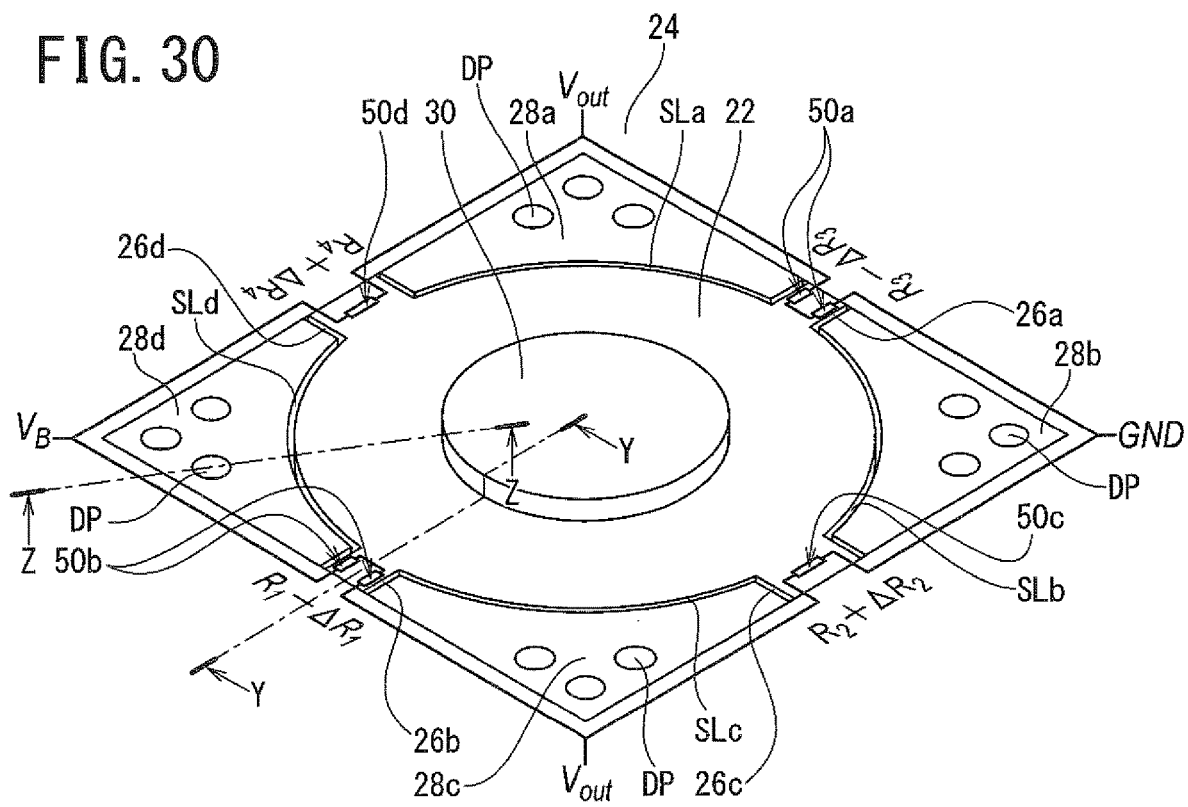
FIG. 30 is a perspective view of a membrane base member according to the fifth embodiment.

As illustrated in FIGS. 27 and 30, in the fifth embodiment, a case where the membrane base member 220 includes four peripheral membrane portions 28a to 28d will be described as an example.

The peripheral membrane portion 28a is surrounded by the membrane 22, the frame member 24, the coupling portion 26a, and the coupling portion 26d. The peripheral membrane portion 28b is surrounded by the membrane 22, the frame member 24, the coupling portion 26a, and the coupling portion 26c. The peripheral membrane portion 28c is surrounded by the membrane 22, the frame member 24, the coupling portion 26b, and the coupling portion 26c. The peripheral membrane portion 28d is surrounded by the membrane 22, the frame member 24, the coupling portion 26b, and the coupling portion 26d.

Between the membrane 22, four coupling portions 26a to 26d, and four peripheral membrane portions 28a to 28d and the support base member 10, a cavity portion 40 is disposed. Note that, in FIG. 27, a position at which the cavity portion 40 is formed when viewed from the upper side of the membrane base member 220 of the surface stress sensor 201 is illustrated by a dashed line.

Note that, when the surface stress sensor 201 is used in a solution, the cavity portion 40 may be filled with the solution.

The cavity portion 40 functions as a space that, when the membrane 22 is bent toward the side on which the support base member 10 is located during processing of the membrane base member 220, prevents the membrane 22 from clinging to the support base member 10.

In the respective peripheral membrane portions 28a to 28d, penetrating portions DP that penetrate to the cavity portion 40 are formed.

In the fifth embodiment, a case where three penetrating portions DP are formed in each peripheral membrane portion 28 will be described as an example. The three penetrating portions DP are arranged at positions at which the central points of the respective penetrating portions DP coincide with the vertices of a right triangle.

In the fifth embodiment, a case where the opening shape of each penetrating portion DP is formed into a round shape will be described as an example.

In addition, when viewed from the thickness direction of the membrane 22, slits SL are formed between the membrane 22 and coupling portions 26 and the peripheral membrane portions 28.

The slits SL communicate the face (in FIG. 27, the face on the upper side) of the membrane base member 220 on the opposite side to the face thereof facing the support base member 10 with the cavity portion 40.

In the fifth embodiment, the membrane base member 220 includes four peripheral membrane portions 28a to 28d. For this reason, in the fifth embodiment, a case where four slits SLa to SLd are formed in the membrane base member 220 will be described.

The slit SLa is formed between the membrane 22, coupling portion 26a, and coupling portions 26d and the peripheral membrane portion 28a. The slit SLb is formed between the membrane 22, coupling portion 26a, and coupling portions 26c and the peripheral membrane portion 28b. The slit SLc is formed between the membrane 22, coupling portion 26b, and coupling portions 26c and the peripheral membrane portion 28c. The slit SLd is formed between the membrane 22, coupling portion 26b, and coupling portions 26d and the peripheral membrane portion 28d.

Figure 29:
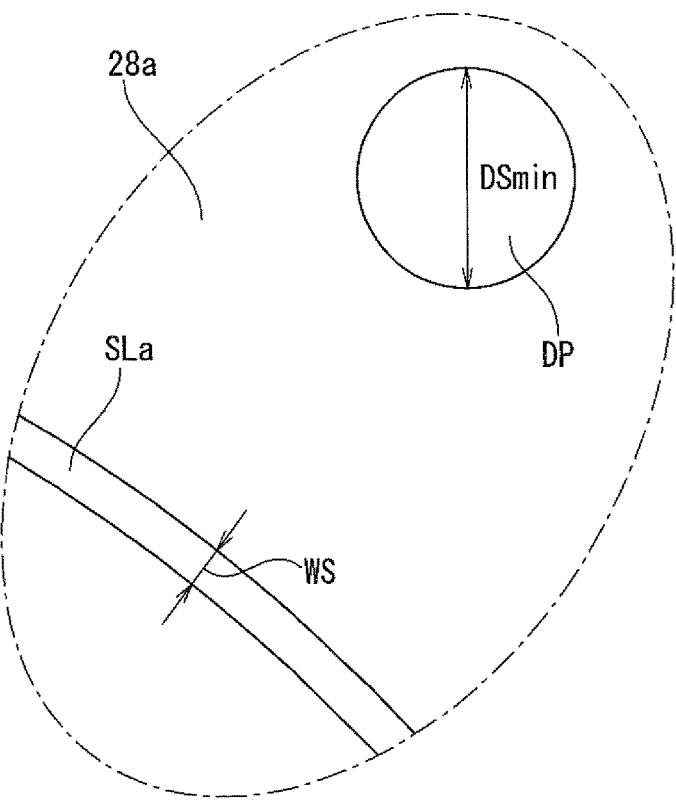
FIG. 29 is an enlarged view including a range encircled by the circle VI in FIG. 27.

As illustrated in FIG. 29, width WS of each slit SL when viewed from the thickness direction of the membrane 22 is narrower than a minimum distance DSmin between inner wall faces of a penetrating portion DP facing each other with the center thereof interposed therebetween. Note that the minimum distance DSmin is the minimum (shortest) distance among distances between inner wall faces of a penetrating portion DP facing each other with the center thereof interposed therebetween.

In the fifth embodiment, as an example, the width WS of each slit SL is set at a value within a range of 0.5 µm or more and 5 µm or less.

Similarly, in the fifth embodiment, as an example, the minimum distance DSmin is set at a value within a range of 1 µm or more and 10 µm or less.

(Method for Manufacturing Surface Stress Sensor)

Using FIGS. 31 to 33 while referring to FIGS. 27 to 30 and 6 to 12, a method for manufacturing the surface stress sensor 201 will be described. Note that FIG. 32 corresponds to the position of a cross-section taken along the line Z-Z in FIG. 30 and FIGS. 6 to 12 are cross-sectional views corresponding to the position of a cross-section taken along the line Y-Y in FIG. 30.

The method for manufacturing the surface stress sensor 201 includes a stacked body forming step, a region setting step, a first ion implantation step, a second ion implantation step, a heat treatment step, a wiring layer forming step, and an etching step. The method for manufacturing a surface stress sensor described in the fifth embodiment differs from the method for manufacturing a surface stress sensor of the first embodiment in including the region setting step and including the etching step in place of the removal step of the first embodiment.

(Stacked Body Forming Step)

Since the stacked body forming step is performed in the same procedure as the stacked body forming step of the first embodiment illustrated in FIGS. 6A and 6B, a description thereof will be omitted.

By performing the stacked body forming step as described above, the cavity portion 40 the top, bottom, left, and right sides of which are enclosed by silicon (a first silicon substrate 60 and a second silicon substrate 64) is formed at a predetermined position in a stacked body 66. Note that, in the stacked body forming step, the second silicon substrate 64 is stuck to the first silicon substrate 60, in general, in an atmospheric pressure environment or a reduced-pressure environment.

Consequently, in the stacked body forming step, by forming a recessed portion 62 on one face of the support base member 10 and further sticking the second silicon substrate, which serves as the membrane base member 220, to the support base member 10 in such a way that the second silicon substrate covers the recessed portion 62, the stacked body 66 in which the cavity portion 40 is disposed between the support base member 10 and the membrane base member 220 is formed.

(Region Setting Step)

Figure 31:
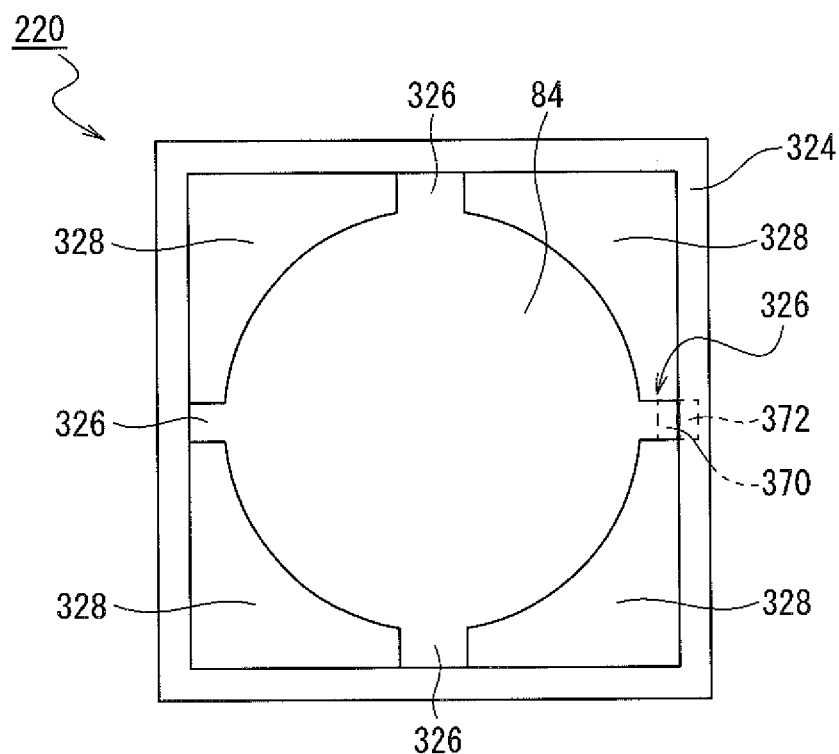
FIG. 31 is a diagram illustrative of an example of a region setting step of the surface stress sensor according to the fifth embodiment of the present invention.

In the region setting step, to the face of the membrane base member 220 on the opposite side to the face thereof facing the support base member 10, a membrane setting region 84, a frame member forming region 324, coupling portion forming regions 326, and peripheral membrane portion forming regions 328 are set, as illustrated in FIG. 31.

The membrane setting region 84 is, within the membrane base member 220, a region in which the membrane 22 is formed. The frame member forming region 324 is, within the membrane base member 220, a region in which the frame member 24 is formed. The coupling portion forming regions 326 are, within the membrane base member 220, regions in which the coupling portions 26 are formed. The peripheral membrane portion forming regions 328 are, within the membrane base member 220, regions that are surrounded by the membrane setting region 84, the frame member forming region 324, and the coupling portion forming regions 326 when viewed from the stacking direction and in which the peripheral membrane portions 28 are formed. Note that the "stacking direction" is a direction in which the support base member 10 and the membrane base member 220 are stacked and the same direction as the thickness direction of the membrane 22.

Further, in the region setting step, flexible resistor forming regions 370 are set at least in the coupling portion forming regions 326 and low resistance forming regions 372 are set in neighboring portions of the flexible resistor forming regions 370 (for example, the frame member forming region 324 and the coupling portion forming regions 326), as illustrated in FIG. 31.

The flexible resistor forming regions 370 are regions into which first ions are implanted in the first ion implantation step. The low resistance forming regions 372 are regions that are located on the outer side than the flexible resistor forming regions 370 and are regions into which second ions are implanted in the second ion implantation step.

(First Ion Implantation Step)

Since the first ion implantation step is performed in the same procedure as that of the first ion implantation step of the first embodiment illustrated in FIG. 7, a description thereof will be omitted. In the first ion implantation step, as illustrated in FIG. 31, the first ions are selectively implanted into the flexible resistor forming regions 370.

Consequently, in the first ion implantation step, the first ions are implanted into the flexible resistor forming regions 370 within the face of the membrane base member 220 on the opposite side to the face thereof facing the support base member 10.

(Second Ion Implantation Step)

Since the second ion implantation step is performed in the same procedure as that of the second ion implantation step of the first embodiment illustrated in FIG. 7, a description thereof will be omitted. In the second ion implantation step, as illustrated in FIG. 31, the second ions are implanted into the low resistance forming regions 372.

Consequently, in the second ion implantation step, the second ions are implanted into the low resistance forming regions 372 on the outer side than the flexible resistor forming regions 370.

(Heat Treatment Step)

Since the heat treatment step is performed in the same procedure as that of the heat treatment step of the first embodiment described above, a description thereof will be omitted.

Consequently, in the heat treatment step, by performing heat treatment on the stacked body 66 into which the first ions and the second ions were implanted, flexible resistor regions 70 are formed in the flexible resistor forming regions 370 and low resistance regions 72 are also formed in the low resistance forming regions 372.

(Wiring Layer Forming Step)

Since the wiring layer forming step is performed in the same procedure as that of the wiring layer forming step of the first embodiment illustrated in FIGS. 8A, 8B, 9A, 9B, 10A, 10B, 11A, 11B, and 12, a description thereof will be omitted.

Consequently, in the wiring layer forming step, wiring layers 82 (illustrated in FIG. 12) that are electrically connected to flexible resistors 50 are formed.

(Etching Step)

Figure 32:
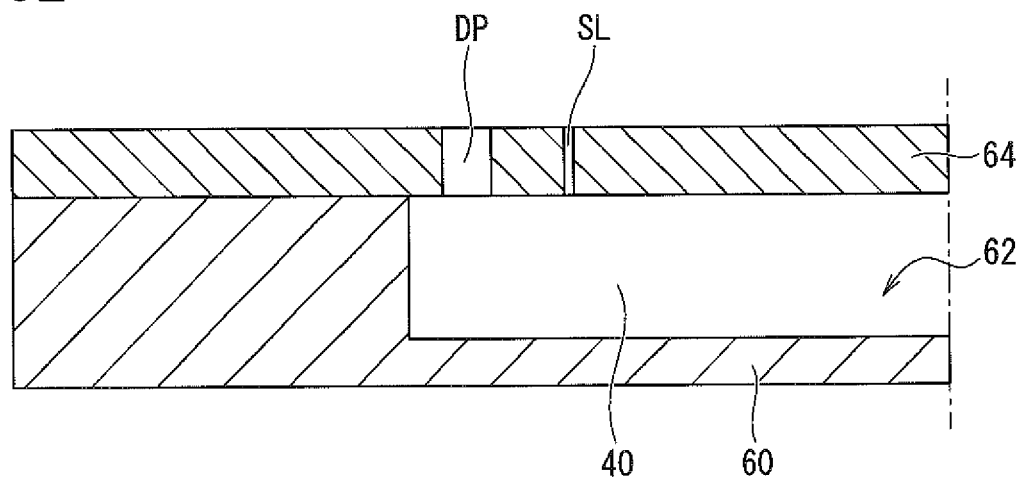
FIG. 32 is a diagram illustrative of an example of an etching step of the surface stress sensor according to the fifth embodiment of the present invention.

In the etching step, as illustrated in FIG. 32, by performing etching (dry etching) in such a way that the second silicon substrate 64, which serves as the membrane base member 220, is penetrated from the face of the second silicon substrate 64 on the opposite side to the face thereof facing the cavity portion 40 to the cavity portion 40 in the peripheral membrane portion forming regions 328, the penetrating portions DP are formed.

In addition to the above, in the etching step, as illustrated in FIG. 32, etching with a lower etching rate than in the etching of the penetrating portions DP is performed in such a way that the second silicon substrate 64, which serves as the membrane base member 220, is penetrated from the face of the second silicon substrate 64 on the opposite side to the face thereof facing the cavity portion 40 to the cavity portion 40 in the peripheral membrane portion forming regions 328. With this etching, the slits SL are formed. In addition, the slits SL are formed between the membrane setting region 84 and coupling portion forming regions 326 and the peripheral membrane portion forming regions 328.

Note that, in FIG. 32, illustration of portions other than the cavity portion 40, the first silicon substrate 60, the recessed portion 62, the second silicon substrate 64, the penetrating portions DP, and the slits SL is omitted for the purpose of illustration.

In the fifth embodiment, a case where, in the etching step, etching is performed in such a way that the width WS of each slits SL is narrower than the minimum distance DSmin between inner wall faces of a penetrating portion DP facing each other with the center thereof interposed therebetween will be described as an example. For this purpose, in the fifth embodiment, an etching rate in the etching for forming the slits SL is set lower than an etching rate in the etching for forming the penetrating portions DP.

The penetrating portions DP and the slits SL are formed using photolithography and an etching technology.

As a configuration of a photomask for forming the slits SL and the penetrating portions DP, a configuration including such a pattern that the width WS of each slit SL is narrower than the minimum distance DSmin is set.

In addition, the etching for forming the penetrating portions DP and the etching for forming the slits SL are performed at the same time.

In the fifth embodiment, a case where, in the etching step, the opening shape of each penetrating portion DP is formed into a round shape will be described as an example.

Therefore, in the etching step, by forming the slits SL, the membrane 22 is formed in the membrane setting region 84 and the frame member 24 is formed in the frame member forming region 324. In addition to the above, by forming the slits SL, the coupling portions 26 are formed in the coupling portion forming regions 326 and the peripheral membrane portions 28 are formed in the peripheral membrane portion forming regions 328.

(Operation and Actions)

Using FIG. 33 while referring to FIGS. 27 to 32, operation and actions of the fifth embodiment will be described.

When the surface stress sensor 201 is used as, for example, a smell sensor, the receptor 30 is arranged in an atmosphere of a gas containing smell components and the smell components contained by the gas are caused to adsorb to the receptor 30.

When molecules of a gas adsorb to the receptor 30 and a strain is induced in the receptor 30, surface stress is applied to the membrane 22 and the membrane 22 is, for example, bent in the thickness direction with a displacement range of 5 μm or less.

The frame member 24 is formed into a square well curb shape and surrounds the membrane 22, and each of the coupling portions 26 couples the membrane 22 and the frame member 24 at both ends thereof. For this reason, in each coupling portion 26, the end coupled to the membrane 22 is formed into a free end and the end coupled to the frame member 24 is formed into a fixed end.

Therefore, when the membrane 22 is bent, bending corresponding to a strain induced in the receptor 30 occurs in the coupling portions 26. The resistance values that the flexible resistors 50 have change according to the bending having occurred in the coupling portions 26, and change in voltage corresponding to the changes in the resistance values are output from PADs 86 and used in data detection in a computer or the like.

At the time of manufacturing the surface stress sensor 201, on the second silicon substrate 64 of the stacked body 66 in which the cavity portion 40 is disposed, etching processing in which, by cutting out and thereby opening a portion of the second silicon substrate 64, internal pressure in the cavity portion 40 is released (etching processing entailing pressure release) is performed.

Figure 33A:
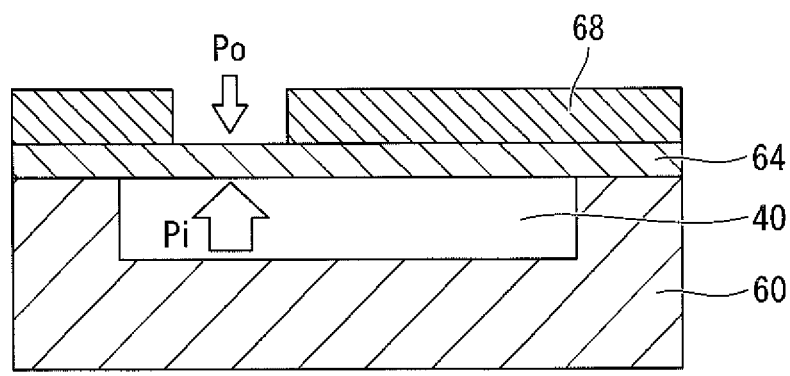
FIGS. 33A, 33B, and 33C are diagrams illustrative of operation and actions of the surface stress sensor according to the fifth embodiment of the present invention.

When only the slits SL are formed in the membrane base member 220, the etching processing is, for example, performed at positions at which the slits SL are to be formed (slit forming positions) on the second silicon substrate 64 with the internal pressure in the cavity portion 40 retained, as illustrated in FIG. 33A. The etching step (dry etching) is, in most cases, performed in a reduced-pressure environment. On the other hand, the stacked body forming step of sticking the second silicon substrate 64 to the first silicon substrate 60 is, in general, performed in an atmospheric pressure environment or a reduced-pressure environment. For this reason, when the stacked body forming step is performed in an atmospheric pressure environment, internal pressure Pi in the cavity portion 40 is higher than external pressure Po exerted on the stacked body (Po<Pi), as illustrated in FIG. 33A.

Figure 33B:
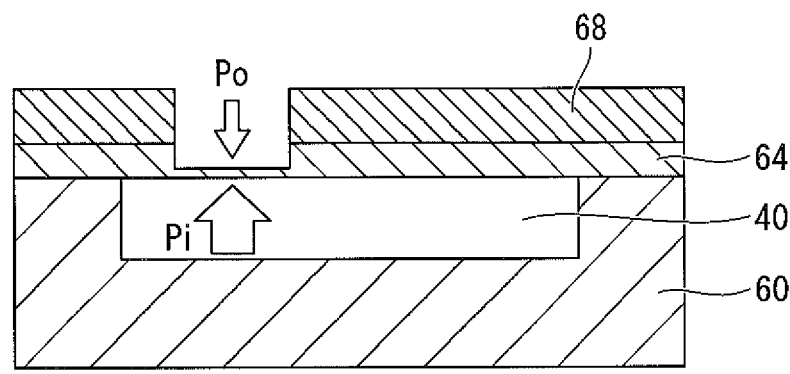
Figure 33C:
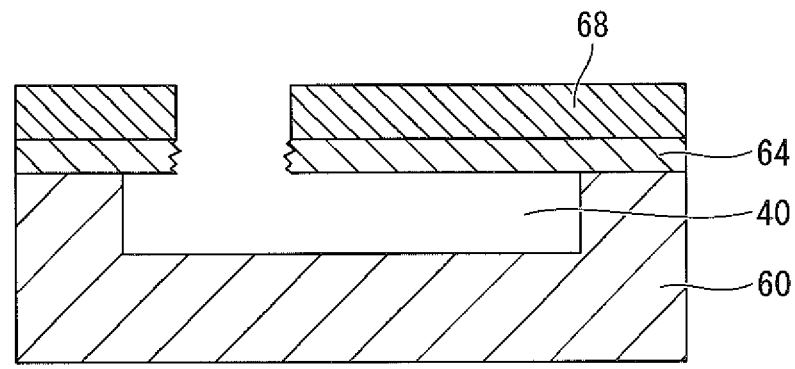

Therefore, when, as illustrated in FIG. 33B, the etching processing has progressed and the thickness of the membrane at a slit forming position has thinned, the cavity portion 40, which is in an atmospheric pressure atmosphere, is opened at a stroke by a pressure difference between the external pressure Po and the internal pressure Pi, as illustrated in FIG. 33C. Since the pressure release ruptures the second silicon substrate 64, there is a possibility that the shapes of the slits SL are formed into unexpected abnormal shapes, the membrane 22 and the coupling portions 26 are inhibited from being bent, and changes in resistance values that the flexible resistors 50 have become abnormal values. Note that such a rupture of the second silicon substrate 64 occurs when the stacked body forming step and the etching processing are performed in different pressure environments. For this reason, even when, for example, both the stacked body forming step and the etching step are performed in reduced-pressure environments, a rupture of the second silicon substrate 64 occurs when there is a difference between the reduced pressure in the stacked body forming step and the pressure in the etching step.

On the other hand, in the fifth embodiment, the width WS of each of the slits SL, which are formed for enabling the membrane 22 and the coupling portions 26 to be bent, is set narrower than the minimum distance DSmin between inner wall faces of a penetrating portion DP facing each other with the center thereof interposed therebetween.

Because of this configuration, at the time of etching processing entailing pressure release, penetration at portions of the membrane base member 220 at which the penetrating portions DP are formed reaches the cavity portion 40 before penetration at portions of the membrane base member 220 at which the slits SL are formed.

For this reason, a pressure difference between the inside and outside of the cavity portion 40 (a pressure difference between the external pressure Po and the internal pressure Pi) is eliminated, and it becomes possible to prevent a rupture of the membrane base member 220, which occurs at the time of processing entailing pressure release, from occurring.

That is, in the case of the fifth embodiment, because of microloading effect in dry etching, the etching of the penetrating portions DP the minimum distance DSmin of which is larger than the width WS progresses faster than the etching of the slits SL.

Since, when the penetrating portions DP are formed before the slits SL and the cavity portion 40 communicates with the outside air, the external pressure Po and the internal pressure Pi are brought to an equilibrium state, it becomes possible to avoid a rupture due to a pressure difference even when etching progresses at portions of the membrane base member 220 at which the slits SL are formed.

For this reason, a rupture caused by a pressure difference between the external pressure Po and the internal pressure Pi occurs only at the penetrating portions DP and does not occur at the slits SL. Because of this effect, positions within the second silicon substrate 64 at which unexpected abnormal shapes are formed by ruptures are limited to only the penetrating portions DP. Because of this limitation, it becomes possible to improve processing precision at the time of performing etching processing of the slits SL.

In addition, the penetrating portions DP are formed in portions that are not affected by deformation (bending) of the membrane 22 and the coupling portions 26.

For this reason, even when portions of the membrane base member 220 at which the penetrating portions DP are formed rupture and the shapes of the penetrating portions DP are formed into unexpected abnormal shapes, there is no influence on bending of the membrane 22 and the coupling portions 26.

Therefore, since the configuration of the fifth embodiment enables the slits SL to be stably shaped into desirable shapes and bending of the membrane 22 and the coupling portions 26 to be prevented from being inhibited, it becomes possible to suppress measurement precision of the surface stress sensor 201 from deteriorating.

It should be noted that the foregoing fifth embodiment is one example of the present invention, the present invention is not limited to the foregoing fifth embodiment, and, even when the present invention may be carried out in modes other than the embodiment, depending on designs, various changes may be made to the present invention within a scope not departing from the technical idea of the present invention

Advantageous Effects of Fifth Embodiment

The surface stress sensor 201 of the fifth embodiment enables advantageous effects that will be described below to be attained.

(1) The penetrating portions DP penetrating to the cavity portion 40 are formed in the peripheral membrane portions 28, and, when viewed from the thickness direction of the membrane 22, the slits SL are formed between the membrane 22 and coupling portions 26 and the peripheral membrane portions 28. In addition to the above, the width WS of each slit SL is narrower than the minimum distance DSmin between inner wall faces of a penetrating portion DP facing each other with the center thereof interposed therebetween.

For this reason, the minimum distance DSmin between inner wall faces of a penetrating portion DP facing each other with the center thereof interposed therebetween becomes larger than the width WS of each of the slits SL, which are formed for enabling the membrane 22 to be bent.

As a result of this configuration, at the time of etching processing entailing pressure release, penetration at portions of the membrane base member 220 at which the penetrating portions DP are formed reaches the cavity portion 40 before penetration at portions of the membrane base member 220 at which the slits SL are formed.

Since, because of this effect, a pressure difference between the inside and outside of the cavity portion 40 is eliminated, it becomes possible to provide the surface stress sensor 201 that is capable of preventing a rupture of the membrane base member 220, which occurs at the time of processing entailing pressure release, from occurring.

(2) The penetrating portions DP are formed only in the peripheral membrane portions 28.

As a result of this configuration, although the penetrating portions DP are formed into shapes the outer peripheral portions of which are ruptured due to a pressure difference between the inside and outside of the cavity portion 40 that is generated at the time of forming the penetrating portions DP, there is no influence on operation of the sensor because the penetrating portions DP are disposed in the peripheral membrane portion 28. In addition, it becomes possible to form the slits SL and the penetrating portions DP for pressure release by means of a single etching step.

(3) The minimum distance DSmin between inner wall faces of a penetrating portion DP facing each other with the center thereof interposed therebetween is set at a value within a range of 1 μm or more and 10 μm or less.

As a result of this configuration, at the time of etching processing entailing pressure release, causing penetration at portions of the membrane base member 220 at which the penetrating portions DP are formed to reach the cavity portion 40 before penetration at portions of the membrane base member 220 at which the slits SL are formed is facilitated.

(4) The width WS of each slit SL is set at a value within a range of 0.5 μm or more and 5 μm or less.

As a result of this configuration, it becomes possible to, at the time of deforming the membrane 22 and the coupling portions 26, prevent the membrane 22 and the coupling portions 26 from coming into contact with the peripheral membrane portions 28.

(5) The surface stress sensor 201 further includes the flexible resistors 50 configured to be disposed on at least one of the coupling portions 26 and have resistance values that change according to bending induced in the coupling portions 26.

As a result of this configuration, it becomes possible to detect relative resistance changes in the resistance values of the flexible resistors 50, using stresses in the X-direction and Y-direction induced in the flexible resistors 50, and it thereby becomes possible to determine whether or not molecules to be detected have adsorbed to the receptor 30.

This capability enables the surface stress sensor 201 to be used as a surface stress sensor that detects taste or smell for a gas or a liquid.

In addition, the method for manufacturing the surface stress sensor of the fifth embodiment enables advantageous effects that will be described below to be attained.

(6) The method for manufacturing the surface stress sensor includes the stacked body forming step, the region setting step, and the etching step. In the etching step, the penetrating portions DP are formed by means of etching, and the slits SL are also formed by means of etching with a lower etching rate than in the etching of the penetrating portions DP. In addition to the above, in the etching step, by forming the slits SL, the membrane 22, the frame member 24, the coupling portions 26, and the peripheral membrane portions 28 are formed.

For this reason, at the time of etching processing entailing pressure release, penetration at portions of the membrane base member 220 at which the penetrating portions DP are formed reaches the cavity portion 40 before penetration at portions of the membrane base member 220 at which the slits SL are formed.

As a result of this effect, since a pressure difference between the inside and outside of the cavity portion 40 is eliminated, it becomes possible to provide the method for manufacturing the surface stress sensor 201 that is capable of preventing a rupture of the membrane base member 220, which occurs at the time of processing entailing pressure release, from occurring.

(7) In the etching step, etching is performed in such a way that the width WS of each slits SL is narrower than the minimum distance DSmin between inner wall faces of a penetrating portion DP facing each other with the center thereof interposed therebetween. For this purpose, an etching rate in the etching for forming the slits SL is set lower than an etching rate in the etching for forming the penetrating portions DP.

For this reason, the minimum distance DSmin between inner wall faces of a penetrating portion DP facing each other with the center thereof interposed therebetween becomes larger than the width WS of each of the slits SL, which are formed for enabling the membrane 22 to be bent.

As a result of this configuration, at the time of etching processing entailing pressure release, penetration at portions of the membrane base member 220 at which the penetrating portions DP are formed reaches the cavity portion 40 before penetration at portions of the membrane base member 220 at which the slits SL are formed, and a pressure difference between the inside and outside of the cavity portion 40 is eliminated.

(8) In the region setting step, further, the flexible resistor forming regions 370, which are regions into which the first ions are implanted, are set in the coupling portion forming regions 326. In addition to the above, the low resistance forming regions 372, which are regions on the outer side than the flexible resistor forming regions 370 and into which the second ions are implanted, are set in the frame member forming region 324. Further, the method for manufacturing the surface stress sensor 201 of the fifth embodiment includes the first ion implantation step, the second ion implantation step, the heat treatment step, and the wiring layer forming step.

As a result of this configuration, it becomes possible to provide the method for manufacturing the surface stress sensor 201 that can be used as a surface stress sensor that detects taste or smell for a gas or a liquid.

Variations of Fifth Embodiment (1) Although, in the fifth embodiment, the penetrating portions DP are formed only in the peripheral membrane portions 28, the present invention is not limited to the configuration. That is, the penetrating portions DP may be formed to a portion (a side face or the lower face) of the support base member 10 facing the cavity portion 40.

In this case, the penetrating portions DP are formed before the slits SL by means of, for example, cutting using laser beam or tools instead of etching.

(2) Although, in the fifth embodiment, the opening shape of each penetrating portion DP is formed into a round shape, the present invention is not limited to the configuration. That is, the opening shape of each penetrating portion DP may be formed into a shape other than a round shape, such as a triangle, a polygon having four or more sides, a shape enclosed by a curve, and an opening having a linear shape the width of which is wider than that of each slit SL.

Figure 34:
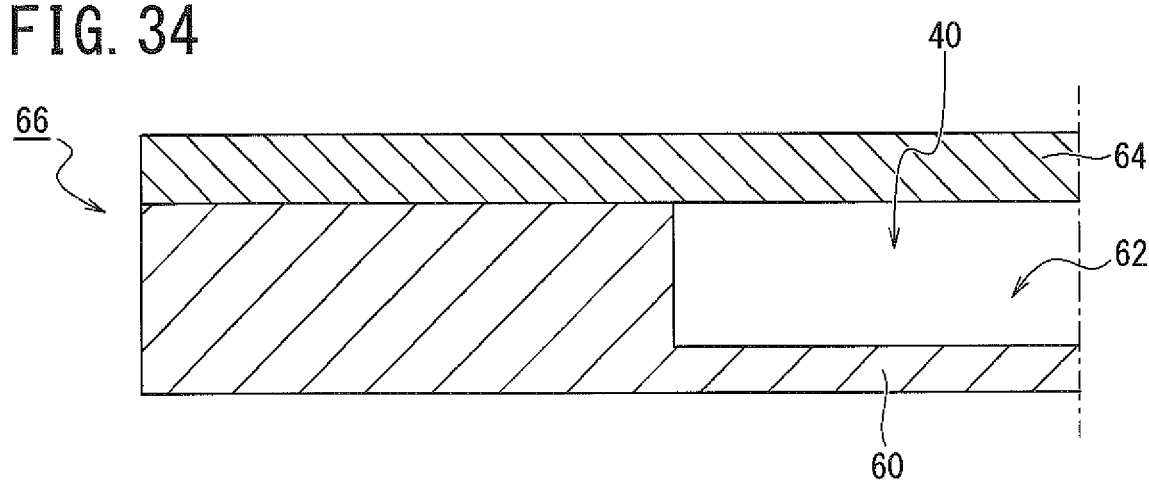
FIG. 34 is a diagram illustrative of a variation of the surface stress sensor according to the fifth embodiment of the present invention.
Figure 35:
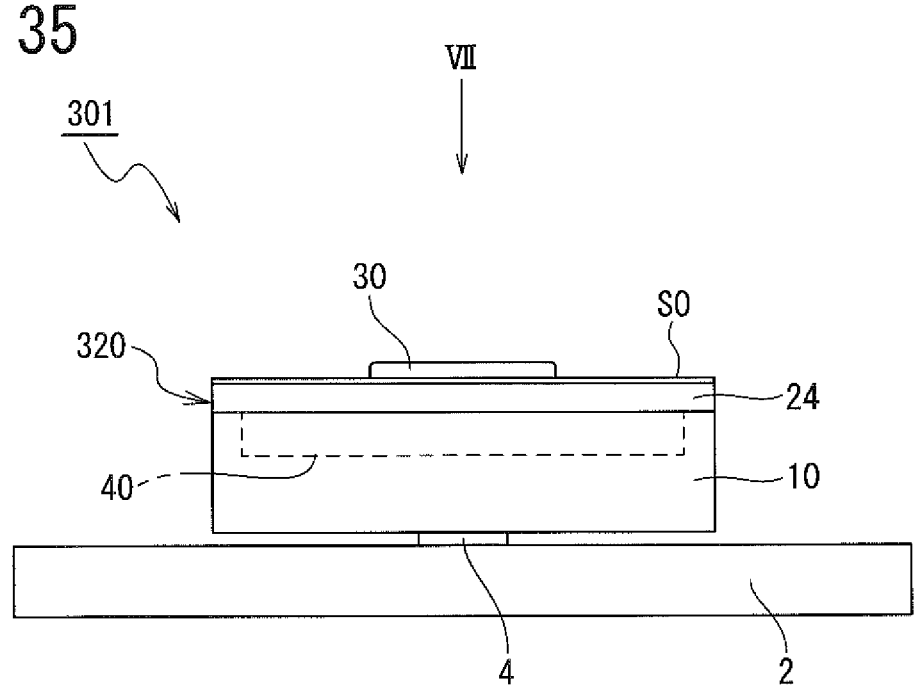
FIG. 35 is a side view illustrative of a configuration a surface stress sensor according to a seventh embodiment of the present invention.

(3) Although, in the fifth embodiment, the flexible resistor regions 70, the low resistance regions 72, and the wiring layer 82 are formed, the present invention is not limited to the configuration and, as illustrated in FIG. 34, the surface stress sensor 201 may have a configuration in which no flexible resistor region, low resistance region, and wiring layer are formed.

(4) Although, in the fifth embodiment, by forming the recessed portion 62 on one face of the first silicon substrate 60, which serves as a material of the support base member 10, the cavity portion 40 is formed between the membrane 22 and the support base member 10, the present invention is not limited to the configuration. That is, by forming a recessed portion on the face of the second silicon substrate 64, which serves as a material of the membrane base member 220, facing the support base member 10, the cavity portion 40 may be formed between the membrane 22 and the support base member 10.

(5) Although, in the fifth embodiment, the surface stress sensor 201 has a configuration in which, on the four coupling portions 26a to 26d constituting two pairs, the flexible resistors 50a to 50d are disposed, respectively, the present invention is not limited to the configuration. That is, the surface stress sensor 201 may have a configuration in which, on two coupling portions 26 constituting a pair, flexible resistors 50 are respectively disposed.

(6) Although, in the fifth embodiment, the surface stress sensor 201 has a configuration in which, on all the four coupling portions 26a to 26d, the flexible resistors 50 are disposed, respectively, the present invention is not limited to the configuration and the surface stress sensor 201 may have a configuration in which, on at least one coupling portion 26, a flexible resistor 50 is disposed.

(7) Although, in the fifth embodiment, the area of the connecting portion 4 is set at a value smaller than the area of the membrane 22 when viewed from the thickness direction of the membrane 22, the present invention is not limited to the configuration and the area of the connecting portion 4 may be set at a value equal to or greater than the area of the membrane 22.

(8) Although, in the fifth embodiment, the shape of the connecting portion 4 is set as a circle, the present invention is not limited to the configuration and the shape of the connecting portion 4 may be set as a square. In addition, a plurality of connecting portions 4 may be formed.

(9) Although, in the fifth embodiment, the same material is used as a material of which the membrane base member 220 is formed and a material of which the support base member 10 is formed, the present invention is not limited to the configuration and different materials may be used as a material of which the membrane base member 220 is formed and a material of which the support base member 10 is formed.

In this case, setting a difference between a linear expansion coefficient of the membrane base member 220 and a linear expansion coefficient of the support base member 10 to be $1.2 \times 10^{-5}/°$ C. or less enables a difference between the amount of deformation of the membrane base member 220 and the amount of deformation of the support base member 10 corresponding to deformation of the package substrate 2 to be decreased. This configuration enables bending of the membrane 22 to be suppressed.

(10) Although, in the fifth embodiment, the linear expansion coefficient of the support base member 10 is set at $5.0 \times 10^{-6}/°$ C. or less, the present invention is not limited to the configuration and the linear expansion coefficient of the support base member 10 may be set at $1.0 \times 10^{-5}/°$ C. or less.

Even in this case, it becomes possible to improve rigidity of the support base member 10 and it thereby becomes possible to decrease the amount of deformation of the membrane base member 220 with respect to deformation of the package substrate 2 caused by temperature change and the like.

Sixth Embodiment

Hereinafter, a sixth embodiment of the present invention will be described with reference to the drawings.
(Configuration)

Using FIGS. 27 to 30 while referring to FIGS. 8 to 12 and 15 to 19, a configuration of the sixth embodiment will be described.

The configuration of the sixth embodiment is the same as that of the fifth embodiment described above except that, as illustrated in FIG. 15, a frame member 24 is connected to the face (in FIG. 15, the face on the upper side) of a support base member 10 on the opposite side to the face thereof facing a package substrate 2 with a connecting layer 90 interposed therebetween. That is, the configuration of the sixth embodiment, as with the surface stress sensor 201 of the fifth embodiment, includes a membrane base member 220 including peripheral membrane portions 28 in which penetrating portions DP are disposed.

The connecting layer 90 is formed of silicon dioxide ($SiO_2$) or the like.

Since the configuration of the other constituent components is the same as that of the fifth embodiment described above, a description thereof will be omitted.
(Method for Manufacturing Surface Stress Sensor)

Using FIGS. 16 to 19 and 31 while referring to FIGS. 27 to 30, a method for manufacturing a surface stress sensor 201 will be described. Note that cross-sectional views in FIGS. 16 to 19 correspond to a cross-sectional view taken along the line Y-Y in FIG. 30. In addition, regarding a configuration similar to that of the second embodiment described above, a description thereof will be sometimes omitted.

The method for manufacturing the surface stress sensor 201 includes a stacked body forming step, a region setting step, a first ion implantation step, a second ion implantation step, a heat treatment step, a hole forming step, a cavity region forming step, a hole sealing step, a wiring layer forming step, and an etching step. The method for manufacturing a surface stress sensor described in the sixth embodiment differs from the method for manufacturing a surface stress sensor of the second embodiment in including the region setting step and including the etching step in place of the removal step of the second embodiment.

(Stacked Body Forming Step)

Since the stacked body forming step is performed in the same procedure as that of the stacked body forming step of the second embodiment illustrated in FIG. 16, a description thereof will be omitted.

Consequently, in the stacked body forming step, by stacking a sacrificial layer 92 on one face of the support base member 10 and further stacking a membrane base member 220 on the sacrificial layer 92, a stacked body 66 is formed.

(Region Setting Step)

Since the region setting step is performed in the same procedure as that of the region setting step of the fifth embodiment illustrated in FIG. 31, a description thereof will be omitted.

(First Ion Implantation Step)

Since the first ion implantation step is performed in the same procedure as that of the first ion implantation step of the second embodiment illustrated in FIG. 16, a description thereof will be omitted. In the first ion implantation step, as illustrated in FIG. 31, first ions are selectively implanted into flexible resistor forming regions 370.

Consequently, in the first ion implantation step, the first ions are implanted into the flexible resistor forming regions 370 within the face of the membrane base member 220 on the opposite side to the face thereof facing the support base member 10.

(Second Ion Implantation Step)

Since the second ion implantation step is performed in the same procedure as that of the second ion implantation step of the second embodiment illustrated in FIG. 16, a description thereof will be omitted. In the second ion implantation step, as illustrated in FIG. 31, second ions are implanted into low resistance forming regions 372.

Consequently, in the second ion implantation step, the second ions are implanted into the low resistance forming regions 372 on the outer side than the flexible resistor forming regions 370.

(Heat Treatment Step)

Since the heat treatment step is performed in the same procedure as that of the fifth embodiment described above, a description thereof will be omitted.

Consequently, in the heat treatment step, by performing heat treatment on the stacked body 66 into which the first ions and the second ions were implanted, flexible resistor regions 70 are formed in the flexible resistor forming regions 370 and low resistance regions 72 are also formed in the low resistance forming regions 372.

(Hole Formation Step)

Since the hole forming step is performed in the same procedure as that of the hole forming step of the second embodiment illustrated in FIG. 17, a description thereof will be omitted.

Consequently, in the hole forming step, holes 76 that penetrate to the sacrificial layer 92 are formed at least in one region among a membrane setting region 84, coupling portion forming regions 326, and peripheral membrane portion forming regions 328.

(Cavity Portion Forming Step)

Since the cavity portion forming step is performed in the same procedure as that of the cavity portion forming step of the second embodiment illustrated in FIG. 18, a description thereof will be omitted.

Consequently, in the cavity portion forming step, a portion of the sacrificial layer 92 arranged between the membrane setting region 84, coupling portion forming regions 326, and peripheral membrane portion forming regions 328 and the support base member 10 is removed by means of etching via the holes 76. With this step, the cavity portion 40 is disposed between the support base member 10 and the membrane base member 220.

(Hole Sealing Step)

Since the hole sealing step is performed in the same procedure as that of the hole sealing step of the second embodiment illustrated in FIG. 19, a description thereof will be omitted. Note that a position at which a pattern of holes is formed is set at least in one region among the membrane setting region 84, the coupling portion forming regions 326, and the peripheral membrane portion forming regions 328.

Consequently, in the hole sealing step, an oxide film 94 is formed on the face of the membrane base member 220 on the opposite side to the face thereof facing the support base member 10 and the holes 76 are thereby sealed.

(Wiring Layer Forming Step)

Since the wiring layer forming step is performed in the same procedure as that of the wiring layer forming step of the first embodiment illustrated in FIGS. 8A, 8B, 9A, 9B, 10A, 10B, 11A, 11B, and 12, a description thereof will be omitted.

Consequently, in the wiring layer forming step, wiring layers 82 that are electrically connected to flexible resistors 50 are formed.

(Etching Step)

Since the etching step is performed in the same procedure as that of the etching step of the fifth embodiment illustrated in FIG. 32, a description thereof will be omitted.

Therefore, in the etching step, by forming slits SL, a membrane 22 is formed in the membrane setting region 84 and the frame member 24 is formed in a frame member forming region 324. In addition to the above, by forming the slits SL, the coupling portions 26 are formed in the coupling portion forming regions 326 and the peripheral membrane portions 28 are formed in the peripheral membrane portion forming regions 328.

(Operation and Actions)

Since operation and actions of the sixth embodiment are the same as those of the fifth embodiment described above, descriptions thereof will be omitted.

It should be noted that the foregoing sixth embodiment is one example of the present invention, the present invention is not limited to the foregoing sixth embodiment, and, even when the present invention may be carried out in modes other than the embodiment, depending on designs, various changes may be made to the present invention within a scope not departing from the technical idea of the present invention Advantageous Effects of Sixth Embodiment The method for manufacturing the surface stress sensor of the sixth embodiment enables advantageous effects that will be described below to be attained.

(1) The method for manufacturing the surface stress sensor includes the stacked body forming step, the region setting step, the hole forming step, the cavity portion forming step, the hole sealing step, and the etching step. In the etching step, the penetrating portions DP are formed by means of etching, and the slits SL are also formed by means of etching with a lower etching rate than in the etching of the penetrating portions DP. In addition to the above, in the etching step, by forming the slits SL, the membrane 22, the frame member 24, the coupling portions 26, and the peripheral membrane portions 28 are formed.

For this reason, at the time of etching processing entailing pressure release, penetration at portions of the membrane base member 220 at which the penetrating portions DP are formed reaches the cavity portion 40 before penetration at portions of the membrane base member 220 at which the slits SL are formed.

As a result of this effect, since a pressure difference between the inside and outside of the cavity portion 40 is eliminated, it becomes possible to provide the method for manufacturing the surface stress sensor 201 that is capable of preventing a rupture of the membrane base member 220, which occurs at the time of processing entailing pressure release, from occurring.

Seventh Embodiment

Hereinafter, a seventh embodiment of the present invention will be described with reference to the drawings.

An invention according to the seventh embodiment relates to a surface stress sensor, in particular, a membrane-type surface stress sensor (MSS) that has high sensitivity compared with a piezoresistive cantilever-type sensor, and a method for manufacturing the surface stress sensor.

Examples of technology used for a sensor for collecting information equivalent to the five senses of a human, in particular, a sensor of taste or smell, which human senses by receiving a chemical substance, include technology of surface stress sensors including a piezoresistive member.

In a surface stress sensor including a piezoresistive member, a layer of solvent is formed by applying a solvent that is a polyethylenimine (PEI) solution on a planar member by means of an inkjet-spotting technique and a receptor that adsorbs an analyte is thereby formed.

Since, in order to efficiently induce surface stress in the planar member, it is desirable that the analyte adsorb only on the front face of the planar member (the face on the upper side of the planar member), forming the receptor only on the front face of the planar member is a key point for maintaining high sensor sensitivity.

For this reason, in manufacturing of a conventional surface stress sensor including a piezoresistive member, a process of accumulating a solvent is observed by means of real-time side view monitoring and it is confirmed that the solvent does not spill out of the front face of the planar member.

Meanwhile, when a solvent is applied to a planar member, wettability of the planar member becomes a problem. In general, in order to efficiently transmit surface stress induced by an analyte adsorbing on a planar member, a receptor and the planar member are required to have high adhesion with each other. That is, it is desirable that the front face of the planar member has high wettability (lyophilicity).

However, since, when the front face of a planar member is lyophilic, a solvent is likely to flow on the front face of the planar member, it becomes difficult to keep the solvent contained within a predetermined region set on the planar member. When the solvent spills over an edge of the planar member and flows around to the reverse face of the planar member (the face on the lower side of the planar member), surface stress is scarcely induced in the planar member due to competing forces from both the front face and the reverse face.

Therefore, it is required to, through the work of observing the process of accumulating the solvent, and the like, ensure that the receptor is applied only to the front face of the planar member. However, such a time-consuming process is not suitable for mass production and has room for improvement in respect of yield.

The present invention has been made in view of the conventional unsolved problem as described above and an object of the present invention is to provide a surface stress sensor that is capable of maintaining high sensitivity and a method for manufacturing the surface stress sensor by controlling a process of forming a receptor.

(Configuration)

Using FIGS. 35 to 57, a configuration of the seventh embodiment will be described.

Figure 36:
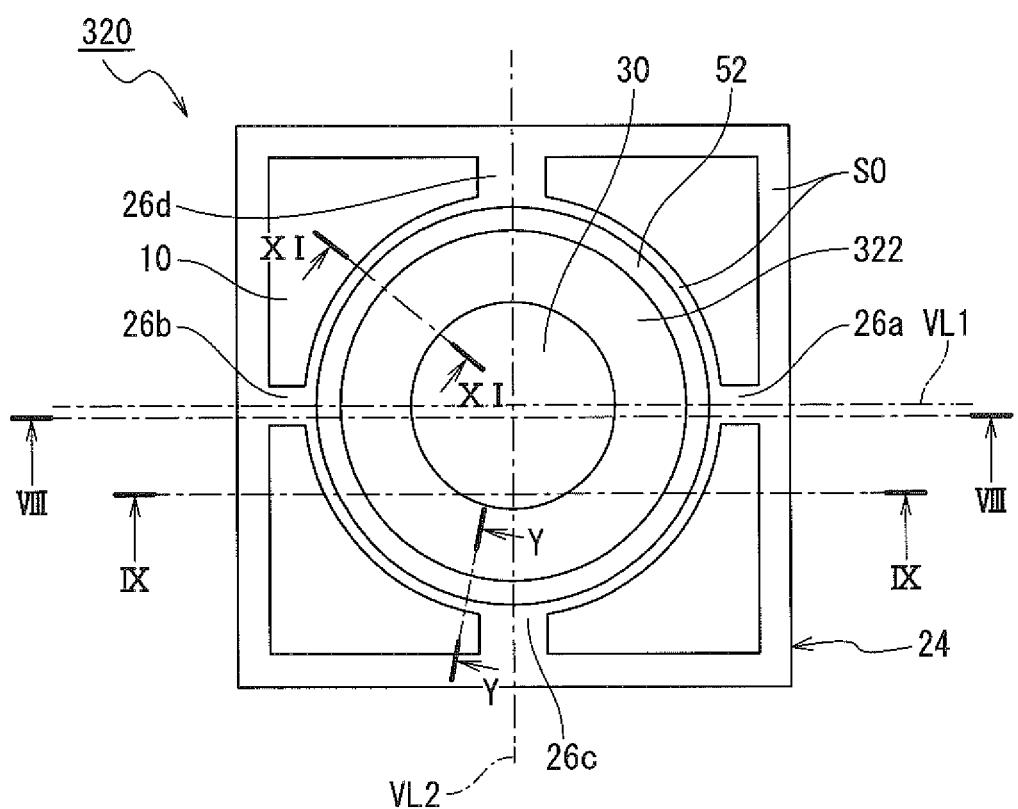
FIG. 36 is diagram viewed from the arrow VII in FIG. 35.
Figure 37:
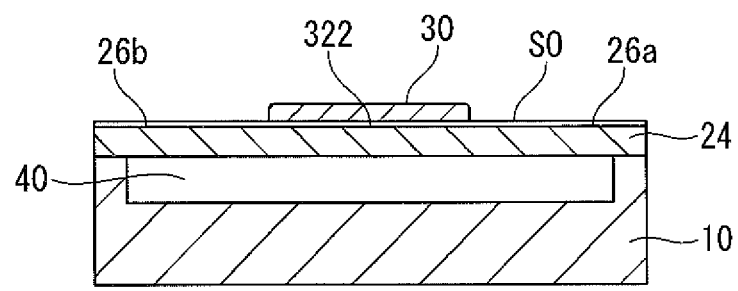
FIG. 37 is a cross-sectional view taken along the line VIII-VIII in FIG. 36.
Figure 38:
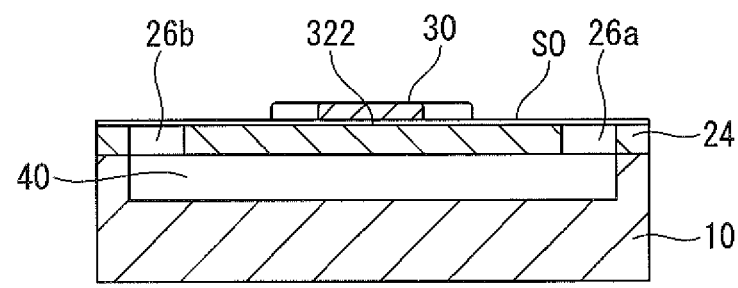
FIG. 38 is a cross-sectional view taken along the line IX-IX in FIG. 36.

A surface stress sensor 301 illustrated in FIGS. 35 to 39 is used for, for example, a surface stress sensor that detects taste or smell. The surface stress sensor 301, although, as with the surface stress sensor 1 of the first embodiment, including a package substrate 2, a connecting portion 4, and a support base member 10, differs from the surface stress sensor 1 of the first embodiment in including a detection base member 320 in place of the detection base member 20. Note that FIG. 37 is a cross-sectional view taken along the line VIII-VIII in FIG. 36 and FIG. 38 is a cross-sectional view taken along the line IX-IX in FIG. 36. In FIGS. 37 and 38, illustration of the package substrate 2 and the connecting portion 4 is omitted for the purpose of illustration.

Hereinafter, the detection base member 320 will be described in detail. Note that descriptions of the package substrate 2, the connecting portion 4, and the support base member 10 will be omitted.

(Detection Base Member)

The detection base member 320 is stacked on one face (in FIG. 35, the face on the upper side) of the support base member 10 and is formed by a membrane 322, a frame member 24, and coupling portions 26 integrated with one another. Since the frame member 24, and the coupling portions 26, and the receptor 30 have similar configurations to those of the frame member 24, and the coupling portions 26, and the receptor 30 in the detection base member 20 of the first embodiment, respectively, descriptions thereof will be omitted.

In the seventh embodiment, a case where silicon is used as a material of which the detection base member 320 is formed will be described as an example.

In addition, as a material of which the detection base member 320 is formed, a material that causes a difference between a linear expansion coefficient of the support base member 10 and a linear expansion coefficient of the detection base member 320 to be $1.2 \times 10^5 /°$ C. or less is used.

In the seventh embodiment, a case where the same material is used as a material of which the detection base member 320 is formed and a material of which the support base member 10 is formed will be described.

Hereinafter, the membrane 322 will be described in detail.

(Membrane)

The membrane 322 is formed into a plate shape.

In the seventh embodiment, a case where the membrane 322 is formed into a disc shape will be described as an example.

In addition, the membrane 322 is an n-type semiconductor layer.

In addition, on one face (in FIG. 35, the face on the upper side) of the membrane 322, an oxide film SO (silicon oxide film) is formed. Note that the oxide film SO is not limited to silicon oxide film as long as being a material having high wettability with respect to the receptor.

In addition, on the one face of the membrane 322, a recess/protrusion pattern 52 is formed. Note that the recess/protrusion pattern 52 will be described later.

To the one face (in FIG. 35, the face on the upper side) of the membrane 322, a receptor 30 is applied. Note that, in the following description, the one face of the membrane 322 is sometimes referred to as the "front face of the membrane 322".

Figure 40:
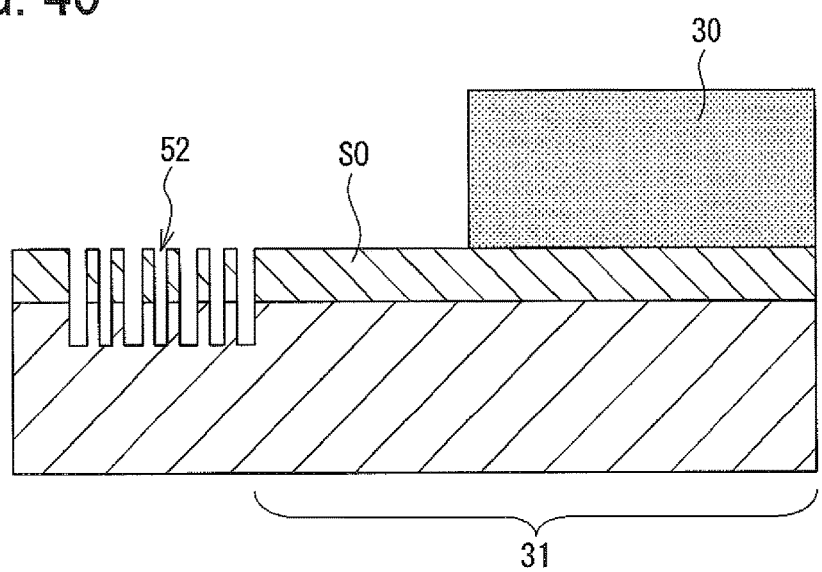
FIG. 40 is a cross-sectional view taken along the line XI-XI in FIG. 36.

As illustrated in FIG. 40, a receptor forming region 31 is set on the front face of the membrane 322, and the receptor 30 is formed on the receptor forming region 31.

The receptor forming region 31 is a region that includes the center of the front face of the membrane 322 and is set in advance. Note that, since the area of a region to which the receptor 30 is applied is preferably large, the receptor forming region 31 is preferably large.

Therefore, the support base member 10 is arranged connected to the frame member 24 with a cavity (a cavity portion 40) disposed between the membrane 322 and coupling portions 26 and the support base member 10. In addition to the above, when viewed from the thickness direction of the membrane 322, the support base member 10 overlaps the membrane 322 and the coupling portions 26.

(Recess/Protrusion Pattern)

Figure 39:
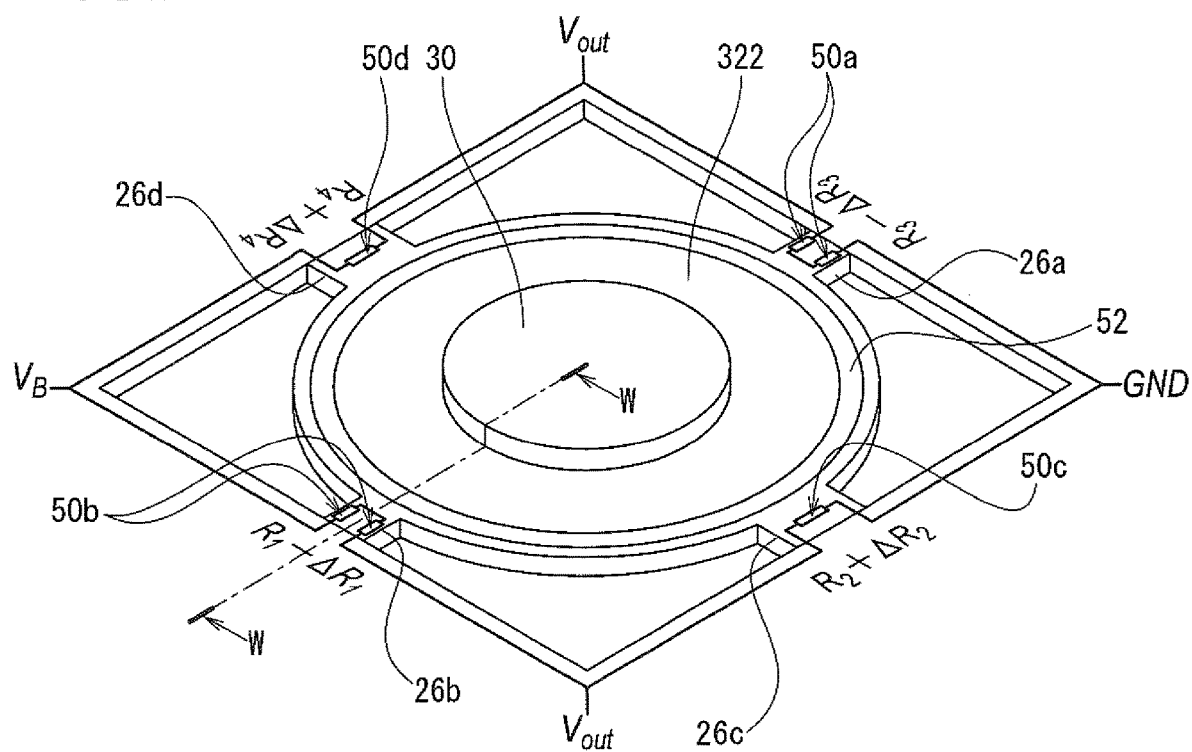
FIG. 39 is a perspective view of a detection base member of the surface stress sensor according to the seventh embodiment of the present invention.

The recess/protrusion pattern 52 is disposed in a region closer to the frame member 24 than the receptor forming region 31 (see FIG. 40) within the front face of the membrane 322 and is formed in such a way as to have a higher degree of roughness than the receptor forming region 31. In FIG. 39, the recess/protrusion pattern 52 is illustrated as a region in which recesses and protrusions are formed for the purpose of simplifying the illustration.

In addition, the recess/protrusion pattern 52 is formed with a pattern in which a plurality of protruding portions (protrusions or pillars) or a plurality of recessed portions (openings or holes) are consecutively repeated. In the seventh embodiment, a case where each protruding portion is formed into a round pillar shape (a case where the recess/protrusion pattern 52 is formed with pillars and a cavity) and a case where each recessed portion is formed with a round opening (a case where the recess/protrusion pattern 52 is holes formed in the membrane 322) will be described as an example. Note that each protruding portion may be formed into, for example, a square pillar shape or a pyramid shape. In addition, each recessed portion may be formed into, for example, a polygonal opening or a groove.

In addition, the recess/protrusion pattern 52 is arranged over the entire circumference of the membrane 322 in a concentric manner in a region closer to the frame member 24 than the receptor forming region 31 on the front face of the membrane 322.

As described above, the oxide film SO is formed on the front face of the membrane 322, and, on the oxide film SO formed on the inner side than the recess/protrusion pattern 52, the receptor 30 is applied.

In addition, as described above, it is preferable that the application area of the receptor 30 be large. For this reason, the recess/protrusion pattern 52 is formed in a region as close as possible to the outer periphery of the membrane 322 within the front face of the membrane 322.

As illustrated in FIG. 40, a cross-section of the recess/protrusion pattern 52 is a shape in which protruding portions or recessed portions are densely arranged. The depth of grooves that are formed in the recess/protrusion pattern 52 is a depth that does not allow the grooves to penetrate through the membrane 322 in the thickness direction. It has been known that the surface of a pattern formed into a shape in which protruding portions or recessed portions are densely arranged in this manner has liquid repellency, and this property is generally referred to as the lotus effect. This is a phenomenon that is explained in a physical sense by the well-known Cassie's formula.

Note that, in FIG. 40, a cross-section of the recess/protrusion pattern 52 is illustrated as a configuration in which a plurality of grooves are formed by illustrating only a partial cross-sectional view taken along the line XI-XI in FIG. 36 among the cross-sections of the recess/protrusion pattern 52, for the purpose of illustration. However, an actual structure of the recess/protrusion pattern 52 is a structure in which a plurality of protruding portions or recessed portions are arranged at intervals.

The receptor 30 is formed by applying a PEI solution or the like to a vicinity of the center of the membrane 322, using an inkjet-spotting technique or the like.

For this reason, since the oxide film SO formed at the outermost layer of the membrane 322 has high wettability, the PEI solution applied to the front face of the membrane 322 is distributed on the front face of the membrane 322 with good adhesion.

On the other hand, although the PEI solution applied to the front face of the membrane 322 is likely to flow out toward the outer periphery of the membrane 322 due to high wettability that the oxide film SO has, the PEI solution is blocked from flowing out to the outer peripheral portion of the membrane 322 by the lotus effect of the recess/protrusion pattern 52. Because of this effect, it becomes possible to efficiently apply the receptor 30 to a vicinity of the center of the membrane 322.

Note that the recess/protrusion pattern 52 is not limited to the configuration in which the recess/protrusion pattern 52 is arranged over the entire circumference of the membrane 322 in a region closer to the frame member 24 than the receptor forming region 31. Similarly, the arrangement of the recess/protrusion pattern 52 is not limited to a concentric arrangement. In addition, the shape of the membrane 322 is not limited to a round shape.

Variations of the configuration of the membrane 322 and the recess/protrusion pattern 52 include, for example, configurations illustrated in FIGS. 41 to 43.

Figure 41C:
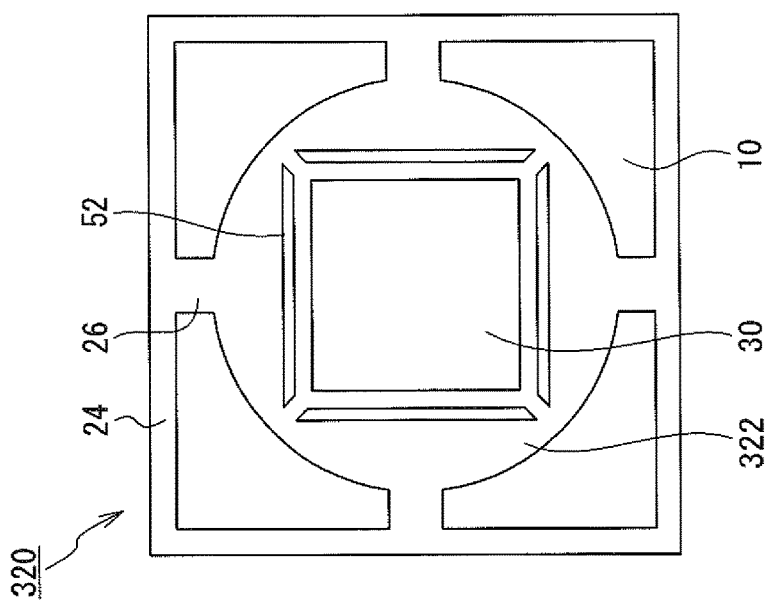
FIGS. 41A, 41B, and 41C are diagrams viewed from the arrow VII in FIG. 35 and diagrams illustrative of variations in an arrangement of a recess/protrusion pattern.
Figure 41B:
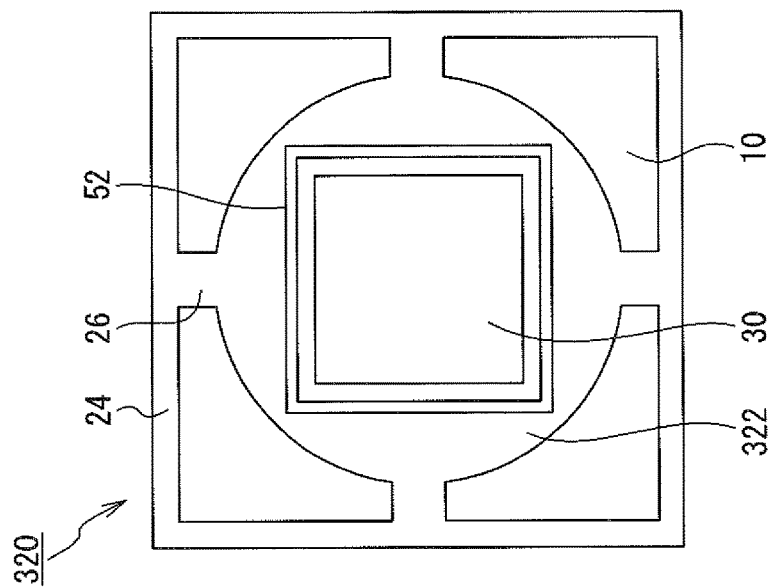
Figure 41A:
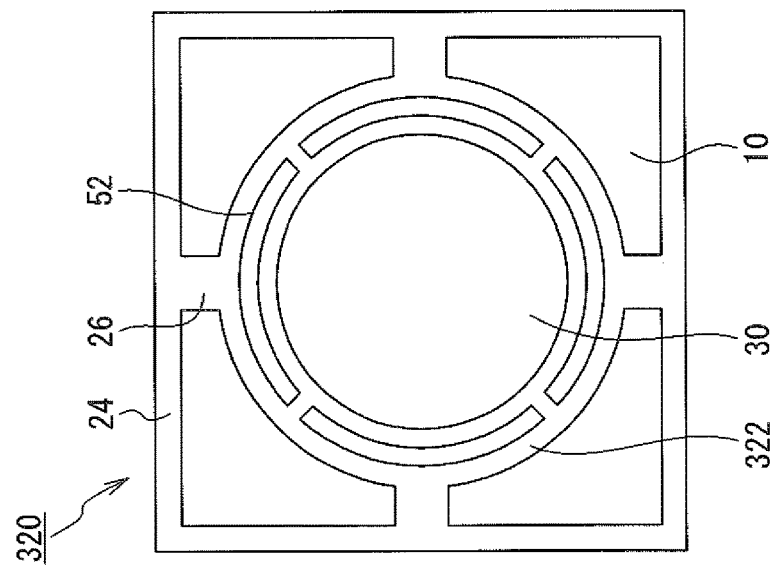

That is, as illustrated in FIG. 41A, the recess/protrusion pattern 52 may have a configuration in which the recess/protrusion pattern 52 has discontinuities at some portions thereof instead of being arranged over the entire circumference, or, as illustrated in FIG. 41B, the recess/protrusion pattern 52 may be arranged in a quadrilateral. In addition, as illustrated in FIG. 41C, the recess/protrusion pattern 52 may have a configuration in which discontinuities are disposed at some portions of the recess/protrusion pattern 52 arranged in a quadrilateral.

The configuration including discontinuities at some portions of the recess/protrusion pattern 52 can be applied to, for example, a case where the recess/protrusion pattern 52 does not necessarily have to be arranged over the entire circumference depending on viscosity of a PEI solution of which the receptor 30 is formed. Note that, regarding the configuration including discontinuities at some portions of the recess/protrusion pattern 52, the recess/protrusion pattern 52 is perceived to have discontinuities from a macroscopic perspective because intervals between protruding portions or recessed portions adjacent to each other at the portions having discontinuities are sufficiently large compared with those at portions not having discontinuities.

Figure 42A:
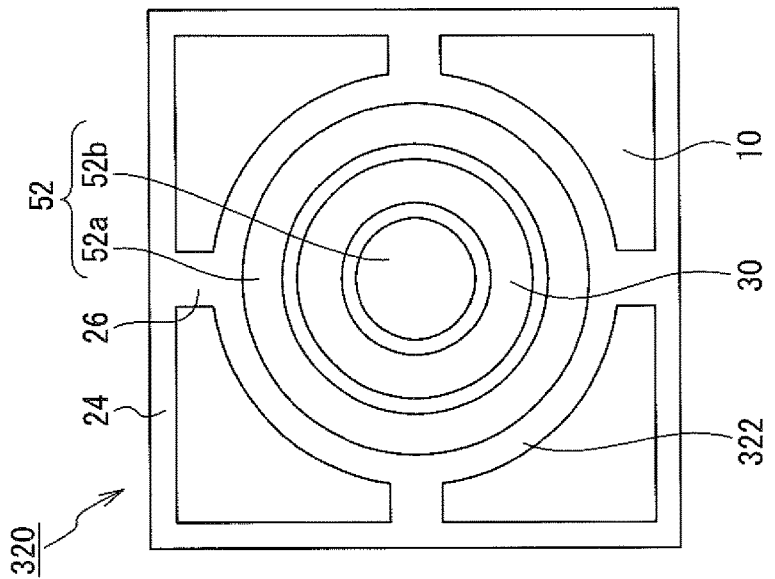
FIGS. 42A, 42B, and 42C are diagrams viewed from the arrow VII in FIG. 35 and diagrams illustrative of other variations in the arrangement of the recess/protrusion pattern.
Figure 42B:
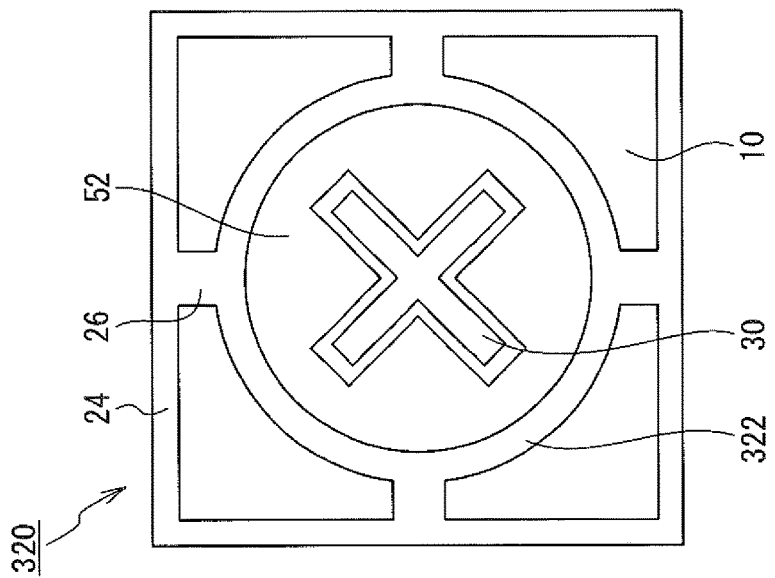
Figure 42C:
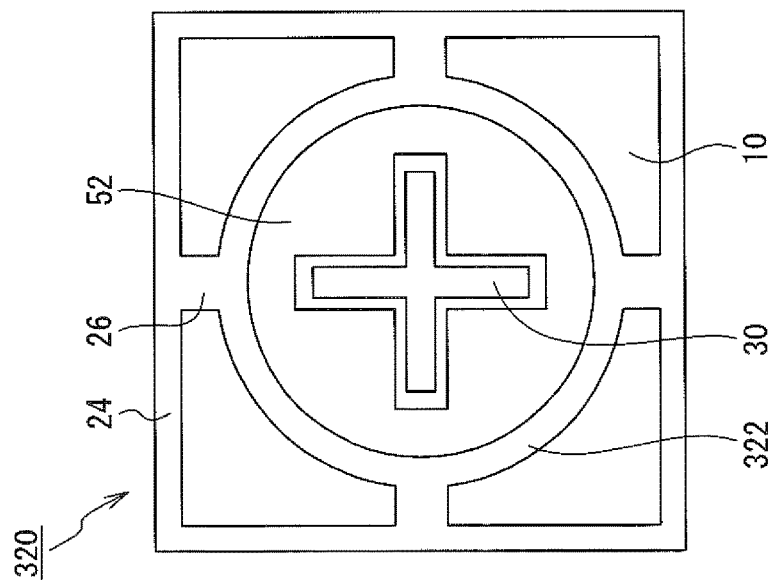

In addition, as illustrated in FIGS. 42A to 42C, the receptor 30 may be configured to be formed into a specific shape by devising a shape of the recess/protrusion pattern 52.

For example, as illustrated in FIG. 42A, the recess/protrusion pattern 52 may be formed into a shape the outer periphery of which is circular shaped along the outer periphery of the membrane 322 and that has a cross-shaped region in which the recess/protrusion pattern 52 is not formed at a central portion of the membrane 322. In FIG. 42A, an example in which end portions of the cross shape are formed toward vicinities of the four coupling portions 26 is illustrated. In this case, the receptor 30 is formed into, for example, a cross shape on the cross-shaped region in which the recess/protrusion pattern 52 is not formed (a region having low liquid repellency). For this reason, it is possible to selectively form the receptor 30 in the vicinities of the coupling portions 26 in which flexible resistors 50a to 50d are formed and it is thereby possible to efficiently transmit bending of the membrane 322 to the flexible resistors 50. Because of this effect, it is possible to reduce the amount of the receptor 30 to be applied.

In addition, as illustrated in FIG. 42B, the recess/protrusion pattern 52 may be formed into a shape the outer periphery of which is circular shaped along the outer periphery of the membrane 322 and that has a cross-shaped region in which the recess/protrusion pattern 52 is not formed at a central portion of the membrane 322. In FIG. 42B, an example in which end portions of the cross shape are formed toward circular-arc-shaped outer peripheries of the membrane 322 between the four coupling portions 26 is illustrated. In this case, the receptor 30 is formed into, for example, a cross shape on the cross-shaped region in which the recess/protrusion pattern 52 is not formed. When the recess/protrusion pattern 52 illustrated in FIG. 42B is disposed, it is possible to selectively form the receptor 30 in a region apart from the coupling portions 26 in which the flexible resistors 50a to 50d are formed, and it is thereby possible to reduce variation in the sensitivity of the surface stress sensor 301.

In addition, as illustrated in FIG. 42C, the recess/protrusion pattern 52 may be formed with an annular outer side recess/protrusion pattern 52a that is disposed in a vicinity of the outer periphery of the membrane 322 and a circular inner side recess/protrusion pattern 52b that is disposed in a region including the center of the membrane 322. In the case of FIG. 42C, the receptor 30 is formed on an annular region in which no recess/protrusion pattern is formed between the outer side recess/protrusion pattern 52a and the inner side recess/protrusion pattern 52b. When the recess/protrusion pattern 52 illustrated in FIG. 42C is disposed, it is possible to selectively form the receptor 30 in vicinities of the coupling portions 26 in which the flexible resistors 50a to 50d are formed, and the detection precision of the surface stress sensor 301 is improved and variation in the detection precision is also reduced.

Note that, regarding the recess/protrusion pattern 52, the shape of a region the outer periphery of which is circular shaped along the outer periphery of the membrane 322 and in which the recess/protrusion pattern 52 is not formed at a central portion of the membrane 322 is not limited to the shapes described above. As the shape of the region in which the recess/protrusion pattern 52 is not formed, for example, any of a polygonal shape, a shape extending from the center of the membrane 322 toward the outer periphery in a radial manner, and the like may be chosen as long as the sensor sensitivity of the surface stress sensor 301 can be maintained at a sufficient level.

In addition, as illustrated in FIGS. 43A to 43C, the shape of the membrane 322 may be formed into a quadrilateral. In this case, as illustrated in FIG. 43A, the recess/protrusion pattern 52 may be arranged in a quadrilateral, or, as illustrated in FIG. 43B, the recess/protrusion pattern 52 may have a configuration in which discontinuities are disposed at some portions of the recess/protrusion pattern 52 arranged in a quadrilateral. In addition, as illustrated in FIG. 43C, the recess/protrusion pattern 52 may be arranged over the entire circumference in a concentric manner. Note that, although not particularly illustrated, the recess/protrusion pattern 52 may have a configuration in which discontinuities are disposed at some portions of the recess/protrusion pattern 52 as illustrated in FIG. 43C.

When a configuration in which discontinuities are disposed at some portions of the recess/protrusion pattern 52 is employed, it is suitable that the positions of the discontinuities be not arranged at positions between the center of the membrane 322 and the coupling portions 26, as illustrated in FIGS. 41A, 41C, and 43B. This configuration enables the possibility of the PEI solution coming into contact with the flexible resistors 50 to be reduced even when, for example, the PEI solution of which the receptor 30 is formed flows out through the discontinuities.

In addition, as illustrated in FIGS. 41B, 41C, 43A and 43B, the shape of the receptor 30 may be formed into a quadrilateral.

Changing the shape of the recess/protrusion pattern 52 in this manner depending on properties, such as a capture rate of the receptor 30 for various types of molecules and stress induced in the membrane 322, enables sensitivity optimal for the respective properties and variation thereof to be controlled.

Note that FIGS. 41A to 43C illustrate states in which, when viewed from the thickness direction of the membrane 322, the support base member 10 arranged under the detection base member 320 is visible through regions that are surrounded by the membrane 322, the frame member 24, and the coupling portions 26 and are serving as the cavity portion.

(Variations of Recess/Protrusion Pattern)

Using FIGS. 44 to 57, variations of the recess/protrusion pattern will be described.

The recess/protrusion pattern 52 described in the seventh embodiment is a configuration in which the front face of the membrane 322 is covered with the oxide film SO and the membrane 322 has high wettability with respect to the receptor 30 that is formed of a hydrophilic solvent (a PEI solution or the like).

However, when the receptor 30 is formed of a hydrophobic solvent (for example, tetrachloroethane, dichloromethane, toluene, hexane, or the like), for example, silicon has a higher wettability than the oxide film SO. For this reason, it is preferable that silicon be exposed on the front face of the membrane 322.

In addition, although the lotus effect manifests itself on the recess/protrusion pattern 52 regardless of whether the recess/protrusion pattern 52 is formed using protruding portions or recessed portions, a larger effect in general manifests itself on the recess/protrusion pattern 52 having more cavity portions. For this reason, the recess/protrusion pattern 52 formed using protruding portions has more intense liquid repellency.

Examples of the recess/protrusion pattern 52 using protruding portions include configurations illustrated in FIGS. 44 to 48. Note that configurations in FIGS. 44 to 48 that will be described below are enlarged partial views of the recess/protrusion patterns 52 that are formed in an annular region formed in a vicinity of the outer periphery of the membrane 322. Note that, in FIGS. 44 to 48, the lower right side (the side on which the membrane 322 is formed) is the side on which the center of the membrane 322 is located.

FIG. 44 is a perspective view illustrative of a configuration when the recess/protrusion pattern 52 is formed with a plurality of round pillar-shaped protruding portions 452*a* and a cavity 452*b* that is a recessed portion. The recess/protrusion pattern 52 is, for example, formed with any three protruding portions 452*a* of the plurality of protruding portions 452*a* arranged in a positional relationship of an equilateral triangle when viewed in plan. This configuration enables a recess/protrusion pattern 452 illustrated in FIG. 44 to exhibit uniform liquid repellency at any position. The cavity 452*b* is formed by removing a region excluding the round pillar-shaped protruding portions 452*a* in a region in which the recess/protrusion pattern 52 is formed at the outer periphery of the membrane 322 by means of etching.

FIG. 45 is a perspective view illustrative of a configuration when the recess/protrusion pattern 52 is formed with a plurality of hollow cylindrical protruding portions 552*a* and a cavity 552*b* that is a recessed portion. In addition, a hole 552*c* is formed inside each hollow cylindrical protruding portion 552*a* and the hole 552*c* constitutes the recessed portion. Because of such a structure of the protruding portions 552*a*, liquid repellency can be obtained from the cavity 552*b* between the protruding portions 552*a* or different protruding or recessed shapes, namely the protruding portions 552*a* and the holes 552*c*. Therefore, the structure is preferable because, even when, at the time of forming the receptor 30, a solution serving as the receptor 30 permeates to one of the cavities 552*b* between the protruding portions 552*a* and the holes 552*c*, liquid repellency is maintained unless the solution permeates to the other.

The recess/protrusion pattern 52 is, for example, formed with any three protruding portions 552*a* of the plurality of protruding portions 552*a* arranged in a positional relationship of an equilateral triangle when viewed in plan. In the recess/protrusion pattern 52 in FIG. 45, the centers of the holes 552*c* of any three protruding portions 552*a* are arranged in a positional relationship of an equilateral triangle when viewed in plan. This configuration enables the recess/protrusion pattern 52 illustrated in FIG. 45 to exhibit uniform liquid repellency at any position. The cavity 552*b* and the holes 552*c* are formed by removing regions excluding the hollow cylindrical protruding portions 552*a* in a region in which the recess/protrusion pattern 52 is formed at the outer periphery of the membrane 322 by means of etching.

FIG. 46 is a perspective view illustrative of a configuration when the recess/protrusion pattern 52 is formed with a plurality of round pillar-shaped protruding portions 652*a* and 652*b* and a cavity 652*c* that is a recessed portion. Each protruding portion 652*a* and each protruding portion 652*b* are formed in such a manner that the areas of the round shapes thereof when viewed in plan are different, that is, the area of the protruding portion 652*b* when viewed in plan is larger than the area of the protruding portion 652*a* when viewed in plan. Because of this configuration, while the recess/protrusion pattern 52 keeps liquid repellency as a whole, the upper faces of the protruding portions 652*b* exhibit lyophilicity. In addition, more protruding portions 652*a* having smaller area than the protruding portions 652*b* having larger area are arranged, and, around each protruding portion 652*b*, a plurality of protruding portions 652*a* are arranged. For this reason, the recess/protrusion pattern 52 in which both the protruding portions 652*a* and 652*b* are disposed is capable of, while suppressing flow of a solution as a whole, suppressing the solution from flowing around to the reverse face of the membrane more effectively by catching the solution having spread over the recess/protrusion pattern 52 with the protruding portions 652*b*. Such a property is in general referred to as the petal effect.

Further, the protruding portions 652*b*, which have high adsorption effect for a solution, are formed at positions close to the inner peripheral side (the side on which the center of the membrane 322 is located) in the region in which the recess/protrusion pattern 52 is formed. Therefore, even when the solution has spread over the recess/protrusion pattern 52, it is possible to, while adsorbing the solution on the inner peripheral side (the protruding portions 652*b*) of the recess/protrusion pattern 52, suppress wetting by the solution on the outer peripheral side of the recess/protrusion pattern 52 and thereby further suppress the solution from flowing around to the reverse face of the membrane 322.

Figure 47:
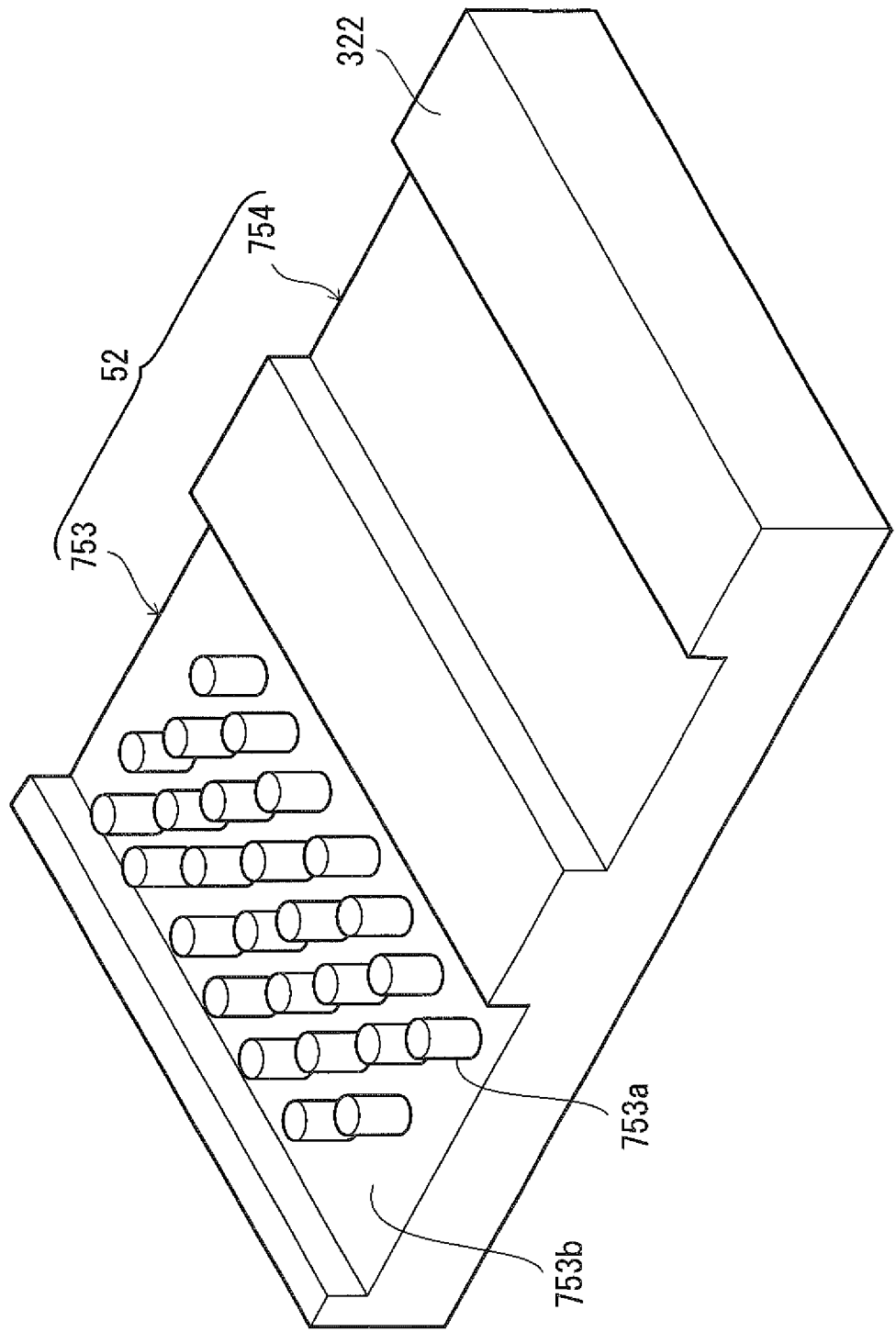
FIG. 47 is an enlarged perspective view of still another variation of the recess/protrusion pattern formed in the vicinity of the outer periphery of the membrane.

FIG. 47 is a perspective view illustrative of a configuration when the recess/protrusion pattern 52 is formed with a recess/protrusion pattern 753 formed with a plurality of round pillar-shaped protruding portions 753*a* and a cavity 753*b* that is a recessed portion and a groove 754. The recess/protrusion pattern 753 and the groove 754 are formed into two concentric rings when viewed in plan, and the groove 754 is formed on the inner side. Because of this configuration, an effect in which, even when a solution dripped at the center of the membrane 322 flows out toward the outer periphery of the membrane 322, the flow of the solution is stemmed by the groove 754 can be expected. Further, when the solution flows to the outside of the outer periphery of the groove 754, the flow of the solution can be stopped by the recess/protrusion pattern 753. Due to the groove 754 being disposed on the inner side than the recess/protrusion pattern 753, the recess/protrusion pattern 753 only has to stem the flow of the solution that has spilled over the groove 754. Because of this configuration, it is possible to more effectively suppress the solution from flowing around to the reverse face of the membrane 322.

Note that, although, in FIG. 47, a configuration in which the recess/protrusion pattern 753 and the groove 754 are formed into two concentric rings is illustrated, the present invention is not limited to the configuration. That is, the recess/protrusion pattern 753 and the groove 754 may be formed in such a manner as to constitute three or more concentric rings, and the arrangement of the recess/protrusion pattern 753 and the groove 754 can also be appropriately adjusted.

Figure 48:
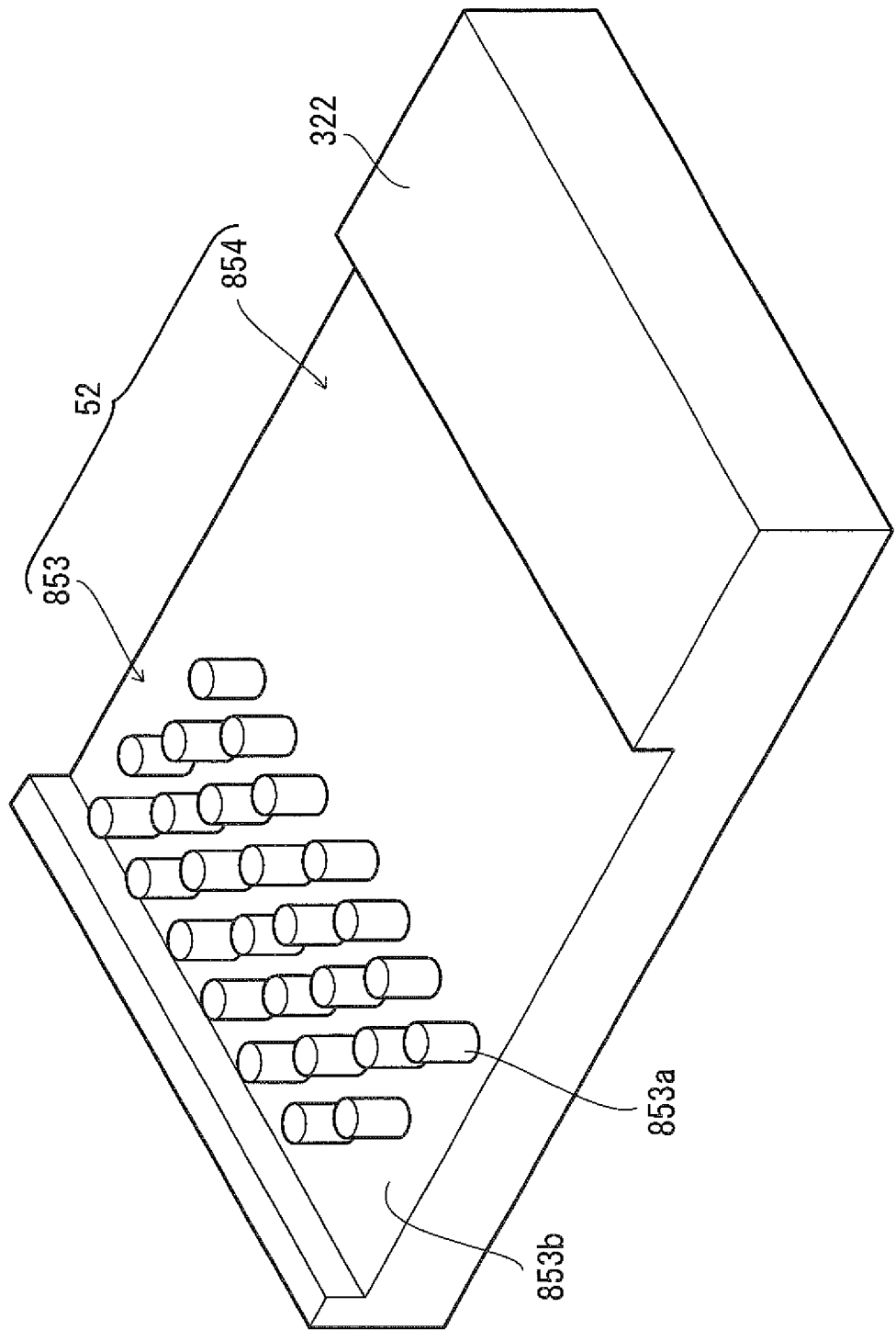
FIG. 48 is an enlarged perspective view of still another variation of the recess/protrusion pattern formed in the vicinity of the outer periphery of the membrane.

FIG. 48 is a perspective view illustrative of a configuration when the recess/protrusion pattern 52 is formed with a recess/protrusion pattern region 853 formed with a plurality of round pillar-shaped protruding portions 853*a* and a cavity 853*b* that is a recessed portion and a recessed portion region 854 that is adjacent to the recess/protrusion pattern region 853. The recessed portion region 854 is formed on the inner side than the recess/protrusion pattern region 853. Because of this configuration, when a solution dripped at the center of the membrane 322 intrudes into the recessed portion region 854, the recessed portion region 854 is filled with the solution and, because of liquid-repellent effect occurring on the side faces of the adjacent protruding portions 853*a*, the solution is suppressed from flowing in the outer periphery direction. The liquid-repellent effect occurring on the side faces of the adjacent protruding portions 853*a* means the lotus effect occurring on the side faces of the protruding portions 853*a* and in the cavity 853*b* between the protruding portions 853*a*. Because of this effect, it is possible to more effectively suppress the solution from flowing around to the reverse face of the membrane 322.

In addition, another recess/protrusion pattern 52 may be formed with protruding portions, cavities, groove portions, recessed portions, and the like illustrated in FIGS. 44 to 48 combined with one another.

For example, on the inner side than the recess/protrusion pattern 52 illustrated in FIG. 45 or 46, the groove 754 illustrated in FIG. 47 or the recessed portion region 854 illustrated in FIG. 48 may be disposed. In addition, the recess/protrusion pattern 52 may be configured by combining the hollow cylindrical protruding portions 552*a* illustrated in FIG. 45, the protruding portions 652*a* illustrated in FIG. 46, and the protruding portions 652*b* that have higher lyophilicity than the protruding portions 652*a* with one another.

In addition, in FIG. 46, a configuration in which the protruding portions 652*b*, which have high lyophilicity, are disposed on the outer periphery side of the recess/protrusion pattern 52 may be used. In addition, three or more types of protruding portions having different areas when viewed in plan (the areas of the upper faces) may be disposed, and the protruding portions may be arranged in descending order of the areas of the upper faces from the inner periphery side toward the outer periphery side of the recess/protrusion pattern 52.

In addition, three or more types of protruding portions having different areas when viewed in plan (the areas of the upper faces) may be disposed in place of the protruding portions 452*a* in FIG. 44 or the protruding portions 853*a* in FIG. 48, and the protruding portions may be arranged in ascending order of the areas of the upper faces from the inner periphery side toward the outer periphery side of the recess/protrusion pattern 52.

As described thus far, it is preferable that the configuration of the recess/protrusion pattern 52 including protruding portions be appropriately adjusted depending on physical properties of a solution used for forming the receptor 30 and the detection base member 320. In addition, it is preferable that diameters and heights of protruding portions and intervals between the protruding portions be also appropriately adjusted depending on physical properties of a solution used for forming the receptor 30 and the detection base member 320.

Although, when the recess/protrusion pattern 52 is formed with protruding portions, the height of the protruding portions is determined depending on depth of etching performed on the membrane 322, it becomes possible to expect a certain level of lotus effect without depending on the height of the protruding portions.

Although, when the recess/protrusion pattern 52 is formed with recessed portions, the depth of the recessed portions is similarly determined depending on depth of etching performed on the membrane 322, the lotus effect does not depend on the depth of the recessed portions and, further, the recessed portions penetrating the membrane 322 do not cause any problem.

Figure 49:
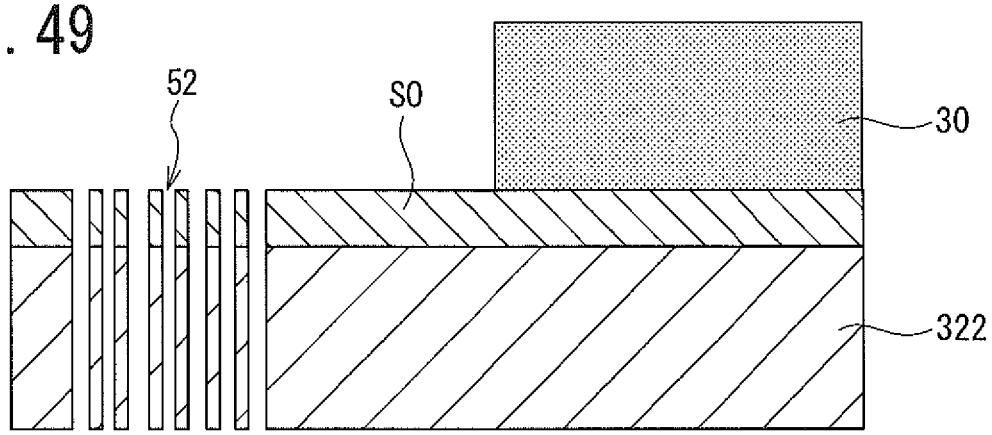
FIG. 49 is a cross-sectional view taken along the line XI-XI in FIG. 36 and a diagram illustrative of still another variation of the recess/protrusion pattern.

Therefore, when the receptor 30 is configured to be formed of a hydrophilic solvent, the detection base member 320 may have a configuration in which the oxide film SO is formed on the front face of the membrane 322 and the recess/protrusion pattern 52 is formed with recessed portions penetrating the oxide film SO and the membrane 322, as illustrated in FIG. 49. Similarly, when the receptor 30 is configured to be formed of a hydrophilic solvent, the detection base member 320 may have a configuration in which the oxide film SO is formed on the front face of the membrane 322 and the recess/protrusion pattern 52 is formed with protruding portions or recessed portions formed in the oxide film SO, as illustrated in FIG. 50.

Figure 50:
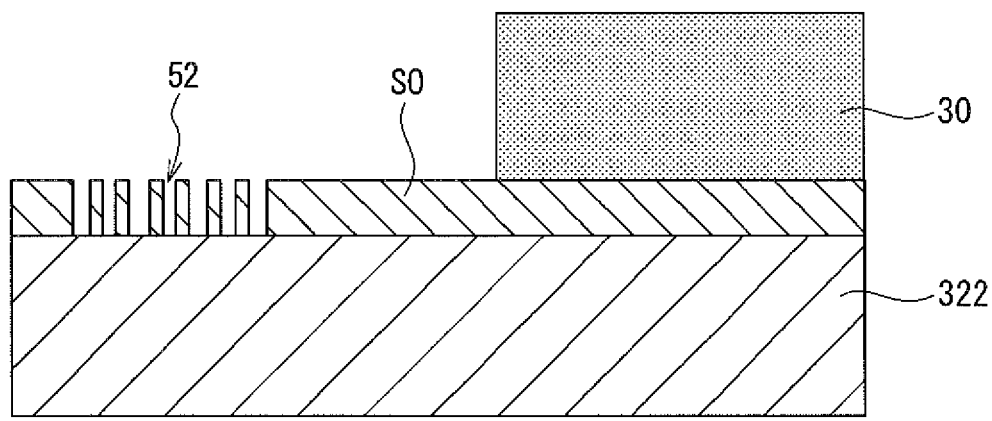
FIG. 50 is a cross-sectional view taken along the line XI-XI in FIG. 36 and a diagram illustrative of still another variation of the recess/protrusion pattern.

The configurations illustrated in FIGS. 49 and 50 enable a function of preventing the solvent from flowing out to be achieved due to high wettability of the configurations with respect to a hydrophilic solvent and further due to the lotus effect.

Figure 51:
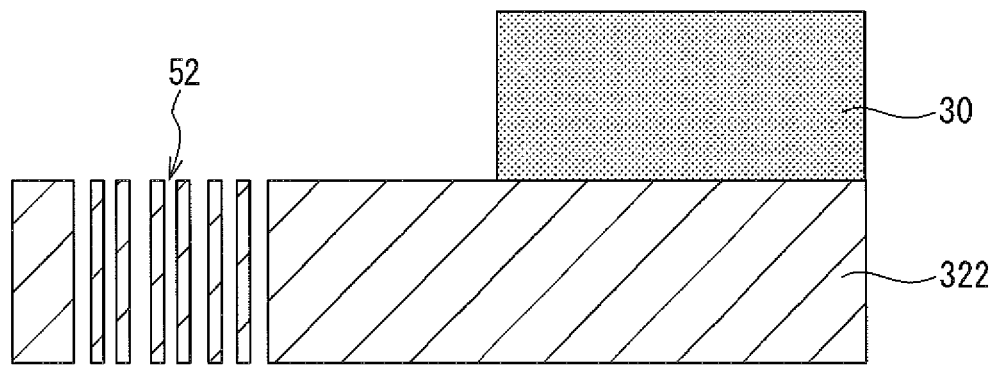
FIG. 51 is a cross-sectional view taken along the line XI-XI in FIG. 36 and a diagram illustrative of still another variation of the recess/protrusion pattern.

In addition, when the receptor 30 is configured to be formed of a hydrophobic solvent, the detection base member 320 may have a configuration in which silicon is exposed on the front face of the membrane 322 and the recess/protrusion pattern 52 is formed with recessed portions penetrating the membrane 322, as illustrated in FIG. 51. Similarly, when the receptor 30 is configured to be formed of a hydrophobic solvent, the detection base member 320 may have a configuration in which silicon is exposed on the front face of the membrane 322 and the recess/protrusion pattern 52 is formed with protruding portions or recessed portions formed by means of etching to a depth that does not allow the recessed portions to penetrate through the membrane 322, as illustrated in FIG. 52.

Figure 52:
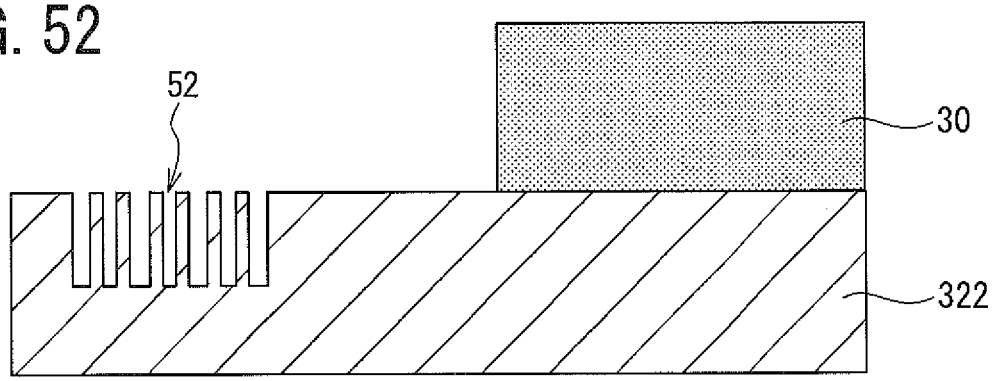
FIG. 52 is a cross-sectional view taken along the line XI-XI in FIG. 36 and a diagram illustrative of still another variation of the recess/protrusion pattern.

The configurations illustrated in FIGS. 51 and 52 enable a function of preventing the solvent from flowing out to be achieved due to high wettability of the configurations with respect to a hydrophobic solvent and further due to the lotus effect.

Further, it is possible to increase the lotus effect by configuring the receptor forming region 31, which is a region in which the receptor 30 is formed, and the recess/protrusion pattern 52 differently on the front face of the membrane 322.

Figure 53:
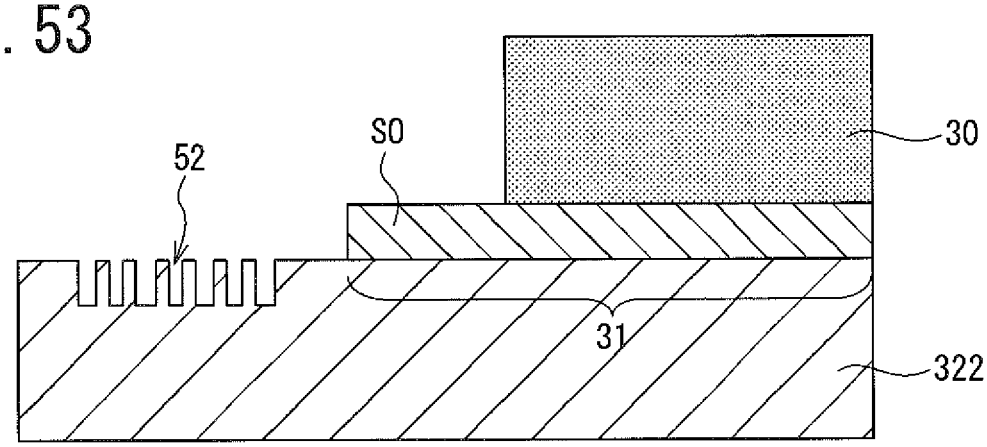
FIG. 53 is a cross-sectional view taken along the line XI-XI in FIG. 36 and a diagram illustrative of still another variation of the recess/protrusion pattern.

That is, as illustrated in FIG. 53, the receptor forming region 31 may be configured to be covered by the oxide film SO and the recess/protrusion pattern 52 may be configured to be formed with protruding portions or recessed portions on which silicon is exposed.

In the case of the configuration illustrated in FIG. 53, when a hydrophilic solvent is applied to the membrane 322, it becomes possible to form the receptor 30 having high adhesion with the membrane 322 because the receptor forming region 31 has high wettability. On the other hand, the recess/protrusion pattern 52 comes to have a strong liquid repellent function because the lotus effect is added to liquid repellency by silicon, and, hence, it becomes possible to improve the function of preventing the solvent from flowing out.

Figure 54:
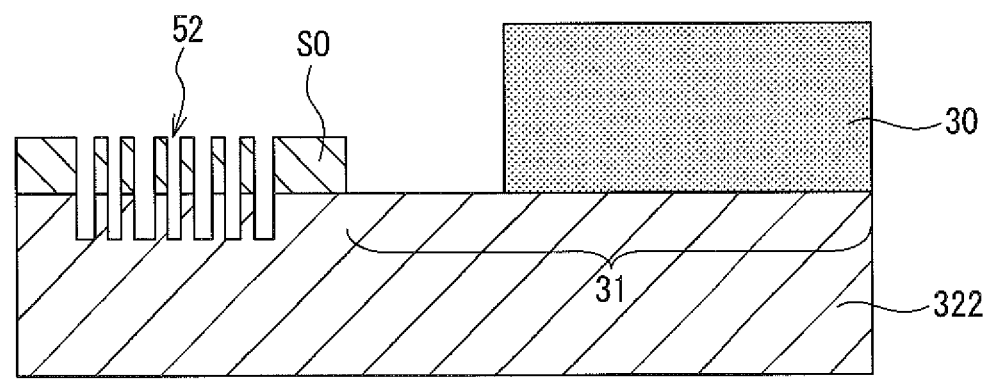
FIG. 54 is a cross-sectional view taken along the line XI-XI in FIG. 36 and a diagram illustrative of still another variation of the recess/protrusion pattern.

In addition, as illustrated in FIG. 54, the receptor forming region 31 may have a configuration in which silicon is exposed and the recess/protrusion pattern 52 may be configured to be covered by the oxide film SO. Note that the height of protruding portions with which the recess/protrusion pattern 52 is formed is a height that does not allow recessed portions to penetrate through the membrane 322. In addition, the depth of recessed portions with which the recess/protrusion pattern 52 is formed is a depth that does not allow the recessed portions to penetrate through the membrane 322.

The configuration illustrated in FIG. 54 enables high application capability to be obtained for a hydrophobic solvent.

Figure 55:
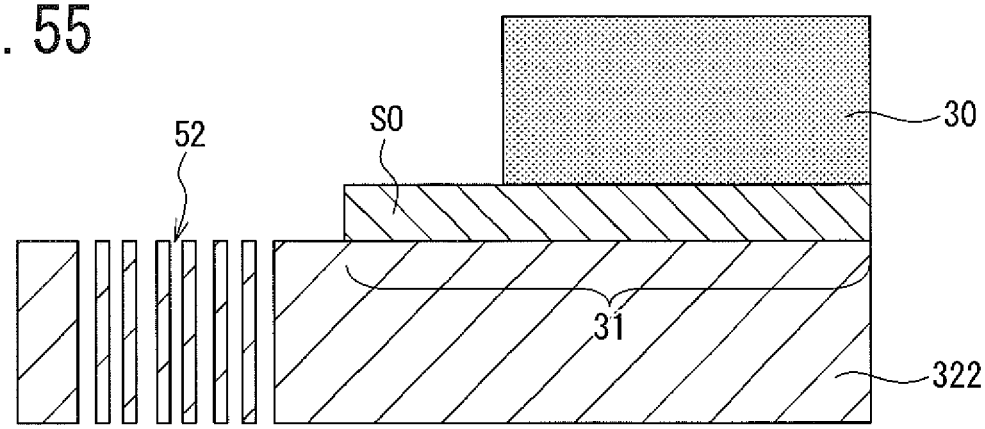
FIG. 55 is a cross-sectional view taken along the line XI-XI in FIG. 36 and a diagram illustrative of still another variation of the recess/protrusion pattern.

In addition, as illustrated in FIG. 55, the receptor forming region 31 may be configured to be covered by the oxide film SO and the recess/protrusion pattern 52 may have a configuration in which silicon is exposed on the front face of the recess/protrusion pattern 52 and recessed portions penetrate through the membrane 322.

The configuration illustrated in FIG. 55, as with the configuration illustrated in FIG. 53, enables a high application capability to be obtained for a hydrophilic solvent.

Figure 56:
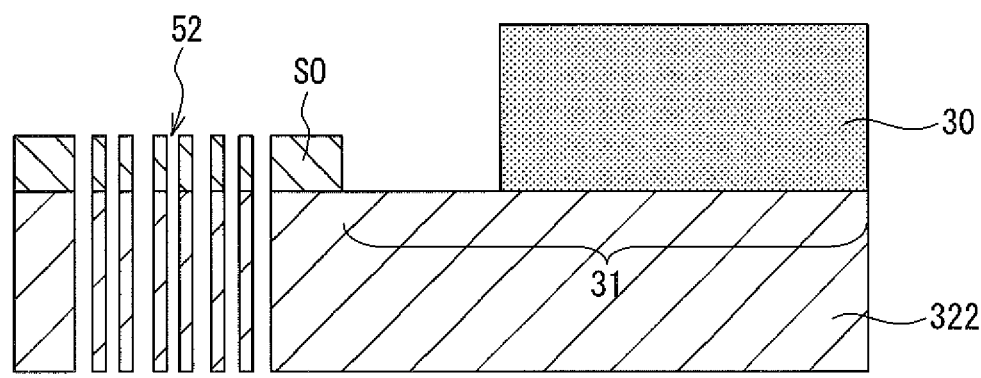
FIG. 56 is a cross-sectional view taken along the line XI-XI in FIG. 36 and a diagram illustrative of still another variation of the recess/protrusion pattern.

In addition, as illustrated in FIG. 56, the receptor forming region 31 may have a configuration in which silicon is exposed and the recess/protrusion pattern 52 may have a configuration in which the recess/protrusion pattern 52 is covered by the oxide film SO and recessed portions with which the recess/protrusion pattern 52 is formed penetrate through the oxide film SO and the membrane 322.

The configuration illustrated in FIG. 56, as with the configuration illustrated in FIG. 54, enables a high application capability to be obtained for a hydrophobic solvent.

Figure 57:
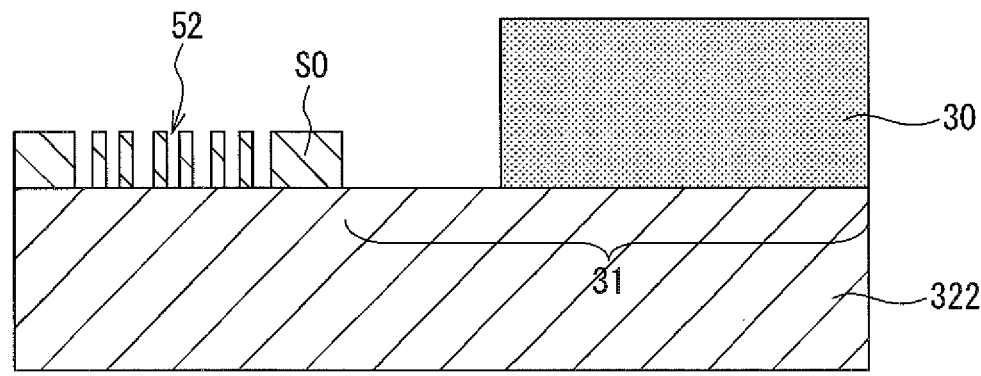
FIG. 57 is a cross-sectional view taken along the line XI-XI in FIG. 36 and a diagram illustrative of still another variation of the recess/protrusion pattern.

In addition, as illustrated in FIG. 57, the receptor forming region 31 may have a configuration in which silicon is exposed and the recess/protrusion pattern 52 may have a configuration in which the recess/protrusion pattern 52 is covered by the oxide film SO and protruding portions or recessed portions with which the recess/protrusion pattern 52 is formed penetrate through only the oxide film SO.

The configuration illustrated in FIG. 57, as with the configuration illustrated in FIG. 54, enables a high application capability to be obtained for a hydrophobic solvent.

(Method for Manufacturing Surface Stress Sensor)

Using FIGS. 58 and 59 while referring to FIGS. 35 to 57 and 6 to 11, a method for manufacturing the surface stress sensor 301 will be described. Note that cross-sectional views in FIG. 58 correspond to a cross-sectional view taken along the line W-W in FIG. 39. In addition, cross-sectional views in FIG. 59 correspond to a cross-sectional view taken along the line Y-Y in FIG. 36 and illustrates the same configuration as that in FIG. 40.

The method for manufacturing the surface stress sensor 301 includes a stacked body forming step, a first ion implantation step, a second ion implantation step, a heat treatment step, a wiring layer forming step, an oxide film forming step, a recess/protrusion pattern forming step, a removal step, and a receptor forming step.

(Stacked Body Forming Step)

Since the stacked body forming step is performed in the same procedure as that of the stacked body forming step of the first embodiment illustrated in FIGS. 6A and 6B, a description thereof will be omitted.

By performing the stacked body forming step as described above, the cavity portion 40 the top, bottom, left, and right sides of which are enclosed by silicon (a first silicon substrate 60 and a second silicon substrate 64) is formed at a predetermined position in a stacked body 66.

Consequently, in the stacked body forming step, by forming a recessed portion 62 on one face of the support base member 10 and further sticking the second silicon substrate, which serves as the detection base member 320, to the support base member 10 in such a way that the second silicon substrate covers the recessed portion 62, the stacked body 66 in which the cavity portion 40 is disposed between the support base member 10 and the detection base member 320 is formed.

(First Ion Implantation Step)

In the first ion implantation step, first, the face on the upper side of the second silicon substrate 64 is oxidized and a first silicon oxide film 68a is thereby formed and first ions are selectively implanted into flexible resistor regions 70, using a pattern of photoresist (not illustrated), as illustrated in FIG. 7.

Consequently, in the first ion implantation step, the first ions are implanted into selected partial regions (the flexible resistor regions 70) on the outer side than a preset region including the center of the detection base member 320 within the face of the detection base member 320 on the opposite side to the face thereof facing the support base member 10.

(Second Ion Implantation Step)

In the second ion implantation step, the photoresist used in the first ion implantation step is removed, a pattern of photoresist (not illustrated) different from the pattern of photoresist used in the first ion implantation step is further formed, and second ions are implanted into low resistance regions 72, as illustrated in FIG. 7.

Consequently, in the second ion implantation step, the second ions are implanted into selected regions of the detection base member 320 on the outer side than the regions (the flexible resistor regions 70) thereof into which the first ions were implanted.

(Heat Treatment Step)

In the heat treatment step, the photoresist used in the second ion implantation step is removed, and, further, heat treatment (annealing treatment) is performed on the stacked body 66, with the aim of activation of the first ions and the second ions. After the heat treatment has been performed on the stacked body 66, the first silicon oxide film 68a is removed.

Consequently, in the heat treatment step, by performing heat treatment on the stacked body 66 into which the first ions and the second ions were implanted, the flexible resistor regions 70 are formed in the regions into which the first ions were implanted and low resistance regions 72 are also formed in the regions into which the second ions were implanted.

(Wiring Layer Forming Step and Oxide Film Forming Step)

In the wiring layer forming step, a silicon nitride film 74 and a second silicon oxide film 68b are stacked in this order on the face on the upper side of the second silicon substrate 64, as illustrated in FIG. 8A. By means of regular lithography and oxide film etching, holes 76 are formed in the second silicon oxide film 68b and the silicon nitride film 74, as illustrated in FIG. 8B.

Next, as illustrated in FIG. 9A, a laminated film 78 formed of Ti and TiN is formed on the second silicon oxide film 68b by means of sputtering and heat treatment is performed. The laminated film 78 is a so-called barrier metal that plays a role of preventing a metal film, such as Al, from anomalously diffusing into Si, and performing heat treatment enables interfaces between Si and Ti, which exist on the bottoms of the holes 76, to be silicided and it becomes possible to form connections with low resistance.

Further, as illustrated in FIG. 9B, a metal film 80, such as Al, is stacked on the laminated film 78 by means of sputtering.

Next, by patterning the metal film 80 using lithography and an etching technology, a wiring layer 82 as illustrated in FIG. 10A is formed. Further, as illustrated in FIG. 10B, a third silicon oxide film 68c is stacked as an insulating layer.

Subsequently, as illustrated in FIG. 11A, a pattern of photoresist (not illustrated) that covers a region excluding the flexible resistor regions 70 and a membrane setting region 84 that is a preset region including the center of the detection base member (a region to serve as the membrane later) is formed. Further, by means of an etching technology, the third silicon oxide film 68c and the second silicon oxide film 68b that are formed in the flexible resistor regions 70 and the membrane setting region 84 are removed. A pattern of photoresist (not illustrated) that covers a region excluding the membrane setting region 84 is formed, and, as illustrated in FIG. 11B, the silicon nitride film 74 in the membrane setting region 84 is removed.

Figure 58A:
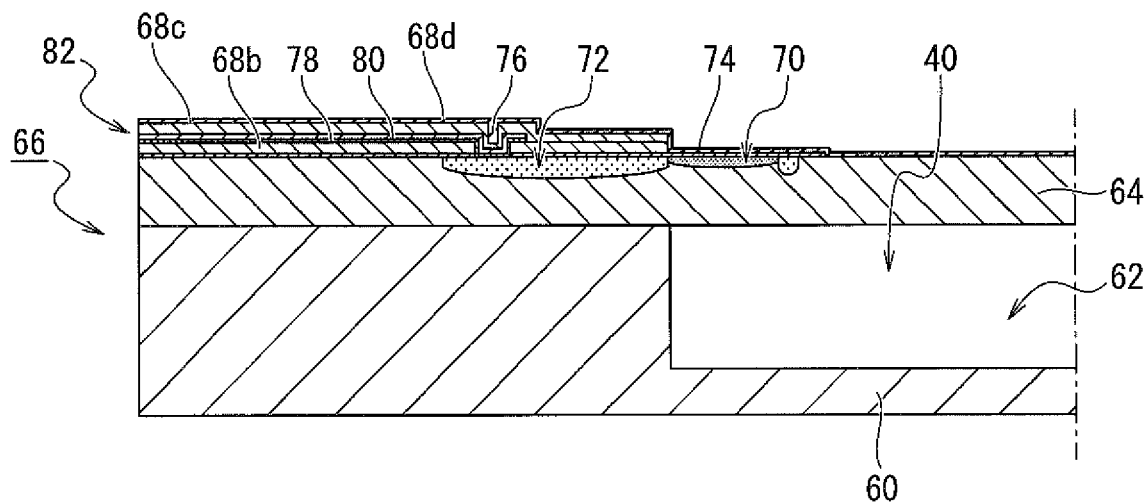
FIGS. 58A and 58B are diagrams illustrative of an example of a wiring layer forming step of the surface stress sensor according to the seventh embodiment of the present invention.

Subsequently, as the oxide film forming step, a fourth silicon oxide film 68d is stacked on the third silicon oxide film 68c, the flexible resistor regions 70, and the membrane setting region 84, as illustrated in FIG. 58A.

In the oxide film forming step, oxide films are formed on a region in which the receptor 30 is to be formed (the receptor forming region 31) and a region in which the recess/protrusion pattern 52 is to be formed. Note that the oxide film may be formed only on either the region in which the receptor 30 is to be formed (the receptor forming region 31) or the region in which the recess/protrusion pattern 52 is to be formed.

Figure 58B:
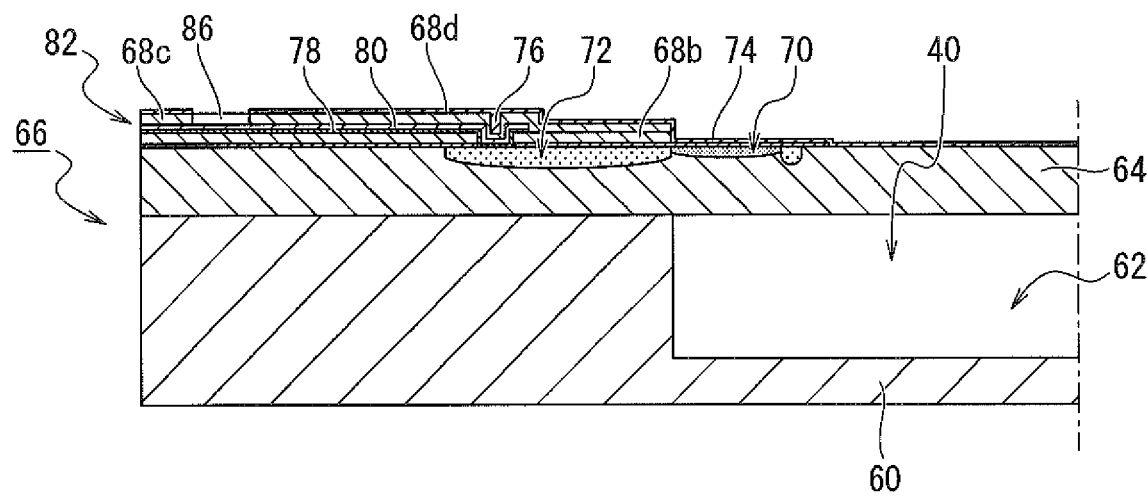

Next, as illustrated in FIG. 58B, PADs 86 for acquiring outputs from the flexible resistors 50 are formed by means of regular lithography and an etching technology.

Consequently, in the wiring layer forming step, the wiring layers 82 that are electrically connected to the flexible resistors 50 are formed.

(Recess/Protrusion Pattern Forming Step and Removal Step)

The recess/protrusion pattern forming step is performed at the same time as the removal step.

In the removal step, by cutting off portions of the membrane setting region 84 by means of etching, four coupling portions 26a to 26d constituting two pairs are patterned.

In the recess/protrusion pattern forming step, the recess/protrusion pattern 52 is formed.

Hereinafter, details of the recess/protrusion pattern forming step will be described using FIG. 59 while referring to FIGS. 39 and 40. Note that cross-sectional views in FIG. 59 correspond to a cross-sectional view taken along the line XI-XI in FIG. 36 and are the same cross-sectional views as that in FIG. 40.

Figure 59A:
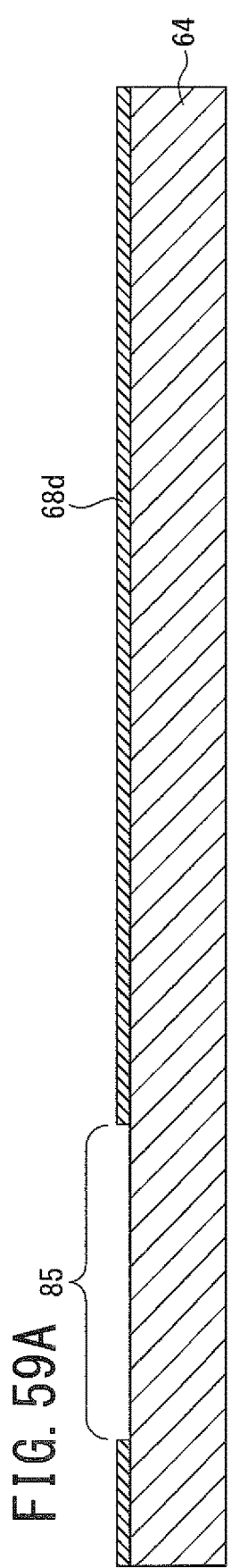
FIGS. 59A, 59B, 59C, and 59D are cross-sectional views taken along the line Y-Y in FIG. 36 and diagrams illustrative of a recess/protrusion pattern forming step.

First, as illustrated in FIG. 59A, a pattern of photoresist (not illustrated) that exposes regions (hereinafter, referred to as removal regions 85) that are regions surrounding the membrane setting region 84 and are other than the low resistance regions 72 and the flexible resistor regions 70 (regions to serve as the coupling portions 26 later) is formed. Subsequently, the fourth silicon oxide film 68d in the removal regions 85 is removed.

Figure 59B:
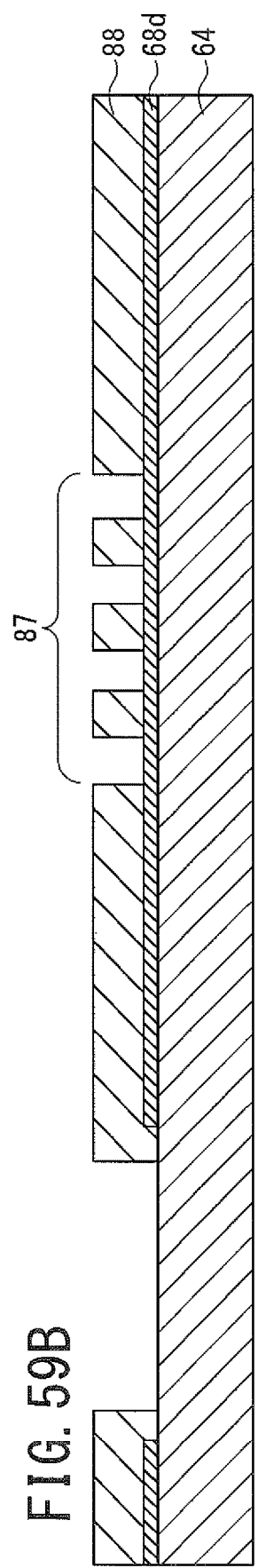

Next, as illustrated in FIG. 59B, a pattern of photoresist 88 that exposes the removal regions 85 is formed. On this occasion, in a recess/protrusion pattern region 87 that is a region in which the recess/protrusion pattern 52 is to be formed, a pattern of photoresist 88 corresponding to a recess/protrusion pattern (protruding portions or recessed portions) to be formed is formed at the same time using the same mask.

Figure 59C:
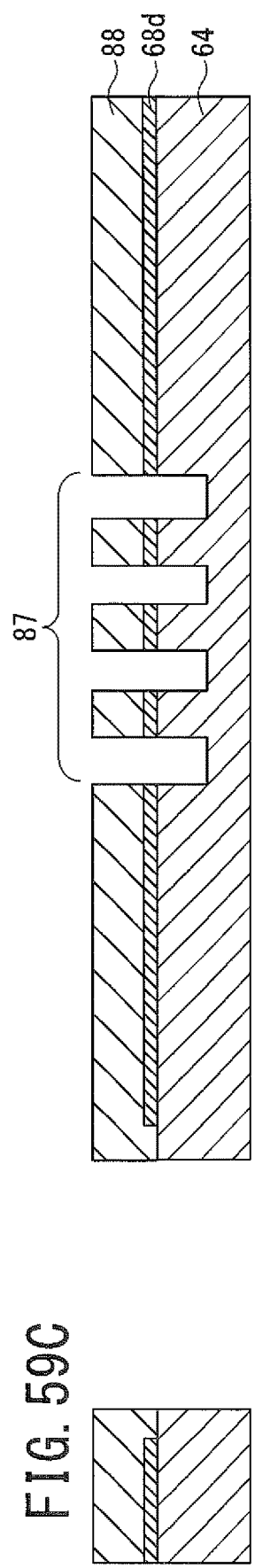

Succeedingly, etching is performed by means of dry etching until the second silicon substrate 64 in the removal regions 85 is penetrated, as illustrated in FIG. 59C. On this occasion, since the etching rate in dry etching of silicon oxide film is lower than that in dry etching of silicon, the etching progresses only to an intermediate depth of the second silicon substrate 64 in the recess/protrusion pattern region 87.

Figure 59D:
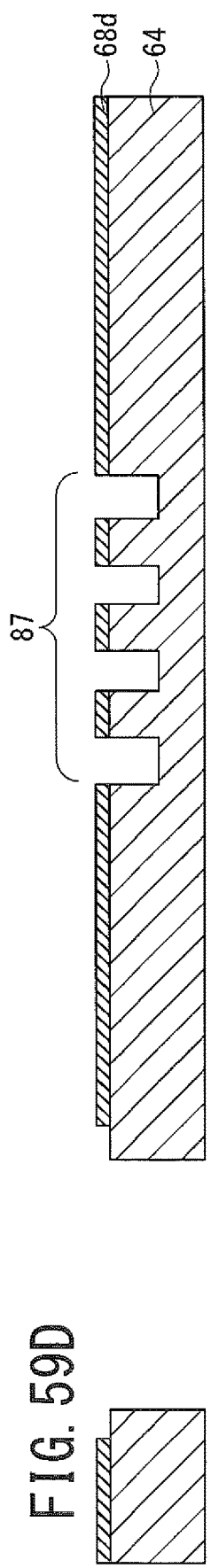

Lastly, by removing the photoresist 88 by means of ashing or the like, a cross-section structure illustrated in FIG. 59D is formed and the recess/protrusion pattern 52 is formed.

Consequently, in the recess/protrusion pattern forming step and the removal step, by removing the second silicon substrate 64 in the removal regions 85, the membrane 322, the frame member 24, the coupling portions 26, and the flexible resistors 50 are formed. In addition to the above, in the recess/protrusion pattern region 87, the recess/protrusion pattern 52 constituted by protruding portions or recessed portions is formed.

That is, in the recess/protrusion pattern forming step, in a region surrounding the periphery of a preset region (the receptor forming region 31) including the center of the front face of the detection base member 320 within the front face of the detection base member 320, the recess/protrusion pattern 52 having a higher degree of roughness than the preset region is formed.

(Receptor Forming Step)

In the receptor forming step, in the receptor forming region 31 surrounded by the recess/protrusion pattern 52, the receptor 30, which is deformed according to an adsorbed substance, is formed by applying a solvent, such as a PEI solution.

(Operation and Actions)

Using FIGS. 60 and 61 while referring to FIGS. 35 to 59, operation and actions of the seventh embodiment will be described.

When the surface stress sensor 301 is used as, for example, a smell sensor, the receptor 30 is arranged in an atmosphere of a gas containing smell components and the smell components contained by the gas are caused to adsorb to the receptor 30.

When molecules of a gas adsorb to the receptor 30 and a strain is induced in the receptor 30, surface stress is applied to the membrane 322 and the membrane 322 is bent.

The frame member 24 is formed into a square well curb shape and surrounds the membrane 322, and each of the coupling portions 26 couples the membrane 322 and the frame member 24 at both ends thereof. For this reason, in each coupling portion 26, the end coupled to the membrane 322 is formed into a free end and the end coupled to the frame member 24 is formed into a fixed end.

Therefore, when the membrane 322 is bent, bending corresponding to a strain induced in the receptor 30 occurs in the coupling portions 26. The resistance values that the flexible resistors 50 have change according to the bending having occurred in the coupling portions 26, and change in voltage or current corresponding to the changes in the resistance values are output from the PADs 86 and used in data detection in a computer or the like.

Figure 60:
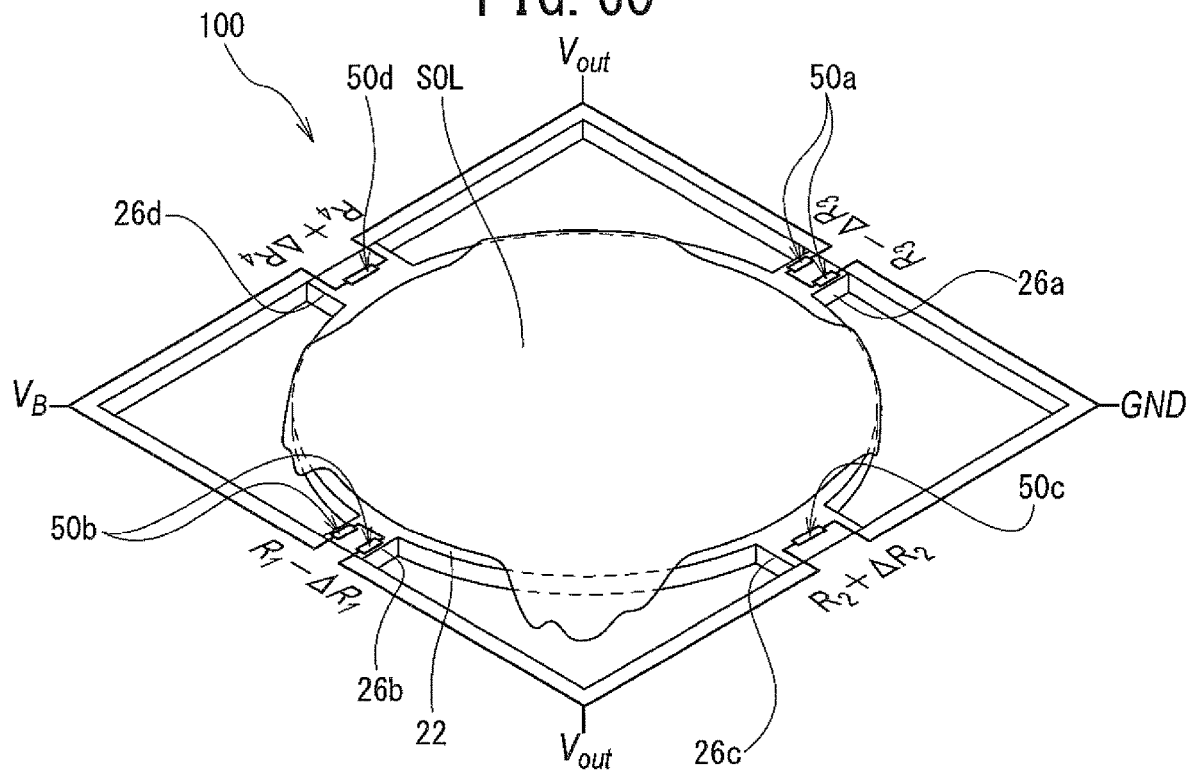
FIG. 60 is a diagram illustrative of operation and actions of a surface stress sensor having a conventional configuration.

When a receptor 30 is formed in a surface stress sensor 100 that has a conventional configuration, that is, a membrane 322 that has a configuration in which no recess/protrusion pattern is formed, as illustrated in FIG. 60, a problem to be described below may occur.

That is, a solvent SOL of which the receptor 30 is formed spreads on the front face of the membrane 322, a portion of the solvent SOL flows out over the edge of the membrane 322, and, in some cases, there is a possibility that a portion of the solvent SOL flows around to the reverse face of the membrane 322.

In this case, since, when, at the time of using the surface stress sensor 400 as a smell sensor, molecules of a gas adsorb to the receptor 30 that has adhered to the reverse face, surface stress in the opposite direction to the direction of surface stress applied by molecules of the gas having adsorbed to the front face is induced, overall surface stress decreases. Therefore, resistance change induced in flexible resistors 50 decreases, and change in output voltage or current decreases. This means that the sensitivity as a sensor decreases.

Therefore, in the surface stress sensor 100 having the conventional configuration, when a portion of the solvent SOL having spread on the front face of the membrane flows around to the reverse face of the membrane, the receptor 30 is formed with the solvent SOL that has adhered to the respective ones of the front face and reverse face of the membrane. The receptor 30 that is respectively formed on the front face and reverse face of the membrane adsorbs gas molecules. For this reason, there is a concern that the sensitivity of the surface stress sensor 100 decreases.

Figure 61:
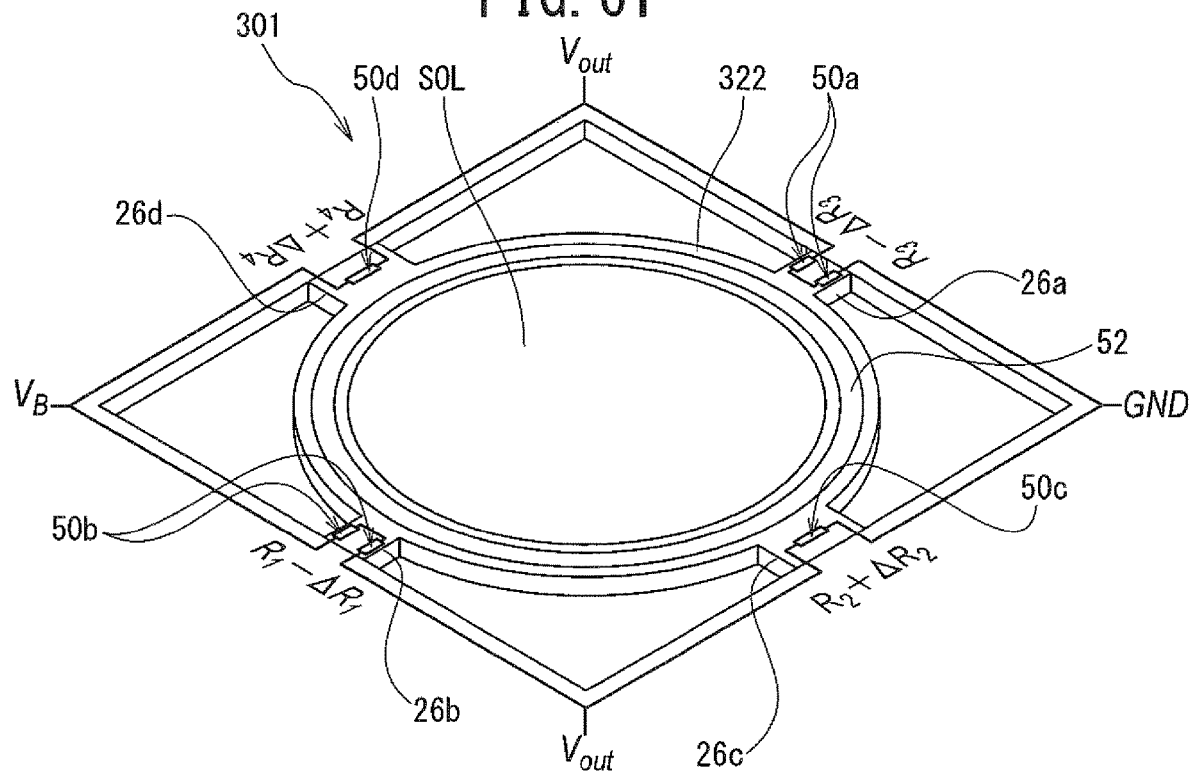
FIG. 61 is another diagram illustrative of the detection base member of the surface stress sensor according to the seventh embodiment.

On the other hand, in the case of the surface stress sensor 301 of the seventh embodiment, the recess/protrusion pattern 52 is formed in a region surrounding the periphery of the receptor forming region 31 in a concentric manner with respect to the membrane 322 within the membrane 322, as illustrated in FIG. 61. The recess/protrusion pattern 52 exhibits liquid-repellent action due to the lotus effect.

For this reason, the applied solvent SOL is suppressed from spreading to the edge of the membrane 322 and the applied solvent SOL is also suppressed from flowing around to the reverse face of the membrane 322. Therefore, it becomes possible to efficiently apply the solvent SOL of which the receptor 30 is formed on the front face of the membrane 322, and there is no possibility that the sensitivity of the surface stress sensor 301 deteriorates.

It should be noted that the foregoing seventh embodiment is one example of the present invention, the present invention is not limited to the foregoing seventh embodiment, and, even when the present invention may be carried out in modes other than the embodiment, depending on designs, various changes may be made to the present invention within a scope not departing from the technical idea of the present invention Advantageous Effects of Seventh Embodiment The surface stress sensor 301 of the seventh embodiment enables advantageous effects that will be described below to be attained.

(1) The surface stress sensor 301 of the seventh embodiment includes the membrane 322 configured to be bent by applied surface stress, the frame member 24 configured to surround the membrane 322, the coupling portions 26 configured to couple the membrane 322 and the frame member 24, and flexible resistors 50 configured to have resistance values that change according to bending induced in the coupling portions 26. Further, the surface stress sensor 301 of the seventh embodiment includes the support base member 10 configured to be arranged connected to the frame member 24 with a cavity (the cavity portion 40) disposed between the membrane 322 and coupling portions 26 and the support base member 10 and overlap the membrane 322 and the coupling portions 26.

In addition to the above, the surface stress sensor 301 of the seventh embodiment includes the receptor configured to be formed on the receptor forming region 31 and be deformed according to an adsorbed substance and the recess/protrusion pattern 52 configured to be disposed in a region closer to the frame member 24 than the receptor forming region 31 within the front face of the membrane 322 and have a higher degree of roughness than the receptor forming region 31.

Since, because of this configuration, a liquid-repellent region is formed on the outer side than the receptor forming region 31 within the front face of the membrane 322 by the recess/protrusion pattern 52, it becomes possible to suppress a solvent of which the receptor 30 is formed from wetting and spreading by means of the lotus effect that the recess/protrusion pattern 52 has.

Because of this effect, it becomes possible to prevent the solvent from flowing to the outside or the reverse face side of the membrane 322 and form a solvent layer stably.

As a result of this effect, it becomes possible to simplify the process by which the receptor 30 is formed. In addition to the above, since a substance adsorbs only to the front face of the membrane 322, it becomes possible to perform stable sensing with high precision and provide the surface stress sensor 301 that is capable of maintaining high sensor sensitivity.

(2) The recess/protrusion pattern 52 is formed with a pattern in which a plurality of protruding portions or a plurality of recessed portions continue.

As a result of this configuration, it becomes possible to cause the lotus effect exhibiting liquid repellency to manifest itself.

(3) The recess/protrusion pattern 52 is disposed over the entire circumference of a region closer to the frame member 24 than the receptor 30 within the front face of the membrane 322 with protruding portions adjacent to each other or recessed portions adjacent to each other arranged at a preset distance therebetween.

As a result of this configuration, it becomes possible to cause the lotus effect exhibiting liquid repellency to manifest itself.

(4) The surface stress sensor 301 of the seventh embodiment includes an oxide film that is formed on at least either the receptor forming region 31 or a region in which the recess/protrusion pattern 52 is disposed within the front face of the membrane 322.

As a result of this configuration, it becomes possible to selectively provide a membrane 322 having high wettability with respect to each of a hydrophilic solvent and a hydrophobic solvent, and it thereby becomes possible to achieve a function of preventing the solvent from flowing out by means of the lotus effect that the recess/protrusion pattern 52 has.

In addition, the method for manufacturing the surface stress sensor of the seventh embodiment enables advantageous effects that will be described below to be attained.

(5) The method for manufacturing the surface stress sensor includes the stacked body forming step, the first ion implantation step, the second ion implantation step, the heat treatment step, the recess/protrusion pattern forming step, the receptor forming step, the removal step, and the wiring layer forming step. In the stacked body forming step, by forming the recessed portion 62 on one face of the support base member 10 and further sticking the detection base member 320 to the support base member 10 in such a way that the detection base member 320 covers the recessed portion 62, the stacked body 66 in which the cavity portion 40 is disposed between the support base member 10 and the detection base member 320 is formed. In the first ion implantation step, the first ions are implanted into selected partial regions on the outer side than a preset region including the center of the detection base member 320 within the face of the detection base member 320 on the opposite side to the face thereof facing the support base member 10. In the second ion implantation step, the second ions are implanted into selected regions of the detection base member 320 on the outer side than the regions thereof into which the first ions were implanted. In the heat treatment step, by performing heat treatment on the stacked body 66 into which the first ions and the second ions were implanted, the flexible resistor regions 70 are formed in the regions into which the first ions were implanted and the low resistance regions 72 are also formed in the regions into which the second ions were implanted. In the recess/protrusion pattern forming step, in a region surrounding the periphery of a preset region (the receptor forming region 31) including the center of the front face of the detection base member 320, which is the face of the detection base member 320 on the opposite side to the face thereof facing the support base member 10, within the front face of the detection base member 320, the recess/protrusion pattern 52 having a higher degree of roughness than the receptor forming region 31 is formed. In the receptor forming step, in a region surrounded by the recess/protrusion pattern (the receptor forming region 31), the receptor 30 that is deformed according to an adsorbed substance is formed. In the removal step, by removing regions that are regions surrounding the region in which the recess/protrusion pattern 52 is formed and are other than the low resistance regions 72 and the flexible resistor regions 70 within the detection base member 320, the membrane 322, the frame member 24, the coupling portions 26, and the flexible resistors 50 are formed. In the wiring layer forming step, the wiring layers 82 that are electrically connected to the flexible resistors 50 are formed.

Since, because of the configuration, a liquid-repellent region is formed on the outer side than the receptor forming region 31 within the front face of the membrane 322 by the recess/protrusion pattern 52, it becomes possible to suppress a solvent of which the receptor 30 is formed from wetting and spreading by means of the lotus effect that the recess/protrusion pattern 52 has.

Because of this effect, it becomes possible to prevent the solvent from flowing to the outside or the reverse face side of the membrane 322 and form a solvent layer stably.

As a result of this effect, it becomes possible to simplify the process by which the receptor 30 is formed. In addition to the above, since a substance adsorbs only to the front face of the membrane 322, it becomes possible to perform stable sensing with high precision and provide the method for manufacturing the surface stress sensor that is capable of maintaining high sensor sensitivity.

(6) The method for manufacturing the surface stress sensor 301 includes the oxide film forming step that is the previous step to the recess/protrusion pattern forming step and in which an oxide film (the fourth silicon oxide film 68$d$) is formed on the front face of the detection base member 320.

As a result of this configuration, it becomes possible to manufacture the surface stress sensor 301 that has high wettability with respect to a hydrophilic solvent and is capable of achieving a function of preventing the solvent from flowing out by means of the lotus effect that the recess/protrusion pattern 52 has.

(7) In the oxide film forming step, an oxide film (the fourth silicon oxide film 68$d$) is formed on at least either a region in which the receptor 30 is to be formed (the receptor forming region 31) or a region in which the recess/protrusion pattern 52 is to be formed.

As a result of this configuration, it becomes possible to selectively provide a membrane 322 having high wettability with respect to each of a hydrophilic solvent and a hydrophobic solvent, and it thereby becomes possible to achieve a function of preventing the solvent from flowing out by means of the lotus effect that the recess/protrusion pattern 52 has.

(8) The recess/protrusion pattern forming step and the removal step are performed at the same time by means of etching or the like.

As a result of this configuration, it becomes possible to simplify the manufacturing process of the surface stress sensor 301.

Variations of Seventh Embodiment (1) Although, in the seventh embodiment, by forming the recessed portion 62 on one face of the first silicon substrate 60, which serves as a material of the support base member 10, the cavity portion 40 is formed between the membrane 322 and the support base member 10, the present invention is not limited to the configuration. That is, by forming a recessed portion on the face of the second silicon substrate 64, which serves as a material of the detection base member 320, facing the support base member 10, the cavity portion 40 may be formed between the membrane 322 and the support base member 10.

(2) Although, in the seventh embodiment, the surface stress sensor 301 has a configuration in which, on the four coupling portions 26$a$ to 26$d$ constituting two pairs, the flexible resistors 50$a$ to 50$d$ are disposed, respectively, the present invention is not limited to the configuration. That is, the surface stress sensor 301 may have a configuration in which, on two coupling portions 26 constituting a pair, flexible resistors 50 are respectively disposed.

(3) Although, in the seventh embodiment, the surface stress sensor 301 has a configuration in which, on all the four coupling portions 26$a$ to 26$d$, the flexible resistors 50 are disposed, respectively, the present invention is not limited to the configuration and the surface stress sensor 301 may have a configuration in which, on at least one coupling portion 26, a flexible resistor 50 is disposed.

(4) Although, in the seventh embodiment, the area of the connecting portion 4 is set at a value smaller than the area of the membrane 322 when viewed from the thickness direction of the membrane 322, the present invention is not limited to the configuration and the area of the connecting portion 4 may be set at a value equal to or greater than the area of the membrane 322.

(5) Although, in the seventh embodiment, the shape of the connecting portion 4 is set as a circle, the present invention is not limited to the configuration and the shape of the connecting portion 4 may be set as a square. In addition, a plurality of connecting portions 4 may be formed.

(6) Although, in the seventh embodiment, the same material is used as a material of which the detection base member 320 is formed and a material of which the support base member 10 is formed, the present invention is not limited to the configuration and different materials may be used as a material of which the detection base member 320 is formed and a material of which the support base member 10 is formed.

In this case, setting a difference between a linear expansion coefficient of the detection base member 320 and a linear expansion coefficient of the support base member 10 to be $1.2 \times 10^{-5}/°$ C. or less enables a difference between the amount of deformation of the detection base member 320 and the amount of deformation of the support base member 10 corresponding to deformation of the package substrate 2 to be decreased. This configuration enables bending of the membrane 322 to be suppressed.

(7) Although, in the seventh embodiment, the linear expansion coefficient of the support base member 10 is set at $5.0 \times 10^{-6}/°$ C. or less, the present invention is not limited to the configuration and the linear expansion coefficient of the support base member 10 may be set at $1.0 \times 10^{-5}/°$ C. or less.

Even in this case, it becomes possible to improve rigidity of the support base member 10 and it thereby becomes possible to decrease the amount of deformation of the detection base member 320 with respect to deformation of the package substrate 2 caused by temperature change and the like.

(8) Although, in the seventh embodiment, the recess/protrusion pattern 52 is formed with a pattern in which a plurality of protruding portions or a plurality of recessed portions continue, the present invention is not limited to the configuration.

Figure 62:
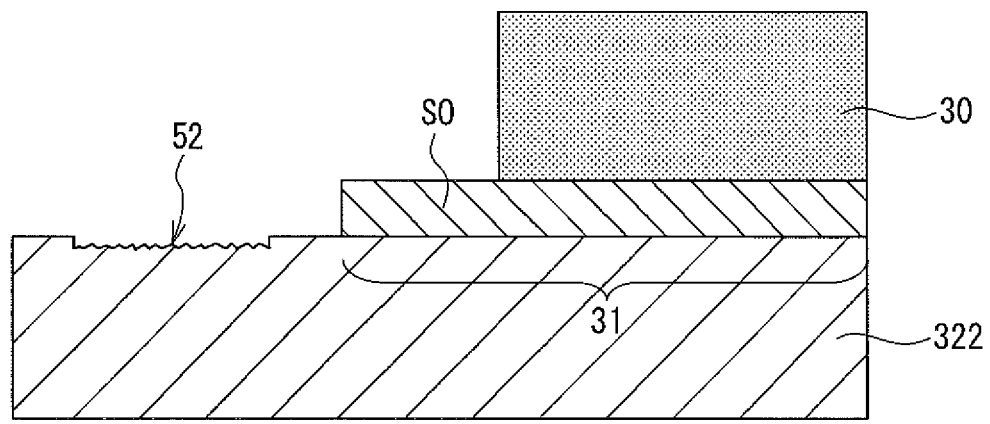
FIG. 62 is a diagram illustrative of a variation of the seventh embodiment.

That is, for example, the recess/protrusion pattern 52 the surface of which is made to have a higher degree of roughness than the receptor forming region 31 by making a region surrounding the periphery of the receptor forming region 31 rough enough to have the lotus effect through performing a knurling process or the like on the region may be formed, as illustrated in FIG. 62.

Note that, in the case of the configuration illustrated in FIG. 62, as with the configuration illustrated in FIG. 53, when a hydrophilic solvent is applied to the membrane 322, it becomes possible to form the receptor 30 having high adhesion with the membrane 322 because the receptor forming region 31 has high wettability. On the other hand, the recess/protrusion pattern 52 comes to have a strong liquid repellent function because the lotus effect is added to liquid repellency by silicon, and, hence, it becomes possible to improve the function of preventing the solvent from flowing out.

(9) Although, in the seventh embodiment, the recess/protrusion pattern 52 is disposed over the entire circumference of a region closer to the frame member 24 than the receptor 30 within the front face of the membrane 322 with protruding portions adjacent to each other or recessed portions adjacent to each other arranged at a preset distance therebetween, the present invention is not limited to the configuration.

That is, for example, by setting a distance between protruding portions adjacent to each other or recessed portions adjacent to each other at 0 µm, the recess/protrusion pattern 52 may be formed into a plurality of ring shapes that continue over the entire circumference of the region closer to the frame member 24 than the receptor 30 within the front face of the membrane 322.

(10) Although, in the seventh embodiment, the solvent SOL of which the receptor 30 is formed is suppressed from flowing around to the reverse face of the membrane 322 by means of the recess/protrusion pattern 52, the present invention is not limited to the configuration.

Figure 63A:
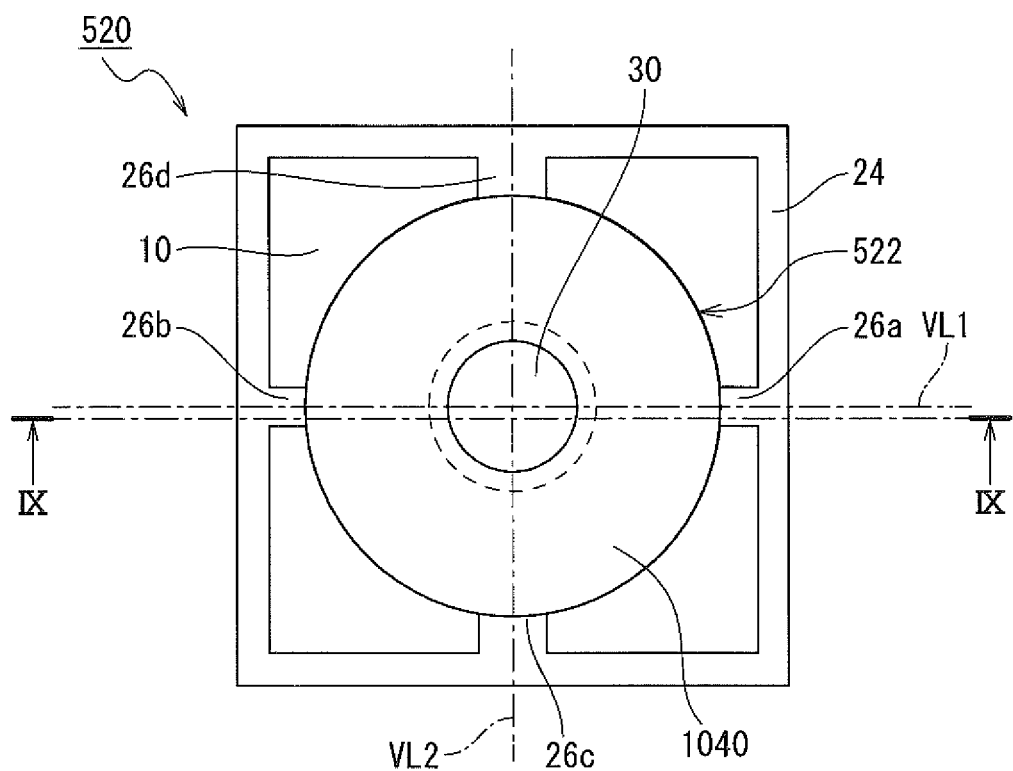
FIGS. 63A and 63B are diagrams illustrative of another variation of the seventh embodiment.
Figure 63B:
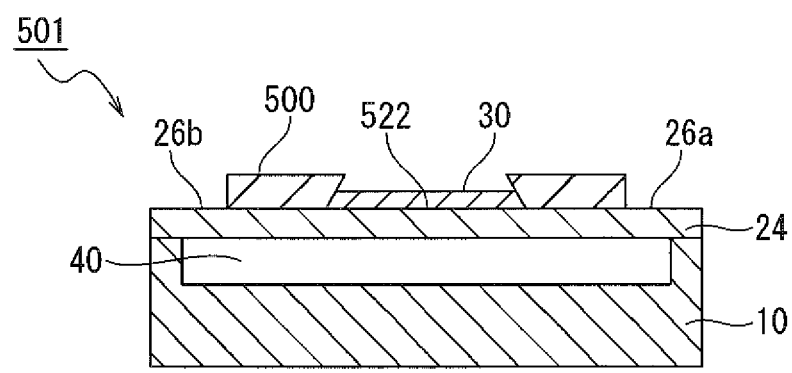

That is, for example, as illustrated in FIGS. 63A and 63B, by disposing a thick oxide film SO on the front face of a membrane 322 and removing a portion of the oxide film SO that is formed at a central portion of the membrane 322, a bank 500 configured to prevent the solvent SOL from spreading may be formed. FIG. 63B is a cross-sectional view taken along the line IX-IX in FIG. 63A. On this occasion, the thickness of the oxide film SO of which the bank 500 is formed can be changed according to the amount of dripping of a PEI solution or the like at the time of forming the receptor 30. In such a surface stress sensor 501, it is preferable to form the bank 500 in such a way that an inside cross-section is formed into an inverse tapered shape, as illustrated in FIG. 63B. This configuration enables the PEI solution or the like to be suppressed from flowing toward the outer periphery of the membrane 322 at the time of forming the receptor 30.

Eighth Embodiment

Hereinafter, an eighth embodiment of the present invention will be described with reference to the drawings.

(Configuration)

Using FIG. 15 while referring to FIGS. 35 to 40, a configuration of the eighth embodiment will be described.

The configuration of the eighth embodiment is the same as that of the first embodiment described above except that, as illustrated in FIG. 15, a frame member 24 is connected to the face (in FIG. 15, the face on the upper side) of a support base member 10 on the opposite side to the face thereof facing a package substrate 2 with a connecting layer 90 interposed therebetween.

The connecting layer 90 is formed of silicon dioxide ($SiO_2$) or the like.

The configuration of the other constituent components is the same as that of the seventh embodiment described above. That is, the configuration of the eighth embodiment, as with the surface stress sensor 301 of the seventh embodiment, includes a detection base member 320 in which a recess/protrusion pattern 52 is formed on the front face of a membrane 322.

Since the configuration of the other constituent components is the same as that of the seventh embodiment described above, a description thereof will be omitted.

(Method for Manufacturing Surface Stress Sensor)

With reference to FIGS. 16 to 19 while referring to FIGS. 35 to 61, a method for manufacturing a surface stress sensor 301 will be described. Note that cross-sectional views in FIGS. 16 to 19 correspond to a cross-sectional view taken along the line W-W in FIG. 39.

The method for manufacturing the surface stress sensor 301 includes a stacked body forming step, a first ion implantation step, a second ion implantation step, a heat treatment step, a hole forming step, a cavity portion forming step, a hole sealing step, a wiring layer forming step, a recess/protrusion pattern forming step, a removal step, and a receptor forming step. The method for manufacturing a surface stress sensor described in the eighth embodiment differs from the method for manufacturing a surface stress sensor of the second embodiment in including the recess/protrusion pattern forming step.

(Stacked Body Forming Step)

Since the stacked body forming step is performed in the same procedure as that of the stacked body forming step of the second embodiment illustrated in FIG. 16, a description thereof will be omitted.

Consequently, in the stacked body forming step, by stacking a sacrificial layer 92 on the support base member 10 and further stacking the detection base member 320 on the sacrificial layer 92, a stacked body 66 is formed.

(First Ion Implantation Step)

Since the first ion implantation step is performed in the same procedure as that of the first ion implantation step of the second embodiment illustrated in FIG. 16, a description thereof will be omitted.

Consequently, in the first ion implantation step, first ions are implanted into selected partial regions (flexible resistor regions 70) on the outer side than a preset region including the center of the detection base member 320 within the face of the detection base member 320 on the opposite side to the face thereof facing the support base member 10.

(Second Ion Implantation Step)

Since the second ion implantation step is performed in the same procedure as that of the second ion implantation step of the second embodiment illustrated in FIG. 16, a description thereof will be omitted.

Consequently, in the second ion implantation step, second ions are implanted into selected regions of the detection base member 320 on the outer side than the regions (the flexible resistor regions 70) thereof into which the first ions were implanted.

(Heat Treatment Step)

In the heat treatment step, a photoresist used in the second ion implantation step is removed, and, further, heat treatment (annealing treatment) is performed on the stacked body 66, with the aim of activation of the first ions and the second ions. After the heat treatment has been performed on the stacked body 66, a first silicon oxide film 68a is removed.

Consequently, in the heat treatment step, by performing heat treatment on the stacked body 66 into which the first ions and the second ions were implanted, the flexible resistor regions 70 are formed in the regions into which the first ions were implanted and low resistance regions 72 are also formed in the regions into which the second ions were implanted.

(Hole Forming Step)

Since the hole forming step is performed in the same procedure as that of the hole forming step of the second embodiment illustrated in FIG. 17, a description thereof will be omitted.

Consequently, in the hole forming step, holes 76 that penetrate to the sacrificial layer 92 are formed in a region of the detection base member 320 adjacent to the regions thereof in which the flexible resistor regions 70 and the low resistance regions 72 were formed.

(Cavity Portion Forming Step)

Since the cavity portion forming step is performed in the same procedure as that of the cavity portion forming step of the second embodiment illustrated in FIG. 18, a description thereof will be omitted.

Consequently, in the cavity portion forming step, a portion of the sacrificial layer 92 arranged between the flexible resistor regions 70 and the support base member 10 is removed by means of etching via the holes 76 and a cavity portion 40 is thereby disposed between the support base member 10 and the detection base member 320.

(Hole Sealing Step)

Since the hole sealing step is performed in the same procedure as that of the hole sealing step of the second embodiment illustrated in FIG. 19, a description thereof will be omitted.

Consequently, in the hole sealing step, an oxide film 94 is formed on the face of the detection base member 320 on the opposite side to the face thereof facing the support base member 10 and the holes 76 are thereby sealed.

(Wiring Layer Forming Step)

Since the wiring layer forming step is performed in the same procedure as that of the wiring layer forming step of the first embodiment illustrated in FIGS. 8A, 8B, 9A, 9B, 10A, 10B, 11A, 11B, and 12, a description thereof will be omitted.

Consequently, in the wiring layer forming step, wiring layers 82 that are electrically connected to flexible resistors 50 are formed.

(Recess/Protrusion Pattern Forming Step and Removal Step)

Since the recess/protrusion pattern forming step and the removal step are performed in the same procedures as those of the seventh embodiment described above, descriptions thereof will be omitted.

Therefore, in the recess/protrusion pattern forming step, regions that are regions surrounding a preset region including the center of the detection base member 320 and are other than the low resistance regions 72 and the flexible resistor regions 70 are removed. With this removal, the membrane 322, the frame member 24, coupling portions 26, and the flexible resistors 50 are formed and the recess/protrusion pattern 52 is also formed.

That is, in the recess/protrusion pattern forming step, in a region surrounding the periphery of a preset region (a receptor forming region 31) including the center of the front face of the detection base member 320 within the front face of the detection base member 320, the recess/protrusion pattern 52 having a higher degree of roughness than the preset region is formed.

(Receptor Forming Step)

In the receptor forming step, in the receptor forming region 31 surrounded by the recess/protrusion pattern 52, a receptor 30 that is deformed according to an adsorbed substance is formed by applying a solvent, such as a PEI solution.

(Operation and Actions)

Since operation and actions of the eighth embodiment are the same as those of the seventh embodiment described above, descriptions thereof will be omitted.

It should be noted that the foregoing eighth embodiment is one example of the present invention, the present invention is not limited to the foregoing eighth embodiment, and, even when the present invention may be carried out in modes other than the embodiment, depending on designs, various changes may be made to the present invention within a scope not departing from the technical idea of the present invention Advantageous Effects of Eighth Embodiment The method for manufacturing the surface stress sensor of the eighth embodiment enables advantageous effects that will be described below to be attained.

(1) The method for manufacturing the surface stress sensor includes the stacked body forming step, the first ion implantation step, the second ion implantation step, the heat treatment step, the hole forming step, the cavity portion forming step, the hole sealing step, the recess/protrusion pattern forming step, the receptor forming step, the removal step, and the wiring layer forming step. In the stacked body forming step, by stacking the sacrificial layer 92 on the support base member 10 and further stacking the detection base member 320 on the sacrificial layer 92, the stacked body 66 is formed. In the first ion implantation step, the first ions are implanted into selected partial regions on the outer side than a preset region including the center of the detection base member 320 within the face of the detection base member 320 on the opposite side to the face thereof facing the support base member 10. In the second ion implantation step, the second ions are implanted into selected regions of the detection base member 320 on the outer side than the regions thereof into which the first ions were implanted. In the heat treatment step, by performing heat treatment on the stacked body 66 into which the first ions and the second ions were implanted, the flexible resistor regions 70 are formed in the regions into which the first ions were implanted and the low resistance regions 72 are also formed in the regions into which the second ions were implanted. In the hole forming step, the holes 76 that penetrate to the sacrificial layer 92 are formed in a region of the detection base member 320 adjacent to the regions thereof in which the flexible resistor regions 70 and the low resistance regions 72 were formed. In the cavity portion forming step, a portion of the sacrificial layer 92 arranged between the flexible resistor regions 70 and the support base member 10 is removed by means of etching via the holes 76 and the cavity portion 40 is thereby disposed between the support base member 10 and the detection base member 320. In the hole sealing step, the oxide film 94 is formed on the face of the detection base member 320 on the opposite side to the face thereof facing the support base member 10 and the holes 76 are thereby sealed. In the recess/protrusion pattern forming step, in a region surrounding the periphery of a preset region (the receptor forming region 31) including the center of the front face of the detection base member 320, which is the face of the detection base member 320 on the opposite side to the face thereof facing the support base member 10, within the front face of the detection base member 320, the recess/protrusion pattern 52 having a higher degree of roughness than the receptor forming region 31 is formed. In the receptor forming step, in a region surrounded by the recess/protrusion pattern (the receptor forming region 31), the receptor 30 that is deformed according to an adsorbed substance is formed. In the removal step, by removing regions that are regions surrounding the region in which the recess/protrusion pattern 52 is formed and are other than the low resistance regions 72 and the flexible resistor regions 70 within the detection base member 320, the membrane 322, the frame member 24, the coupling portions 26, and the flexible resistors 50 are formed. In the wiring layer forming step, the wiring layers 82 that are electrically connected to the flexible resistors 50 are formed.

Since, because of the configuration, a liquid-repellent region is formed on the outer side than the receptor forming region 31 within the front face of the membrane 322 by the recess/protrusion pattern 52, it becomes possible to suppress a solvent of which the receptor 30 is formed from wetting and spreading, by means of the lotus effect, the petal effect, and the like that the recess/protrusion pattern 52 has.

Because of this effect, it becomes possible to prevent the solvent from flowing to the outside or the reverse face side of the membrane 322 and form a solvent layer stably.

As a result of this effect, it becomes possible to simplify the process by which the receptor 30 is formed. In addition to the above, since a substance adsorbs only to the front face of the membrane 322, it becomes possible to perform stable sensing with high precision and provide the method for manufacturing the surface stress sensor that is capable of maintaining high sensor sensitivity.

REFERENCE SIGNS LIST 1, 101, 201, 301, 501 Surface stress sensor
2 Package substrate
4 Connecting portion
10 Support base member
20, 120, 320 Detection base member
22, 122, 122a, 122b, 122c, 322 Membrane
24, 124, 124a, 124b, 124c Frame member
26 Coupling portion
30, 30a, 30b Receptor
40, 41, 42 Cavity portion
50 Flexible resistor
52, 452, 552, 753, 756, 853 Recess/protrusion pattern
60 First silicon substrate
61a, 64a Groove
62 Recessed portion
64 Second silicon substrate
66 Stacked body
68 Silicon oxide film
70 Flexible resistor region
72 Low resistance region
74 Silicon nitride film
76 Hole
77 Groove
78 Laminated film
80 Metal film
82 Wiring layer
84 Membrane setting region
86 PAD
90 Connecting layer
92 Sacrificial layer
93 Groove
94 Oxide film
100 Surface stress sensor having a conventional configuration
111, 111a, 111b, 111c Connecting layer
125, 127 Groove portion
324 Frame member forming region
326 Coupling portion forming region
328 Peripheral membrane portion forming region
370 Flexible resistor forming region
372 Low resistance forming region
452a, 552a, 652a, 753a, 853a Protruding portion
500 Bank
VL1 Virtual straight line passing the center of a membrane
VL2 Straight line crossing the straight line VL1

The invention claimed is:
1. A surface stress sensor, comprising:
a membrane configured to be bent by applied surface stress;
a frame member, wherein, in a plane containing the frame member, the frame member is configured to be separated from the membrane and surround the membrane;
at least a pair of coupling portions arranged at positions sandwiching the membrane and configured to couple the membrane and the frame member;
a flexible resistor disposed on at least one of the coupling portions and having a resistance value that changes according to bending induced in the coupling portions;
a support base member connected to the frame member and overlapping the membrane and the coupling portions;
a receptor formed on a region including the center of a front face, the front face being a face of the membrane on an opposite side to a face of the membrane facing the support base member,
wherein the receptor is deformed in response to a gas adsorbed to the receptor; and
a pattern formed on an outer periphery of the front face of the membrane and disposed between a receptor forming region in which the receptor is formed and a flexible resistor region in which the flexible resistor is formed,
wherein the pattern is continuous and concentrically surrounds an entire circumference of the receptor forming region,
wherein the pattern includes at least one of a plurality of recesses and a plurality of protrusions, wherein a cavity portion is disposed between the membrane and the support base member, and between the coupling portions and the support base member, wherein the surface of the pattern has liquid repellency, and wherein the membrane is bent when the receptor deforms to apply surface stress to the membrane.

2. The surface stress sensor according to claim 1, wherein the flexible resistor is a piezoresistor, and the piezoresistor has a resistance value changing according to bending induced in the coupling portion by the membrane being bent.

3. The surface stress sensor according to claim 1, wherein the membrane and the frame member are coupled to each other by four coupling portions constituting two pairs, the flexible resistor is disposed on each of the four coupling portions, and the four flexible resistors form a full Wheatstone bridge.

4. The surface stress sensor according to claim 1, wherein the membrane is an n-type semiconductor layer, and the flexible resistor is a p-type semiconductor layer.

5. The surface stress sensor according to claim 1, wherein the membrane, the frame member, and the coupling portions form an integrated detection base member, and a difference between a linear expansion coefficient of the support base member and a linear expansion coefficient of the detection base member is $1.2 \times 10^{-5}/°$ C. or less.

6. The surface stress sensor according to claim 5, wherein a linear expansion coefficient of the support base member is $1.0 \times 10^{-5}/°$ C. or less.

7. The surface stress sensor according to claim 6, wherein a linear expansion coefficient of the support base member is $5.0 \times 10^{-6}/°$ C. or less.

8. The surface stress sensor according to claim 1, wherein thickness of the support base member is 80 μm or greater.

9. The surface stress sensor according to claim 1, wherein an outer peripheral surface of the support base member and an outer peripheral surface of the frame member are flush with each other.

10. The surface stress sensor according to claim 1, wherein the support base member is formed of a material containing any of silicon, sapphire, gallium arsenide, glass, and quartz.

11. The surface stress sensor according to claim 1, further comprising a package substrate configured to be connected to a face of the support base member on an opposite side to a face of the support base member facing the membrane.

12. The surface stress sensor according to claim 11, wherein the support base member and the package substrate are connected to each other by a connecting portion arranged at a position at which the connecting portion overlaps at least a portion of the membrane.

13. The surface stress sensor according to claim 12, wherein an area of the connecting portion is smaller than an area of the membrane.

14. The surface stress sensor according to claim 1, further comprising:

a connecting layer configured to be disposed between the support base member and the frame member; and a groove portion configured to be disposed at a position at which the groove portion surrounds the cavity portion and be formed in such a way as to penetrate the frame member and the connecting layer.

15. The surface stress sensor according to claim 1, further comprising peripheral membrane portions coupled to the frame member, wherein a periphery of each peripheral membrane portion is surrounded by the membrane, the frame member, and the coupling portions, wherein the support base member overlaps the peripheral membrane portions, wherein the cavity portion is disposed between the peripheral membrane portions and the support base member, wherein a penetrating portion is disposed in each peripheral membrane portion, wherein the penetrating portion penetrates to the cavity portion, wherein slits are formed between the membrane and coupling portions and the peripheral membrane portions, and wherein a width of each of the slits is narrower than a minimum distance between inner wall faces of the penetrating portion facing each other with the center of the penetrating portion interposed between the inner wall faces.

16. The surface stress sensor according to claim 15, wherein the penetrating portion is formed only in one of the peripheral membrane portions.

17. The surface stress sensor according to claim 15, wherein the minimum distance is a value within a range of 1 μm or more and 10 μm or less.

18. The surface stress sensor according to claim 15, wherein width of each of the slits is a value within a range of 0.5 μm or more and 5 μm or less.

19. The surface stress sensor according to claim 1, wherein the plurality of recesses or the plurality of protrusions are arranged at intervals.

20. The surface stress sensor according to claim 19, wherein the pattern is closer to the frame member than the receptor within the front face and with the plurality of protrusions adjacent to each other or the plurality of recesses adjacent to each other arranged at a preset distance.

21. The surface stress sensor according to claim 19, further comprising an oxide film configured to be formed on at least either the receptor forming region or a region in which the pattern is disposed within the front face.

* * * * *